(12) United States Patent
Aratani et al.

(10) Patent No.: US 7,719,082 B2
(45) Date of Patent: May 18, 2010

(54) MEMORY DEVICE AND STORAGE APPARATUS

(75) Inventors: Katsuhisa Aratani, Chiba (JP); Akihiro Maesaka, Kanagawa (JP); Akira Kouchiyama, Kanagawa (JP); Tomohito Tsushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 233 days.

(21) Appl. No.: 10/991,075

(22) Filed: Nov. 17, 2004

(65) Prior Publication Data
US 2005/0226036 A1 Oct. 13, 2005

(30) Foreign Application Priority Data

| Nov. 28, 2003 | (JP) | ............................ P2003-400319 |
| Dec. 12, 2003 | (JP) | ............................ P2003-415412 |
| Jun. 21, 2004 | (JP) | ............................ P2004-182775 |

(51) Int. Cl.
*H01L 29/00* (2006.01)
*H01L 47/00* (2006.01)

(52) U.S. Cl. .............................. 257/529; 257/2; 257/5; 257/530; 257/E45.002

(58) Field of Classification Search ..................... 257/2, 257/55, 209, 529, 530, 665, 5, E45.002; 365/46, 365/148, 163
See application file for complete search history.

(56) References Cited

U.S. PATENT DOCUMENTS

| 3,656,029 | A | 4/1972 | Ahn et al. |
| 4,177,473 | A | 12/1979 | Ovshinsky |
| 6,940,745 | B2 * | 9/2005 | Kozicki ....................... 365/153 |
| 7,078,301 | B2 * | 7/2006 | Bojarczuk et al. ............. 438/287 |
| 2003/0045054 | A1 | 3/2003 | Campbell |
| 2003/0137869 | A1 * | 7/2003 | Kozicki ....................... 365/158 |
| 2003/0209971 | A1 | 11/2003 | Mozicki |
| 2004/0153426 | A1 * | 8/2004 | Nugent ........................ 706/25 |
| 2004/0160804 | A1 * | 8/2004 | Rinerson et al. ............ 365/158 |

FOREIGN PATENT DOCUMENTS

| CN | 1284199 | 2/2001 |
| CN | 1442853 | 9/2003 |
| DE | 1 413 431 | 11/1975 |

(Continued)

OTHER PUBLICATIONS

PMC; Nikkei Electronics; Jan. 20, 2003; p. 104.

(Continued)

*Primary Examiner*—Shouxiang Hu
(74) *Attorney, Agent, or Firm*—Sonnenschein Nath & Rosenthal LLP

(57) ABSTRACT

A memory device 10 has an arrangement in which a memory thin film 4 is sandwiched between first and second electrodes 2 and 6, the memory thin film 6 contains at least rare earth elements, the memory thin film 4 or a layer 3 in contact with the memory thin film 4 contains any one of elements selected from Cu, Ag, Zn and the memory thin film 4 or the layer 3 in contact with the memory thin film 4 contains any one of elements selected from Te, S, Se. The memory device can record and read information with ease stably, and this memory device can be manufactured easily by a relatively simple manufacturing method.

6 Claims, 23 Drawing Sheets

FOREIGN PATENT DOCUMENTS

| | | |
|---|---|---|
| EP | 1 343 154 A2 | 10/2003 |
| EP | 1343154 | 10/2006 |
| GB | 1413431 | 11/1975 |
| WO | WO9928914 | 6/1999 |
| WO | WO 03/079463 | 9/2003 |
| WO | WO 03/083927 | 10/2003 |
| WO | WO 2004/084306 A1 | 3/2004 |

OTHER PUBLICATIONS

W. T. Li, D.R. McKenzie, and W. Wiszniewski, "A Comparative Study of the On-Off Switching Behavior of Metal-Insulator-Metal Antifuses", IEEE Electron Device Letters, vol. 21, No. 6, Jun. 2000, 0741-3106/00, 2000 1EEE, pp. 295,297.

C. Zhang, Y. King, S. Eltoukhy, E. Hamdy, T. Jing, P. Yu, C. Hu, "On-state Reliability of Amorphous Silicon Antifuses", Supplied by the British Library—"The World's Knowledge", 0-7803-2700-4, IEDM 95-551-554, (1995).

A. Beck, J. G. Bednorz, Ch. Gerber, C. Rossel, and D. Widmer, Reproducible Switching Effect in Thin Oxide Films for Memory Applications, IBM Research, Zurich Research Laboratory, CH-8803, Ruschlikon, Switzerland, 2000 America Institute of Physics, Appiled Physics Letters; vol. 77, No. 1, Jul. 2000, pp. 139-141.

European Search Report dated Mar. 19, 2007.

European Search Report dated May 31, 2007.

\* cited by examiner 20 nm (Layer Mainly Composed of Gd-O)

(Layer Mainly Composed of Cu-Te)

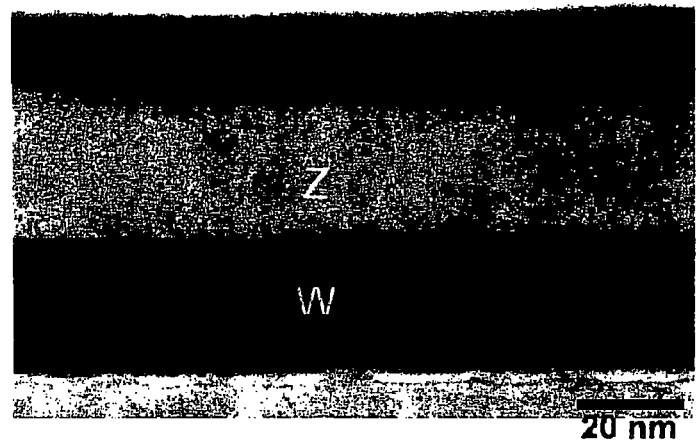
FIG. 44A
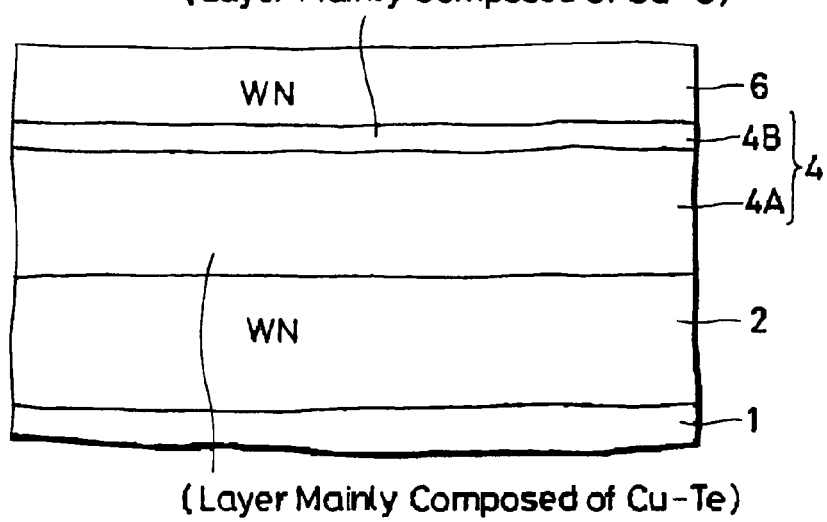
(Layer Mainly Composed of Gd-O)
FIG. 44B
(Layer Mainly Composed of Cu-Te)
FIG. 44C
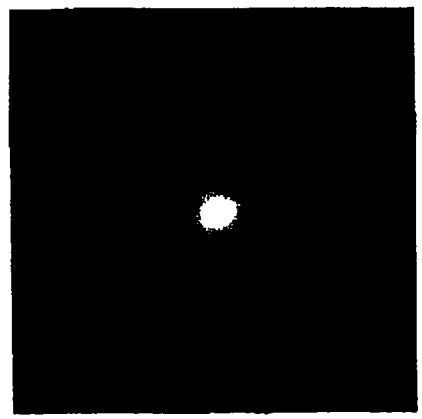
FIG. 44D

MEMORY DEVICE AND STORAGE APPARATUS

RELATED APPLICATION DATA

The present application claims priority to Japanese Application(s) No(s). P2003-400319 filed Nov. 28, 2003, P2003-415412 filed Dec. 12, 2003, and P2004-182775 filed Jun. 21, 2004, which application(s) is/are incorporated herein by reference to the extent permitted by law.

BACKGROUND OF THE INVENTION

1. Field of the Invention

The present invention relates to a memory device capable of recording information and a storage apparatus using such a memory device.

2. Description of the Related Art

In information equipment such as computers, a high-density DRAM (dynamic RAM (random-access memory)) which can be operated at high speed is widely used as a random-access memory.

However, since the DRAM is complex in manufacturing process as compared with ordinary logic circuit (large scale integrated circuit (LSI circuit)) and a signal processing circuit, it is unavoidable that the manufacturing cost of the DRAM increases.

Also, the DRAM is a volatile memory of which information is lost when de-energized so that refresh operations should be made frequently, that is, written information (data) should be read out, amplified and again written in the DRAM.

For this reason, a FeRAM (ferroelectric memory) and an MRAM (magnetic memory device) have been so far proposed as a nonvolatile memory of which information can be prevented from being lost even when de-energized.

It becomes possible for these memories to maintain written information during a long period of time without supply of power.

Since these memories are nonvolatile memories, the refresh operations need not be made and it is expected that power consumption will be decreased.

However, the above-mentioned nonvolatile memories become difficult to maintain characteristics of memory devices as the memory device comprising each memory cell is being reduced in size.

As a consequently, it is difficult to reduce the device in size up to the limit of a design rule and up to the limit of a manufacturing process.

Accordingly, a memory device of a new type has been proposed as a memory which is suitable for being reduced in size.

This type of memory device has a structure in which an ion conductor containing some metal is sandwiched between two electrodes.

Since any one of the two electrodes contain a metal contained in the ion conductor, when a voltage is applied to the two electrodes, the metal contained in the electrode is diffused into the ion conductor as ions, whereby electric characteristics such as a resistance value or a capacitance of the ion conductor are changed.

It is possible to construct the memory device by using this characteristic (for example, see cited patent reference 1 and cited non-patent reference 1).

To be concrete, the ion conductor is made of solid solution of chalcogenide and metal. More specifically, the ion conductor is made of solid solution of AsS, GeS, GeSe with Ag, Cu, Zn. Any one of the two electrodes contains Ag, Cu, Zn Z (see the above-described cited patent reference 1).

Further, various kinds of nonvolatile memories using crystal oxide materials have been proposed. For example, in a device having a structure in which a Cr-doped $SrZrO_3$ crystal material is sandwiched by a lower electrode made of $SrRuO_3$ or Pt and an upper electrode made of Au or Pt, there has been reported a memory in which a resistance is reversibly changed with application of voltages with different polarities (see cited non-patent reference 2). However, the details of its principle and so on are unknown.

[Cited patent reference 1]: Official gazette of Japanese laid-open patent application No. 2002-536840

[Cited non-patent reference 1]: Nikkei Electronics, Jan. 20, 2003 (p. 104)

[Cited non-patent reference 2]: A. Beck et al., Appl. Phys. Lett., 77 (2000), p. 139

However, the above-mentioned memory device having the structure in which any one of the upper electrode or the lower electrode contains Ag, Cu, Zn and in which the GeSe amorphous chalcogenide material is sandwiched by these electrodes encounters with the problem in which the aforementioned ion conductor whose resistance is changes is promoted to be crystallized by causes such as the rise of temperature in the manufacturing process, the rise of temperature generated by Joule heat of a recording current, a heat load over a long period of time in which data is stored during a long period of time so that the ion conductor is wholly or partly crystallized, thereby changing the original electric characteristics such as the change of the resistance value of the memory device and the change of recording/erasing operation voltage.

Then, when the crystal material is used as the recording material between the upper and lower electrodes, for example, as compared with the case in which the amorphous material is used as the above-mentioned recording material between the upper and lower electrodes, this memory device encounters with many problems and it is difficult to mass-produce this memory device inexpensively.

Also, in order to obtain crystallinity of excellent quality, a high-temperature treatment at 700° C. should be carried out, and there arises a problem in which characteristics of an MOS transistor that has been formed in advance are deteriorated by heat.

Further, in order to enable the crystal to grow, the material of the underlayer is limited and hence a single crystal material should be used.

SUMMARY OF THE INVENTION

In view of the aforesaid aspect, it is an object of the present invention to provide a memory device having an arrangement in which information can be recorded and read out relatively stably.

It is other object of the present invention to provide a memory device having an arrangement which can easily be manufactured by a relatively simple manufacturing method.

It is a further object of the present invention to provide a storage apparatus using the above-mentioned memory device.

A memory device according to the present invention comprises a first electrode, a second electrode and a memory thin film sandwiched between the first and second electrodes, wherein the memory thin film or a layer in contact with the memory thin film contains any one of elements selected from Cu, Ag, Zn and the memory thin film or a layer in contact with the memory thin film contains any one of elements selected from Te, S, Se.

More specifically, there are enumerated an arrangement in which both of two kinds of element groups of two kinds of elements of the element selected from Cu, Ag, Zn and the element selected from Te, S, Se are contained in the memory thin film, an arrangement in which two kinds of element groups are contained in the layer in contact with the memory thin film and an arrangement in which at least one kind of the element groups are respectively contained in the memory thin film and the layer in contact with the layer.

According to the above-mentioned arrangement of the memory device of the present invention, since the memory thin film is sandwiched between the first and second electrodes, the memory thin film contains at least the rare earth element, the memory thin film or the layer in contact with the memory thin film contains any one of the elements selected from Cu, Ag, Zn and the memory thin film or the layer in contact with the memory thin film contains any one of the elements selected from Te, S, Se, it becomes possible to record information by using the resistance state of the memory thin film.

To be more concrete, when the voltage is applied to the memory device with application of the positive potential to one electrode side, Cu, Ag, Zn are ionized and diffused into the memory thin film and bonded to electrons at the portion of the other electrode side and thereby deposited or they remain in the memory thin film to form the impurity level of the insulating film to lower the resistance value of the memory thin film, thereby making it possible to record information.

Also, in this state, when the negative voltage is applied to the memory device with application of the negative potential to the side of one electrode, Cu, Ag, Zn that had been deposited on the side of the other electrode are again ionized and returned to the original state so that the resistance value of the memory thin film returned to the original high state and that the resistance value of the memory device also is increased, thereby making it possible to erase the recorded information.

Then, since the memory thin film contains the rare earth element, a crystallization temperature of the memory thin film can be increased or a melting point of the memory thin film can be increased, whereby the fine structure of the memory thin film can be stabilized relative to the rise of temperature. As a result, since heat-resisting property of the memory thin film can be improved, a manufacturing yield rate the high-temperature process of the memory device can be improved. Also, stability relative to the local temperature rise generated in the operations of the memory device such as recording can be improved, whereby the number of repetitive rewriting can be increased. Further, even when data is stored during a long period of time under high-temperature circumstances, the high-resistance state can be maintained with stability.

The above-described memory device according to the present invention can be modified such that it can record information only once.

With above-mentioned arrangement, when the voltage is applied to the first and second electrodes, if this voltage is higher than the insulating withstand voltage, then a breakdown occurs within the memory thin film to change the resistance state of the memory thin film, thereby making it possible to record information. In particular, since the memory thin film contains the rare earth element, the memory device is stable thermally and it is able to record information with a very small current, and the resistance state presented after recording can be stably maintained without generating a switch-off phenomenon. As a result, it becomes possible to record information sufficiently stably.

A storage apparatus according to the present invention comprises a memory device composed of a first electrode, a second electrode, a memory thin film sandwiched between the first and second electrodes, the memory thin film contains at least the rare earth element, the memory thin film or a layer in contact with the memory thin film contains any one of elements selected from Cu, Ag, Zn and the memory thin film or a layer in contact with the memory thin film contains any one of elements selected from Te, S, Se, an interconnection connected to the side of the first electrode and an interconnection connected to the side of the second electrode, wherein a large number of memory devices are located.

According to above-mentioned arrangement of the storage apparatus of the present invention, since the storage apparatus comprises the above-mentioned memory device of the present invention, the interconnection connected to the side of the first electrode and the interconnection connected to the side of the second electrode wherein a large number of memory devices are located, it is possible to record information or to erase information with application of a current from the interconnections to the memory device.

A memory device according to the present invention comprises a first electrode, a second electrode, a memory thin film sandwiched between the first and second electrodes and a conductive or semiconductive thin film containing any one of elements selected from Cu, Ag, Zn or any one of elements selected from Te, S, Se being formed between the memory thin film and the first electrode or the second electrode, wherein this conductive or semiconductive thin film contains a rare earth element.

According to the above-mentioned arrangement of the memory device of the present invention, since the memory thin film is sandwiched between the first and second electrodes, this memory thin film is made of the insulating material, the conductive or semiconductive thin film containing any one of elements selected from Cu, Ag, Zn or any one of elements selected from Te, S, Se being formed between the memory thin film and the first electrode or the second electrode and this conductive or semiconductive thin film contains the rare earth element, it becomes possible to record information by using a phenomenon in which the resistance state of the memory thin film is changed.

Also, since the memory thin film is made of the insulating material, it is possible to relatively increase the resistance value in the high resistance state.

Then, since the conductive or semiconductive thin film contains the rare earth element, the crystallization temperature of this conductive or semiconductive thin film rises and hence the crystallization under the high temperature circumstances can be suppressed. As a result, since the conductive or semiconductive thin film can be formed uniformly and the surface roughness of the conductive or semiconductive thin film can be suppressed, it becomes possible to form the memory thin film uniformly. Also, it is possible to suppress the characteristic of the memory device from being deteriorated due to a thermal hysteresis generated when the memory device is preserved or when the memory device is in use.

In the above-described memory device of the present invention, the conductive or semiconductive thin film can contain any one of elements selected from Cu, Ag, Zn and can also contain Te.

With the above-mentioned arrangement, since Te has a very higher conductivity than those of S and Se. it is possible to decrease the resistance value of the conductive or semiconductive thin film. As a result, the resistance change can mainly be generated in the memory thin film having the high resistance value by recording and erasing information. Thus, even if a part of the conductive or semiconductive thin film is crystallized so that the resistance value is changed, such change of the resistance value will not affect the memory operation considerably.

A storage apparatus according to the present invention comprises a memory device composed of a first electrode, a second electrode, a memory thin film sandwiched between the first and second electrodes, this memory thin film is made of an insulating material, a conductive or semiconductive thin film containing any one of elements selected from Cu, Ag, Zn and any one of elements selected from Te, S, Se being formed between the memory thin film and the first electrode or the second electrode, this conductive or semiconductive thin film contains a rare earth element, an interconnection connected to the side of the first electrode and an interconnection connected to the side of the second electrode, wherein a large number of memory devices are located.

According to the above-mentioned arrangement of the storage apparatus of the present invention, since this storage apparatus is composed of the above-mentioned memory device of the present invention, the interconnection connected to the side of the first electrode and the interconnection connected to the side of the second electrode wherein a large number of memory devices are located, it is possible to record or erase information with application of a current from the interconnection to the memory device.

In the memory device according to the present invention, the memory thin film is sandwiched between first and second electrodes, this memory thin film is made of an insulating material or a semiconductor material and a thin film containing CuTe is formed between the memory thin film and the first electrode or the second electrode.

According to the above-mentioned arrangement of the memory device of the present invention, since the memory thin film is sandwiched between the first and second electrodes, this memory thin film is made of the insulating material or the semiconductor material and the thin film containing CuTe is formed between the memory thin film and the first electrode or the second electrode, it becomes possible to record information by using a phenomenon in which the resistance state of the memory thin film is changed.

Also, since the memory thin film is made of the insulating material or the semiconductor material and the thin film containing CuTe is formed between the memory thin film and the first electrode or the second electrode, the resistance value of the thin film containing CuTe is decreased because Cu and Te are high in conductivity while the memory thin film is made of the insulating material or the semiconductor material so that the resistance value of the memory thin film is increased relatively. As a result, the resistance change can be generated mainly in the memory thin film with relatively high resistance value by recording and erasing information.

Even if a part of the thin film containing Cu and Te is crystallized by the rise of temperature so that the resistance value of the thin film is changed, this change of the resistance value does not affect the change of the resistance value of the memory device substantially and hence the memory operation is not affected considerably.

Accordingly, when the storage apparatus is manufactured, it is in use or when it is preserved under high temperature circumstance, it is possible to suppress the characteristic of the memory device from being deteriorated due to a thermal hysteresis.

A storage apparatus according to the present invention comprises a memory device composed of a first electrode, a second electrode, a memory thin film sandwiched between the first and second electrodes, this memory thin film is made of an insulating material or a semiconductor material and a thin film containing CuTe being formed between the memory thin film and the first electrode or the second electrode, an interconnection connected to the side of the first electrode and an interconnection connected to the side of the second electrode, wherein a large number of memory devices are located.

According to the above-mentioned arrangement of the storage apparatus of the present invention, since the storage apparatus is composed of the above-mentioned memory device of the present invention, the interconnection connected to the side of the first electrode and the interconnection connected to the side of the second electrode wherein a large number of memory devices are located, it is possible to record or erase information with application of a current to the memory device from the interconnection.

A memory device according to the present invention comprises a first electrode, a second electrode, a memory thin film sandwiched between the first and second electrodes and in which this memory thin film or a layer in contact with the memory thin film contains any one of elements selected from Cu, Ag, Zn, the memory thin film or a layer in contact with the memory thin film contains any one of elements selected from Te, S, Se and an underlayer material of the memory thin film has an amorphous structure.

According to the above-mentioned memory device of the present invention, since the memory thin film is sandwiched between the first and second electrodes, the memory thin film or the layer in contact with the memory thin film contains any one of elements (metal elements) selected from Cu, Ag, Zn and the memory thin film or the layer in contact with the memory thin film contains any one of elements (chalcogen elements) selected from Te, S, Se, it becomes possible to record information by changing the resistance state of the memory thin film.

Also, since the underlayer material of the memory thin film has the amorphous structure, the memory thin film formed on the underlayer material can be uniformly formed with the amorphous structure, whereby the interface between the memory thin film and the electrode on the memory thin film can be formed flat. In this manner, since the interface between the memory thin film and the electrode on the memory thin film is formed flat, an electric field distribution within the memory thin film becomes uniform and a switching voltage required when the memory device is changed from the high resistance state to the low resistance state can be prevented from being dispersed and can also be set to a uniform value relative to repetitive recording and erasing.

In the above-described memory device according to the present invention, the memory thin film can further contain more than one kind of rare earth elements selected from at least Y, La, Nd, Sm, Gd, Yb, Dy.

With the above-mentioned arrangement, since the rare earth element is stable thermally, it is possible to stably record information with a very small current.

A storage apparatus according to the present invention comprises a memory device composed of a first electrode, a second electrode and a memory thin film sandwiched between the first and second electrodes in which this memory thin film or a layer in contact with the memory thin film contains any one of elements selected from Cu, Ag, Zn, the memory thin film or a layer in contact with the memory thin film contains any one of elements selected from, Te, S, Se, an interconnection connected to the side of the first electrode and an interconnection connected to the side of the second electrode, wherein a large number of memory devices are located.

According to the above-mentioned arrangement of the storage apparatus of the present invention, since this storage apparatus is composed of the above-mentioned memory device according to the present invention, the interconnection connected to the side of the first electrode and the interconnection connected to the side of the second electrode wherein a large number of memory devices are located, it is possible to record information and to erase information with application of a current to the memory device from the interconnection.

Also, since the dispersions of the switching voltage of the memory device can be decreased, it becomes possible to operate the storage apparatus with stability.

According to the memory device of the present invention, a current required to record information on the memory device can be decreased and it becomes possible to maintain the sufficiently large resistance change of the memory device before and after information is recorded.

As a consequence, power consumed when information is recorded on the memory device can be decreased and it becomes possible to easily read information from the memory device.

Also, it is possible to reduce a time required to record information on the memory device.

Further, since information is recorded on the memory device by using the change of the resistance value of the memory device, in particular, the change of the resistance value of the memory thin film, even when the memory device is microminiaturized, there are then the advantages that information can be recorded with ease and that recorded information can be stored with ease.

Therefore, according to the present invention, information can be recorded on the storage apparatus with ease and recorded information can be read out from the storage apparatus with ease, the power consumption of the storage apparatus can be decreased, the storage apparatus can be operated at high speed and there can be constructed the highly-reliable storage apparatus.

Also, the storage apparatus can be integrated with a high integration degree (integrated with a high density) and can also be miniaturized.

Further, the memory device of the present invention can be manufactured by materials and the manufacturing method for use with the manufacturing process of an ordinary MOS (metal-oxide semiconductor) logic circuit.

Therefore, according to the present invention, the memory device and the storage apparatus which are stable thermally can be manufactured inexpensively and hence it becomes possible to provide an inexpensive storage apparatus. Also, it becomes possible to improve the yielding rate in manufacturing the storage apparatus.

In particular, if the memory thin film of the memory device has the arrangement such that the memory thin film contains at least the rare earth element, then when the memory device is used under high temperature circumstance or data is stored in the memory device for a long time of period, since the memory device can be maintained in the high resistance state stably, information recorded on the memory thin film can be stored stably and it becomes possible to make the memory device become higher in reliability.

Further, since information can be stably recorded on the memory device with the very small current, it is possible to decrease power consumed to record information on the memory device.

Also, in particular, even when the thin film whose resistance value is sufficiently lower than that of the memory thin film is sandwiched between the memory thin film of the memory device and the electrode, it is possible to suppress the influence exerted upon the change of the resistance value due to the rise of temperature. Thus, similarly as described above, even when the memory device is used under high temperature circumstance or even when data is stored in the memory device for a long period of time, the memory device can be maintained in the high resistance state stably. Therefore, since the information recorded on the memory thin film can be held stably, it becomes possible to make the memory device become highly-reliable.

Furthermore, in particular, when the underlayer material of the memory thin film of the memory device has the amorphous structure, since the switching voltage can be set to the uniform value relative to repetitive storage/erasure and dispersions of the switching voltage can be decreased, the stable memory operation can be carried out.

BRIEF DESCRIPTION OF THE DRAWINGS

FIG. 44A is a microscopic representation of a TEM image of the cross-section of the memory device of the sample 35;

FIG. 44B is a schematic diagram used to explain the structure of the TEM image of FIG. 44A;

FIG. 44C is an electron diffraction pattern showing a point W in FIG. 44A;

FIG. 44D is an electron diffraction pattern showing a point Z in FIG. 44A;

DESCRIPTION OF THE PREFERRED EMBODIMENTS

The present invention will now be described in detail with reference to the drawings.

Figure 1:
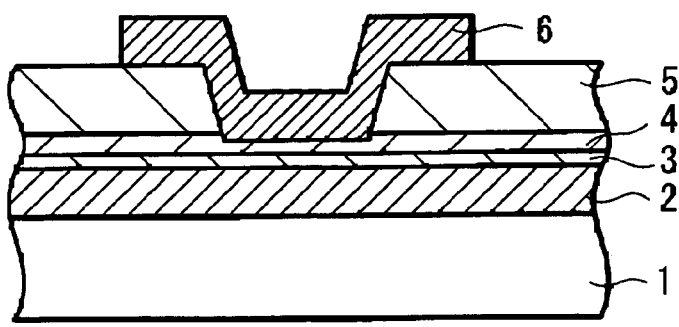
FIG. 1 is a schematic diagram (cross-sectional view) showing an arrangement of a memory device according to an embodiment of the present invention.

FIG. 1 of the accompanying drawings is a schematic diagram (cross-sectional view) showing an arrangement of a memory device according to an embodiment of the present invention.

As shown in FIG. 1, a memory device 10 includes a substrate 1 with a high electric conductivity, for example, a ($P^{++}$) silicon substrate 1 which is heavily doped with P-type impurities and on which a lower electrode 2 is formed. This lower electrode 2 has formed thereon a layer 3 containing Cu, Ag, Zn on which a memory thin film 4 is formed. An upper electrode 6 is connected to the memory thin film 4 through a through-hole formed on an insulating layer 5 on this memory thin film 4.

The lower electrode 2 can be made of interconnection materials for use with the semiconductor process, for example, TiW, Ti, W, WN, Cu, Al, Mo, Ta, silicide and the like.

When the lower electrode 2 is made of a TiW film, for example, the film thickness of this lower electrode 2 may be selected in a range of from 10 nm to 100 nm.

The layer 3 on the lower electrode 2 may contain any one of Cu, Ag, Zn, that is, metal element which serves as an ion source which will be described later on. The layer 3 will hereinafter be referred to as an "ion source layer 3".

The ion source layer 3 can be constructed by using, for example, suitable films with compositions in which Cu, Ag, Zn are added to GeSbTe, GeTe, GeSe, GeS, SiGeTe, SiGeSbTe containing chalcogenide elements of Te, Se, S, an Ag film, an Ag alloy film, a Cu film, a Cu alloy film, a Zn film, a Zn alloy film or the like.

When this ion source layer 3 is made of the GeSbTeCu film, for example, the film thickness thereof may be selected in a range of from 5 nm to 50 nm. Also, when the ion source layer 3 is made of Cu, Ag, Zn, for example, the film thickness thereof may be selected in a range of from 2 nm to 30 nm.

The memory thin film 4 has an arrangement in which a film formed of oxide of one kind or oxides of a plurality of kinds of rare earth elements selected from La, Ce, Pr, Nd, Sm, Eu, Gd, Tb, Dy, Ho, Er, Yb, Y of rare earth elements (that is, rare earth oxide thin film) is formed on the whole thereof or on a part of its film thickness direction.

This memory thin film 4 is formed with a film thickness ranging from 0.5 nm to 10 nm. When the memory thin film 4 is formed with the above-mentioned film thickness, the amorphous state can stably be formed at high temperature so that the resistance value can be increased and stabilized.

Then, the memory thin film 4 becomes able to record information stably as will be shown in the experiment 7 which will be described later on.

Then, since the rare earth oxide is generally the insulating film, it becomes possible to cause the current of the memory thin film 4 to flow by decreasing the film thickness of the memory thin film 4.

Also, while the composition of oxygen in this memory thin film 4 is generally presented as $RE_2O_3$ relative to the rare earth element (RE), since it is sufficient that this memory thin film 4 may be formed of the amorphous film and that it may have electric properties less than conductivity of the semiconductor region, the composition of the oxygen is not limited to the above-mentioned composition and may be $REO_x$ ($0.5 < x \leq 1.5$).

Further, this memory thin film 4 may contain in advance elements other than the rare earth elements, such as Ge, Si, Sb, Ti, W, Cu, Ag, Zn, Fe, Co, P, N, H, Te, S, Se.

The memory thin film 4 made of the above-mentioned materials has characteristics in which its impedance (resistance value) is changed with application of a voltage pulse or a current pulse.

Then, the change of the resistance value of this memory thin film 4 is sufficiently larger than those of other layers. Therefore, the change of the resistance value of the whole of the memory device 10 is mainly affected by the memory thin film 4.

Accordingly, it is possible to record information on the memory device 10 by using the change of the resistance value of the memory thin film 4.

The insulating layer 5 can be made of a photoresist treated by a hard-cure process, $SiO_2$, $Si_3N_4$ generally used in semiconductor devices, other materials, for example, inorganic materials such as SiON, SiOF, $Al_2O_3$, $Ta_2O_5$, $ZrO_2$, fluorinated organic materials, aromatic organic materials and so on.

The upper electrode 6 may be made of an ordinary semiconductor interconnection material similarly to the lower electrode 2.

The memory device 10 according to this embodiment can be operated to store information as follows.

First, a positive potential (+potential), for example, is applied to the ion source layer 3 containing Cu, Ag and Zn so that a positive voltage is applied to the memory device 10 in such a manner that the side of the upper electrode 6 is set to the negative side. As a consequence, Cu, Ag, Zn are ionized and diffused from the ion source layer 3 into the memory thin film 4 and bonded to electrons on the side of the upper electrode 6 and thereby deposited or left within the memory thin film 4 in the state in which they are diffused into the memory thin film 4.

Then, a current path containing a large amount of Cu, Ag, Zn is formed in the inside of the memory thin film 4 or a large number of defects based upon Cu, Ag, Zn are formed within the memory thin film 4, whereby the resistance value of the memory thin film 4 is lowered. Since the resistance values of the respective layers except the memory thin film 4 are low from the beginning as compared with the resistance value obtained before information is recorded on the memory thin film 4, it is possible to lower the resistance value of the whole of the memory device 10 by lowering the resistance value of the memory thin film 4.

After that, when a voltage applied to the memory device 10 is removed by removing the positive voltage, the memory device 10 is held in the state in which the resistance value is lowered. Thus, it becomes possible to record information. When the storage apparatus according to this embodiment is applied to a memory device on which information can be recorded once, that is, so-called PROM (programmable read-only memory), recording of information is completed only by the above-described recording process.

On the other hand, when the storage apparatus according to this embodiment is applied to an erasable storage apparatus, that is, so-called RAM (random-access memory) or EEPROM (electrically, erasable and programmable ROM) and the like, an erasure process is required. In the erasure process, a negative potential (−potential), for example, is applied to the ion source layer 3 containing Cu, Ag, Zn, whereby a negative potential is applied to the memory device 10 in such a manner that the side of the upper electrode 6 is set to the positive state. As a consequence, Cu, Ag, Zn comprising the current path or the impurity interface formed with the memory thin film 4 are ionized, moved within the memory thin film 4 and returned to the side of the ion source layer 3.

Then, the current path or defects based upon Cu, Ag, Zn are lost from the inside of the memory thin film 4 so that the resistance value of the memory thin film 4 is raised. Since the resistance values of the respective layers except the memory thin film 4 are low from the beginning, it is possible to increase the resistance value of the whole of the memory device 10 by increasing the resistance value of the memory thin film 4.

After that, when the voltage applied to the memory device 10 is removed by removing the negative voltage, the memory device is place in the state in which the resistance value thereof is increased. Thus, it becomes possible to erase the recorded information.

The above-mentioned process is repeated, whereby information can be recorded (written) on the memory device 10 and recorded information can be erased from the memory device 10 repeatedly.

Then, when the state in which the resistance value is high is made corresponding to information of "0" and the state in which the resistance value is low, for example, is made corresponding to information of "1", respectively, the information "0" can be changed into the information "1" in the recording process in which information is recorded on the storage apparatus with application of the positive voltage and the information "1" can be changed into the information "0" in the erasing process in which recorded information is erased from the storage apparatus with application of the negative voltage.

Although it is customary that the memory thin film 4 is high in resistance value in the initial state before recording, it is possible that the memory thin film 4 may be initially low in resistance in the recording state by a suitable treatment such as a plasma treatment and an anneal treatment in the process treatment.

The resistance value obtained after information was recorded on the storage apparatus depends on recording conditions such as a width of a voltage pulse or a current pulse applied upon recording, a current amount and the like rather than the cell size of the memory device 10 and the composition of the material of the memory thin film 4, and when the initial resistance value is higher than 100 kΩ, the above-mentioned resistance value obtained after information was recorded on the storage apparatus falls within a range of from 50 Ω to 50 kΩ.

Because it is sufficient that the ratio between the resistance value in the initial state and the resistance value obtained after recording may be greater than twice in order to demodulate recorded data, it is sufficient that the resistance value obtained before recording is 100 Ω and the resistance value obtained after recording is 50 Ω or the resistance value obtained before recording is 100 kΩ and the resistance value obtained after recording is 50 kΩ. Hence, the initial resistance value of the memory thin film 4 may be set so as to satisfy such conditions. It is possible to adjust the resistance value of the memory thin film 4 by adjusting an oxygen concentration, a film thickness, an area and further by addition of impurity materials.

The memory device 10 shown in FIG. 1 can be manufactured as follows, for example.

First, a lower electrode 2, for example, TiW film is deposited on a substrate 1 with a high conductivity, for example, a silicon substrate which was heavily doped with P-type impurities.

Next, an ion source layer 3, for example, a Cu layer is deposited on the lower electrode 2, whereafter a memory thin film 4, for example, $Gd_2O_3$ film is deposited on the ion source layer 3.

After that, while an insulating layer 5 is formed so as to cover the memory thin film 4, a part of the insulating layer 5 is removed by photolithography and a contact portion to the memory thin film 4 is formed.

Subsequently, a TiW film is deposited as an upper electrode 6 by a magnetron sputtering apparatus, for example.

Thereafter, the TiW film is patterned by a suitable method such as plasma etching. In addition to the plasma etching, the TiW film can be patterned by a suitable etching method such as ion milling and a RIE (reactive ion etching).

In this manner, the memory device 10 shown in FIG. 1 can be manufactured.

According to the arrangement of the memory device 10 of the above-mentioned embodiment, since the ion source layer 3 containing Cu, Ag, Zn and the memory thin film 4 composed of the oxygen and the rare earth element are sandwiched between the lower electrode 2 and the upper electrode 6, when the side of the upper electrode 6 is set to the negative state with application of the positive voltage (+voltage) to the side of the ion source layer 3 containing Cu, Ag, Zn, for example, the current path containing a large number of Cu, Ag, Zn is formed within the memory thin film 4 or a large number of defects based on Cu, Ag, Zn are formed within the memory thin film 4, whereby the resistance value of the memory thin film 4 is lowered and the resistance value of the whole of the memory device 10 is lowered. Then, when the application of the positive voltage is stopped so that the voltage is not applied to the memory device 10, the state in which the resistance value is lowered is held and it becomes possible to record information. This arrangement can be applied to the storage apparatus such as the PROM in which information can be recorded only once.

Then, since information is recorded on the storage apparatus by using the change of the resistance value of the memory device 10, in particular, the change of the resistance value of the memory thin film 4, even when the memory device 10 is microminiaturized, information can be recorded on the storage apparatus with ease and recorded information can be stored in the storage apparatus with ease.

Also, when the above-mentioned arrangement of this embodiment is applied to other storage apparatus such as RAM and EEPROM in which information can be erased as well as recorded, the side of the upper electrode 6 is set to the positive state with application of the negative voltage (−potential) to the memory device 10 which is placed in the above-mentioned recorded state, for example, the ion source layer 3 containing Cu, Ag, Zn. As a result, the current path or the defects that had been formed within the memory thin film 4 by Cu, Ag, Zn are lost so that the resistance value of the memory thin film 4 is increased, thereby resulting in the resistance value of the whole of the memory device 10 being increased. Then, when the application of the negative voltage to the memory device 10 is stopped so that the voltage may not be applied to the memory device 10, the state in which the resistance value is increased is held and hence it becomes possible to erase the recorded information from the storage apparatus.

Also, according to the memory device 10 of this embodiment, since the memory thin film 4 has the arrangement in which the rare earth oxide thin film is formed on the whole thereof or a part of the film thickness direction, the crystallization temperature of the memory thin film 4 rises due to the action of the rare earth oxide so that the rare earth oxide can be suppressed from being crystallized under high temperature circumstance. The reason for this is that, since the rare earth oxide thin film is amorphous and a melting point of the rare earth oxide is very high as high as about 2400° C., when the rare earth oxide is heated by Joule heat generated to record or erase information, the fine structure of the thin film can be prevented from being changed and hence it can be made stable.

As a result, when the memory device 10 is in use under high temperature circumstance or when data is stored in the memory device 10 for a long period of time, it is possible to maintain the high resistance state stably.

Accordingly, the information recorded on the memory thin film 4 can be held stably and hence it becomes possible to make the memory device 10 highly reliable.

Further, since the memory thin film is made of the rare earth oxide thin film, it becomes possible to widen the range to select the materials of the ion source layer 3 containing the elements (Cu, Ag, Zn) serving as the ion source and the chalcogenide elements (S, Se, Te).

A resistance change type memory device that has been proposed so far constructs a recording layer containing the elements serving as the ion source and the chalcogenide elements so that a material which is placed in the high resistance state when the ion source is few, for example, a material based on Ge, GeSe and which contains elements serving as the ion source is selected. However, GeS and GeSe are low in melting point of S and Se and hence they are difficult to be deposited stably by sputtering. Also, when the recording layer is constructed by using Te as the chalcogenide element, for example, a suitable material such as GeSbTe and GeTe, although it becomes possible to stably deposit the recording layer by a sputtering method, since Te is very high in conductivity as compared with S and Se, if the recording layer contains the elements (Cu, Ag, Zn) serving as the ion source, the resistance is decreased too much, and it becomes difficult to provide the high resistance state necessary for the memory device.

On the other hand, when the memory thin film 4 is composed of the rare earth oxide thin film and the ion source layer 3 is provided separately from the memory thin film 4 like the memory device 10 of this embodiment, since the change of resistance occurs mainly in the memory thin film 4 composed of the rare earth oxide thin film, the electric resistance characteristic of the ion source layer 3 does not become a serious problem. Thus, it becomes possible to use a Te-based material as the ion source layer 3.

In order to increase stability of memory operations of the memory device, it is desired that the change of resistance in the ion source layer 3 can be decreased as much as possible. Accordingly, it is desired that the resistance value of the ion source layer 3 should be placed in the low state constantly. Since the resistance value of the ion source layer 3 is constantly set to the low state as described above, even if the ion source layer 3 is crystallized, the resistance change is hardly produced, and a collateral effect can be achieved, in which at least no electrical problem occurs.

Further, according to the memory device 10 of this embodiment, the lower electrode 2, the ion source layer 3, the memory thin film 4 and the upper electrode 6 can be constructed by the materials which can be treated by sputtering. For example, sputtering may be made by using the targets composed of compositions suitable for the materials of the respective layers.

Also, if the targets are changed within the same sputtering apparatus, then it becomes possible to continuously deposit the respective layers.

When the above-mentioned memory device 10 according to this embodiment has an arrangement in which a film made of a rare earth element oxide (rare earth oxide thin film) is formed on a part as the memory thin film 4, this oxide thin film can be formed by a method using an oxide sputtering target, a method using a metal target and in which oxygen is introduced together with an inert gas such as an argon gas as an introduced gas during the sputtering, that is, a method using a so-called reactive sputtering and so forth.

Further, the oxide thin film can be formed by a CVD method or a method such as a vapor-deposition method in addition to the sputtering method. Furthermore, when an oxide thin film is deposited, the oxide thin film is set to the metal state and then it can be formed by a method such as thermal oxidation or a drug treatment.

In the memory device 10 according to the above-mentioned embodiment, while the arrangement in which the ion source layer 3 in contact with the memory thin film 4 contains Cu, Ag, Zn has been described so far, the present invention is not limited thereto and the above-mentioned arrangement may be modified as an arrangement in which the memory thin film 4 contains Cu, Ag, Zn of ion sources, an arrangement in which the lower electrode 2 contains Cu, Ag, Zn of ion sources or an arrangement in which the lower electrode 2 or the upper electrode 6 contain Cu, Ag, Zn of ion sources. Also, the ion source layer 3 can be used as the lower electrode 2 without modification.

Further, in the memory device 10 according to the above-mentioned embodiment, while the arrangement in which the ion source layer 3 in contact with the memory thin film 4 contains Te, S, Se has been described so far, the present invention is not limited thereto and the above-mentioned arrangement may be modified as an arrangement in which memory thin film 4 contains Te, S, Se, an arrangement in which the lower electrode 2 contains Te, S, Se or an arrangement in which the lower electrode 2 and the upper electrode 6 contain Te, S, Se.

Furthermore, in the memory device 10 according to the above-mentioned embodiment, while the thin film made of oxide of rare earth element has been described as the memory thin film 4, the present invention is not limited thereto and it is possible to use a memory thin film having an arrangement in which a composition ratio containing rare earth element and oxygen has a composition gradient in the film thickness direction as shown in an experiment 3 which will be described later on.

In the case of the memory thin film 4 having the above-mentioned arrangement, since it is possible to form an insensible film on the interface state as described in the experiment which will be described later on, an interface phenomenon can be suppressed as compared with the case of the film in the interface state in which the composition ratio is changed discontinuously. Thus, even though dispersions occur in the process upon mass-production, the influence of such dispersions of the process is small and hence there is an advantage that the process in the mass-production can be facilitated.

Also, in the memory device 10 according to the above-mentioned embodiment, while the memory thin film 4 is formed of the rare earth oxide thin film, the memory thin film 4 may contain rare earth elements but it may not contain oxygen. Also in this case, the memory thin film 4 contains the rare earth elements and hence the crystallization temperature of the memory thin film 4 rises. Thus, even when the memory thin film 4 is in use under high temperature circumstance or data is stored in the memory thin film 4 during a long period of time, the high resistance state can be maintained stably and information recorded on the memory thin film 4 can be stored stably.

A storage apparatus can be constructed by disposing a large number of the memory devices 10 according to the above-mentioned embodiment in a matrix fashion.

Each memory device 10 may include an interconnection connected to the side of the lower electrode 2 thereof and an interconnection connected to the side of the upper electrode 6 thereof and each memory device 10 may be disposed near the intersection of these interconnections, for example.

More specifically, the lower electrode 2, for example, may be made common to the memory cells of the row direction, the interconnection connected to the upper electrode 6 may be made common to the memory cells of the column direction, the memory cell to be recorded may be selected by selecting the lower electrode 2 and the interconnection through which a current flows with application of the potential, a current flows through the memory device 10 of this memory cell and hence information can be recorded on the memory device 10 and recorded information can be erased from the memory device 10.

Then, the memory device 10 according to the above-mentioned embodiment can easily record information and can easily read out the recorded information, in particular, the memory device 10 has excellent characteristics in which data can be stored under high temperature circumstance with stability.

Also, even when the memory device 10 according to the above-mentioned embodiment is microminiaturized, it becomes easy to record information on the memory device 10 and to store recorded information on the memory device 10.

Accordingly, the storage apparatus is constructed by using the memory device 10 according to the above-mentioned embodiment, whereby the storage apparatus can be integrated (increased in density) and miniaturized.

Inventive ExampleS

Next, the memory device 10 according to the above-mentioned embodiment was manufactured in actual practice and characteristics thereof were checked.

<Experiment 1>

First, a TiW film having a film thickness of 50 nm was deposited on a substrate 1 with a high conductivity, for example, a silicon substrate which is doped with high concentration P-type impurities as the lower electrode 2 by sputtering. Next, a Cu film having a film thickness of 10 nm was deposited as the ion source layer 3 by a magnetron sputtering apparatus and subsequently, an amorphous gadolinium oxide film (amorphous Gd oxide film) having a film thickness of 5 nm was deposited as the memory thin film 4 by a reactive sputtering method based upon introduction of oxygen gas.

Next, a photoresist is deposited so as to cover the amorphous gadolinium oxide film, whereafter a through-hole was formed on the amorphous gadolinium oxide film 4 by exposure and development based on the photolithography technique. The through-hole was 2 μm long and 2μ wide.

After that, the resultant product was annealed at 270° C. in vacuo and the insulating layer 5 was formed as a hard-cure resist which is stable relative to temperature, etching and so on. The reason that the hard-cure resist is used in the insulating layer 5 is that the insulating layer 5 can be formed with ease from an experiment standpoint. When the product is manufactured in actual practice, it is desirable that the insulating layer 5 should be formed of other material (for example, silicon oxide film, etc.).

Next, a TiW film having a film thickness of 100 nm was deposited as the upper electrode 6. After that, the upper electrode 6 deposited on the hard-cure resist is patterned with a size of 50 μm×50 μm by a plasma etching apparatus according to the photolithography technique.

The memory device having the above-mentioned structure was manufactured and used as the memory device of a sample 1.

In the memory device of this sample 1, the rear surface of the low-resistance silicon substrate 1 that is conducted to the lower electrode 2 is connected to the ground potential (GND potential) to apply the negative potential (−potential) to the upper electrode 6.

Then, while the negative potential applied to the upper electrode 6 was being decreased from 0V progressively, the change of the current was measured. However, after it was set such that the current limiter starts to operate at the time in which the current reaches 0.03 mA, it was set so that, when the current increases more than 0.3 mA, the negative potential applied to the upper electrode 6, that is, the voltage applied to the memory device may be prevented from being increased.

Also, the negative potential applied to the upper electrode 6 is decreased up to 0V from the state in which the current limiter starts to operate after the current reached 0.03 mA and the change of the current was measured. Conversely, this time, after the positive voltage was applied to the upper electrode 6 so that the application of the positive voltage was increased to the extent that the current may be decreased so that no current flows, the positive potential was again returned to 0 potential.

Figure 2:
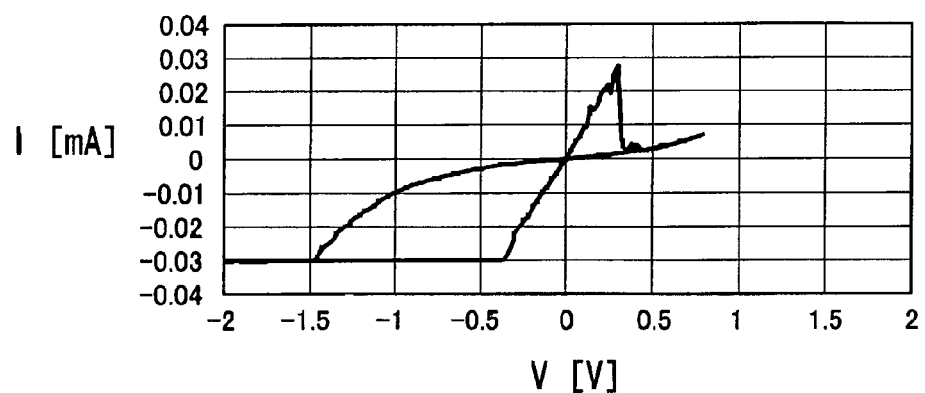
FIG. 2 is a graph showing measured results of I-V (current-to-voltage) characteristics of a sample 1.

FIG. 2 shows measured results of I-V (current-to-voltage) characteristics of the thus obtained sample 1.

From FIG. 2, it is to be understood that the resistance value is high in the initial stage, the memory device is placed in the OFF state and the voltage is increased in the negative direction so that the current rapidly increases at the voltage higher than a certain threshold voltage (Vth), that is, the resistance value is decreased so that the memory device is changed to the ON state. Thus, from FIG. 2, it is clear that information can be recorded on the memory device.

On the other hand, after the voltage was decreased, a constant resistance value was maintained. That is, it is clear from FIG. 2 that the memory device is kept in the ON state so that recorded information could be stored.

In the case of this sample 1, a resistance value of the OFF state in the place where voltage v=0.1V was approximately 2 MΩ and the resistance value in the ON state was approximately 100 kΩ.

Further, as shown in FIG. 2, it was confirmed that after the voltage V of the polarity opposite to the above-mentioned one is applied, that is, the rear surface side of the substrate 1 is connected to the ground potential (GND potential) to apply the positive potential (+potential) higher than V=0.3V is applied to the upper electrode 6 and the voltage was again returned to 0V, the resistance value of the memory device was returned to the high resistance state of the initial OFF state.

That is, it is to be understood that the information recorded on the memory device can be erased with application of the negative potential.

<Experiment 2>

Next, there were examined characteristics obtained when a GeSbTeCu film having a thickness of 13 nm was used as the ion source layer 3, a film having a thickness of 8 nm in which GeSbTe was added to $Gd_2O_3$ being used as the memory thin film 4.

Materials of the respective films except the above-mentioned films are all similar to those shown in the experiment 1 and therefore need not be described in detail. Also, the measuring method is different from that of the experiment 1 only in that the value of the current limiter is changed to 1 mA.

The composition of the GeSbTeCu film of the ion source layer 3 was $(Ge_2Sb_2Te_5)_2Cu$ and the composition of the memory thin film 4 is $(Gd_dO_s)_2(Ge_2Sb_2Te_5)$.

Figure 3:
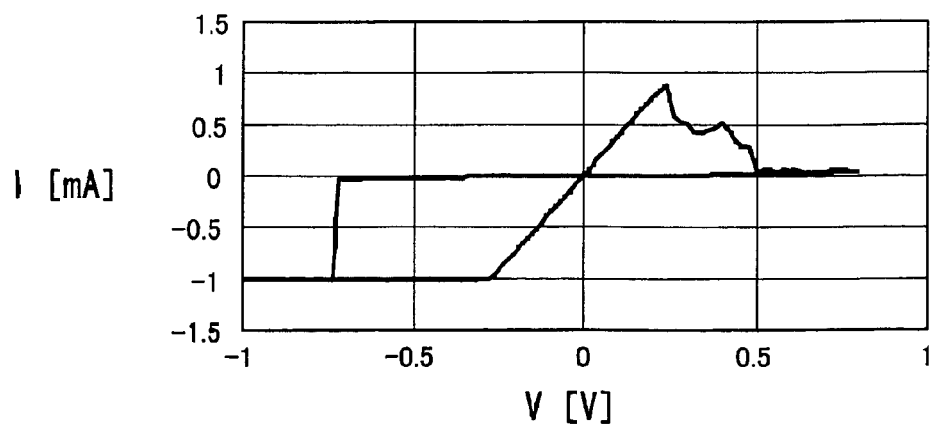
FIG. 3 is a graph showing measured results of I-V (current-to-voltage) characteristics of a sample 2.

The memory device having the above-mentioned structure was manufactured and used as a memory device of a sample 2. FIG. 3 shows measured results of I-V (current-to-voltage) characteristics of this sample 2.

From FIG. 3, it is to be understood that, while the resistance value of the memory device is about 10 MΩ in the initial OFF state, the resistance value of the memory device reaches 300 Ω after a negative voltage exceeding a threshold voltage (−0.7V) was applied to record information. Further, it is clear that the resistance value of the memory device reaches about 1 MΩ after the voltage of the positive direction was applied to change the resistance value of the memory device to the OFF state, that is, recorded information was erased.

<Experiment 3>

A TiW film having a film thickness of 50 nm was deposited on a substrate 1 with a high conductivity, for example, a silicon substrate which was doped with high concentration P-type impurities as the lower electrode 2 by sputtering. Next, a Cu film having a film thickness ranging from 3 nm to 20 nm was deposited by using a magnetron sputtering apparatus. Subsequently, a $(Ge_2Sb_2Te_5)_{1-x}Gd_x$ film having a film thickness ranging of from 5 nm to 50 nm was deposited by sputtering based upon introduction of an Ar gas.

Next, a photoresist was formed, whereafter a through-hole was formed by exposure and development according to the photolithography technique. The size of this through-hole was 2 μm long and 2 μm wide.

After that, the photoresist was changed in quality by annealing at 280° C. in vacuo and thereby the insulating layer 5 was formed as the hard-cure resist which is stable relative to temperature, etching and so forth.

In this annealing treatment, an oxide thin film is formed on the surface of the $Ge_2Sb_2Te_5Gd$ film by a small amount of oxygen remaining within the chamber or oxygen originated from the photoresist.

The reason that the hard-cure resist was used as the insulating film 5 is that the insulating film 5 can be formed with ease from an experiment standpoint. When the product is manufactured, it is desirable that the insulating layer 5 should be made of other material (silicon oxide film, etc.).

Next, a TiW film having a film thickness of 100 nm was deposited as the upper electrode 6. After that, a TiW film 6 deposited on the insulating layer 5 made of the hard-cure resist was patterned with the size of 50 μm×50 μm by using a plasma etching apparatus according to the photolithography technique.

The memory device having the above-mentioned structure was used as a memory device of a sample 3.

In the memory device of this sample 3, the rear surface of the low-resistance silicon substrate 1 conducted to the lower electrode 2 was connected to the ground potential (GND potential) to apply the negative potential to the upper electrode 6.

Then, while the negative potential applied to the upper electrode 6 was being decreased from 0V progressively, the change of the current was measured. However, after it was set so that the current limiter starts to operate at the time in which the current reaches 1 mA, it was set so that the negative potential applied to the upper electrode 6, that is, the voltage applied to the memory device may be prevented from being increased at the current larger than 1 mA.

Also, the negative potential applied to the upper electrode 6 was decreased up to 0V from the state in which the current reaches 1 mA to allow the current limiter to start to operate, and the change of the current was measured. Subsequently, this time, conversely, after the positive potential was applied to the upper electrode 6 to decrease the current and the voltage was increased to the extent that the current hardly flows, the positive potential was again returned to the 0 potential.

Figure 4:
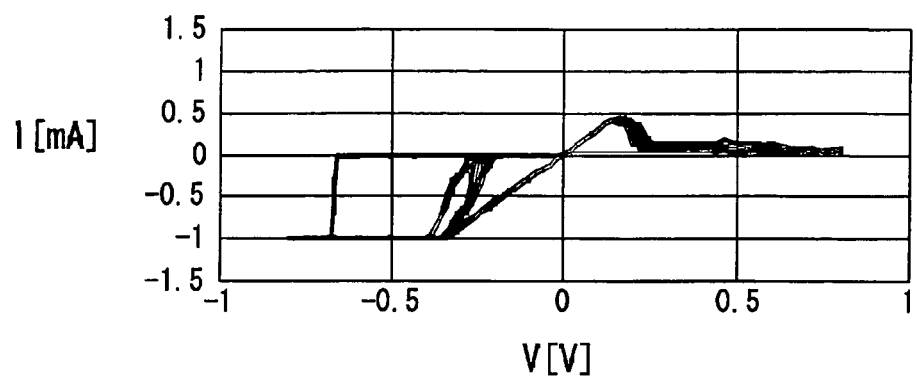
FIG. 4 is a graph showing measured results of I-V (current-to-voltage) characteristics of a sample 3.
Figure 5:
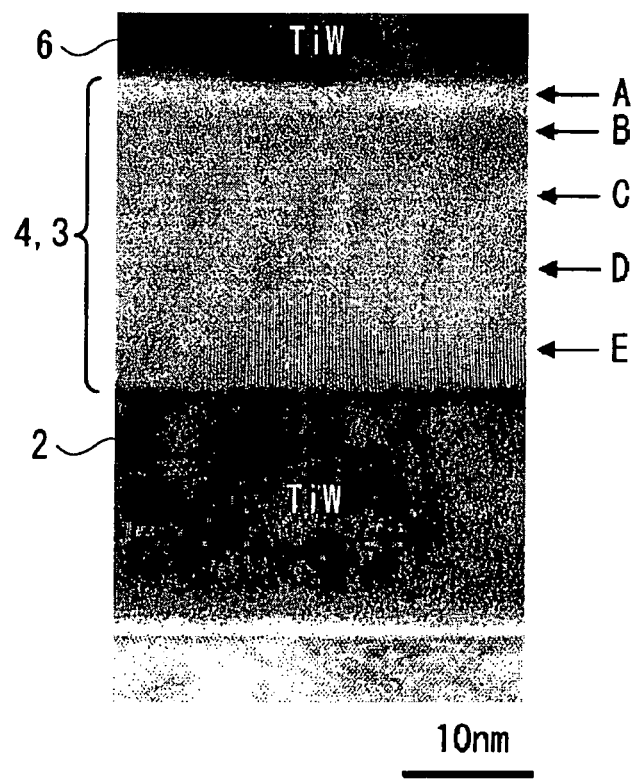
FIG. 5 is a microscopic representation showing an image obtained when the cross-section of the sample 3 is observed by a transmission electron microscope.

FIG. 4 shows measured results of I-V (current-to-voltage) characteristics of the sample 3 in which the film thickness of the Cu film was selected to be 6 nm and the film thickness of the $Ge_2Sb_2Te_5Gd$ film was selected to be 25 nm. Further, FIG. 4 shows I-V characteristics obtained when first recording, erasure and re-recording were repeated. FIG. 5 shows an image obtained when the cross-section of the memory device with such arrangement was observed by a TEM (transmission electron microscope).

The composition of the $Ge_2Sb_2Te_5Gd$ film was $(Ge_2Sb_2Te_5)_{89}Gd_{11}$.

The memory device of the sample 3 has the structure in which the memory thin film 4 and the ion source layer 3 are sandwiched between the upper and lower electrodes (2, 6) made of the TiW films.

To be concrete, the rare earth oxide layer (whitest portion shown by an arrow A in FIG. 5) in which the oxide is formed sufficiently is formed just below the upper electrode 6. A rare earth oxide layer (slightly blackish portion shown by an arrow B in FIG. 5) having much rare earth element (Gd) and in which an oxygen concentration is low as compared with that of the above-mentioned layer A is formed under this rare earth oxide layer A. Then, the layers (portions shown by arrows C, D, E in FIG. 5) mainly made of Cu, Te and which correspond to the ion source layer 3 are formed under the rare earth oxide layer.

The layers mainly made of the rare earth oxide (layers A and B) are very high in resistance value and exhibit insulating property except the recording mode. The ion source layers (C, D, E) 3 are low in resistance value and exhibit conductivity. The layer located at the middle of these two layers demonstrates a semiconductor-like behavior.

Since the layer mainly made of the rare earth oxide shown by the arrow A has a high oxygen concentration, an oxide thin film roughly composed of $Gd_2O_3$ is formed on the surface of the memory thin film 4 and hence the oxygen concentration is decreased toward the lower portion of the film thickness direction.

Figure 6:
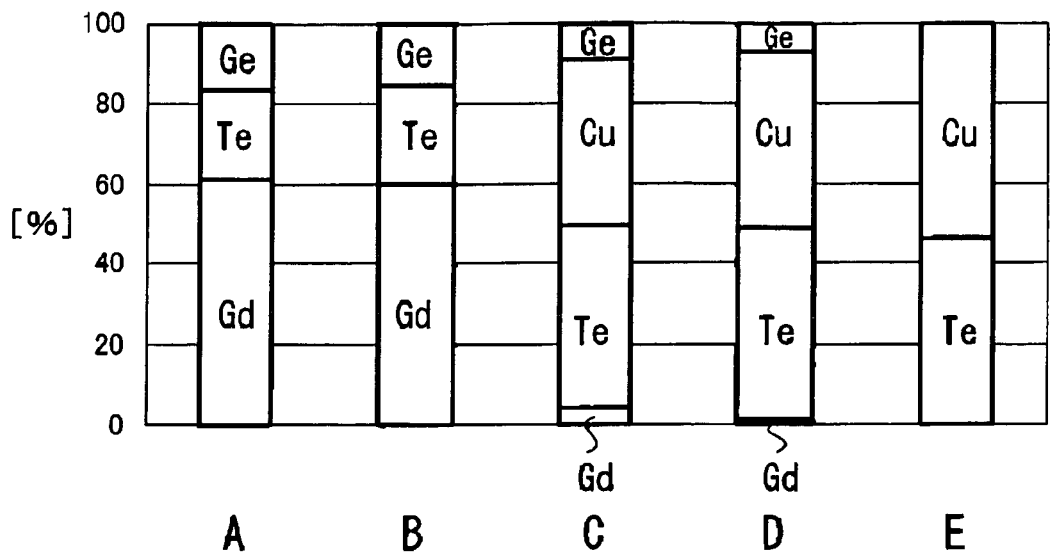
FIG. 6 is a graph showing a composition gradient of the sample 3 obtained along the film thickness direction.

FIG. 6 shows compositions of elements (Gd, Te, Cu, Ge) other than the oxygen in the portions A to E of the memory device of the sample 3 shown in FIG. 5.

A study of FIG. 6 reveals that the elements (Gd, Te, Cu, Ge) other than the oxygen have a composition gradient toward the lower portion of the film thickness direction. Sb is not an object to be analyzed and hence it is not shown in FIG. 6.

The reasons that the composition gradient of material occurs in the film thickness direction are that the deposited rare earth element (rare earth metal element) is very active chemically so that it is diffused into the film and moved toward the surface side with the high oxygen concentration to form the oxide thin film (oxide layer) and that Cu, Ag, Zn are easily bonded to the chalcogenide elements (Te, S, Se) to form a compound and so on.

Since the film having the above-mentioned composition gradient, for example, can form the film that is insensible to the interface state, as compared with the case of the film in the interface state in which the composition ratio is changed discontinuously, for example, the process in the mass-production can be facilitated.

Figure 7:
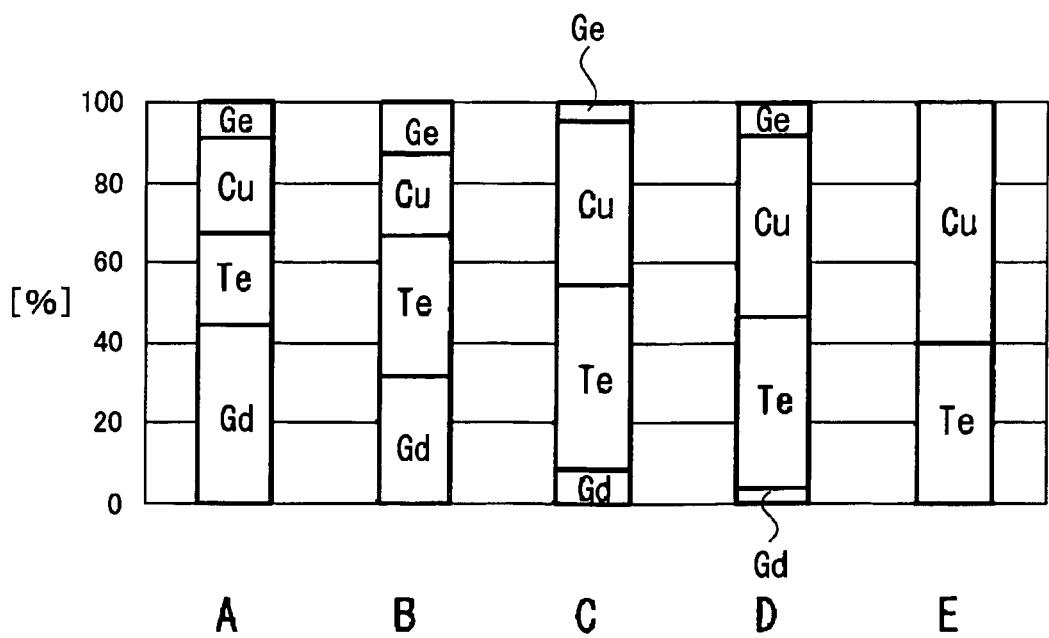
FIG. 7 is a graph showing a composition gradient of the sample 3 obtained along the film thickness direction when a Cu concentration is high.

FIG. 7 shows analyzed results of the composition distribution of the film thickness direction of the sample in which the Cu content concentration is increased.

As shown in FIG. 6, in the case of the memory device in which the Cu content concentration is high, Cu is contained in the layer which is mainly made of the rare earth oxide as shown in A in FIG. 7 so that it is entered into the semiconductor region from the insulating property electrically. Thus, although the resistance value in the initial stage and the resistance value obtained after information had been erased are lowered as compared with the memory device shown in FIG. 6, this memory device is able to operate similarly to the memory device shown in FIG. 6.

In the memory device of the sample 3 shown in FIG. 7, when the GeSbTeGd film was deposited, 20 atomic % of Cu was added to the GeSbTeGd film. The present invention is not limited to the above-mentioned method and it is possible to manufacture a memory device having a similar arrangement by diffusing Cu into the memory thin film 4 according to a suitable process such as thermal diffusion.

<Experiment 4>

Next, there were examined characteristics of the memory device in which Gd (gadolinium) was used as a rare earth element contained in the memory thin film 4 and the adding ratio of Gd was changed respectively.

Then, a TiW film having a film thickness of 20 nm was formed as the lower electrode 2 and a GeTe film or a GeTeGd film having a film thickness of 16 nm was formed on the lower electrode 2. Further, a TiW film having a film thickness of 100 nm was formed as the upper electrode 6.

Specific adding ratios of GD relative to GeTe will be described below.

<Adding Ratio (Atomic %)>

| Sample No. | $Ge_2Te_8$ | Gd |
|---|---|---|
| Sample 4 | 100 | 0 |
| Sample 5 | 93 | 7 |
| Sample 6 | 86 | 14 |
| Sample 7 | 82 | 18 |
| Sample 8 | 78 | 22 |

Figure 8:
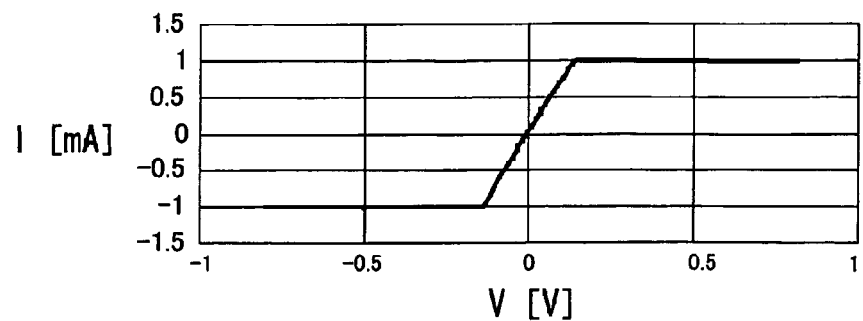
FIG. 8 is a graph showing measured results of I-V (current-to-voltage) characteristics of a sample 4.
Figure 9:
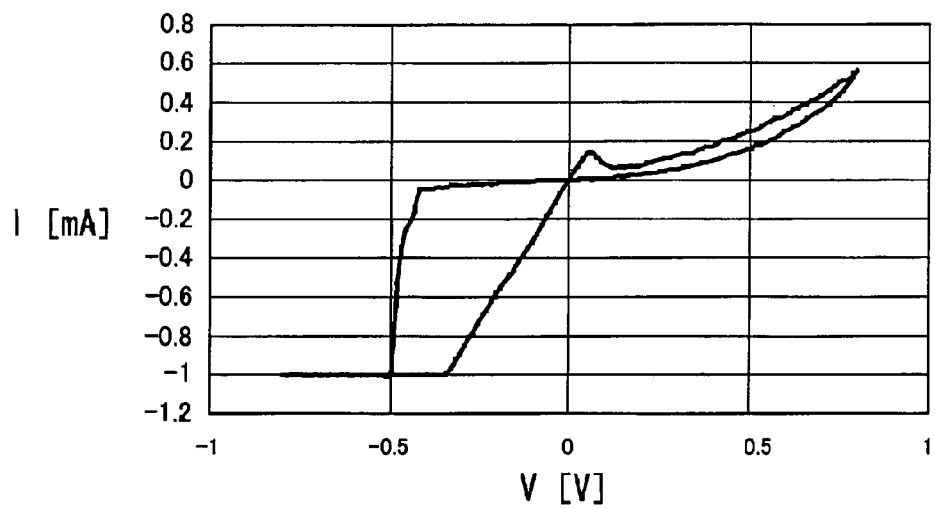
FIG. 9 is a graph showing measured results of I-V (current-to-voltage) characteristics of a sample 5.
Figure 10:
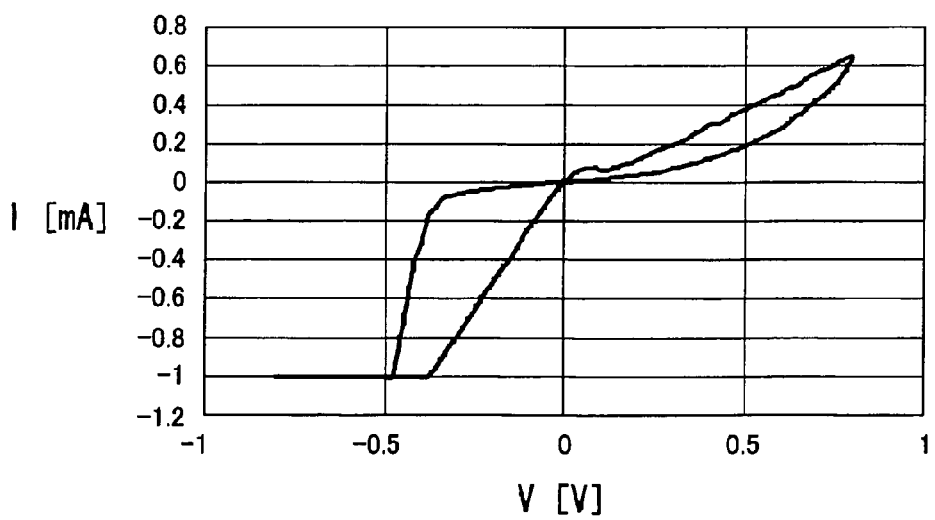
FIG. 10 is a graph showing measured results of I-V (current-to-voltage) characteristics of a sample 6.
Figure 11:
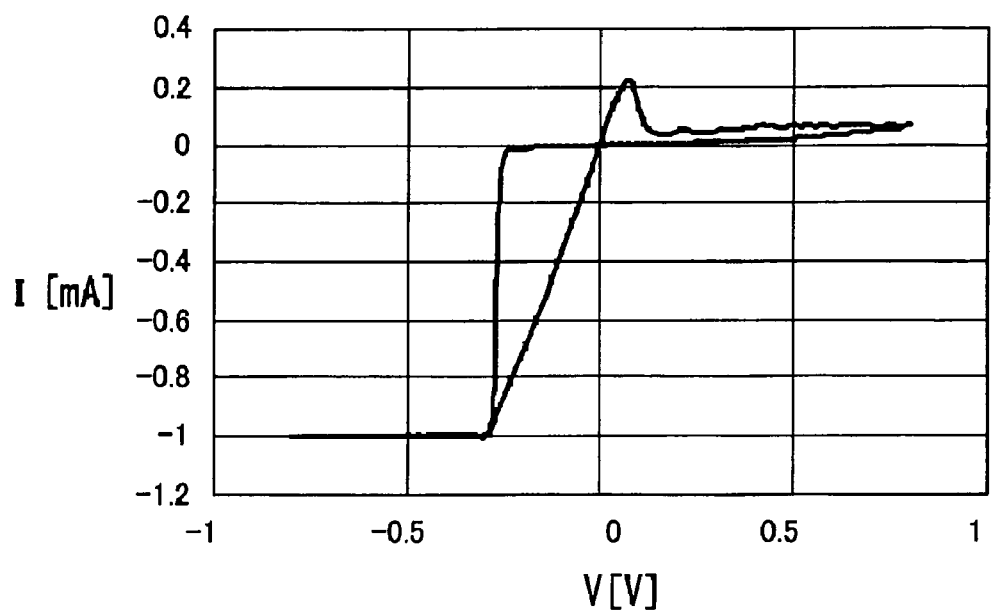
FIG. 11 is a graph showing measured results of I-V (current-to-voltage) characteristics of a sample 7.
Figure 12:
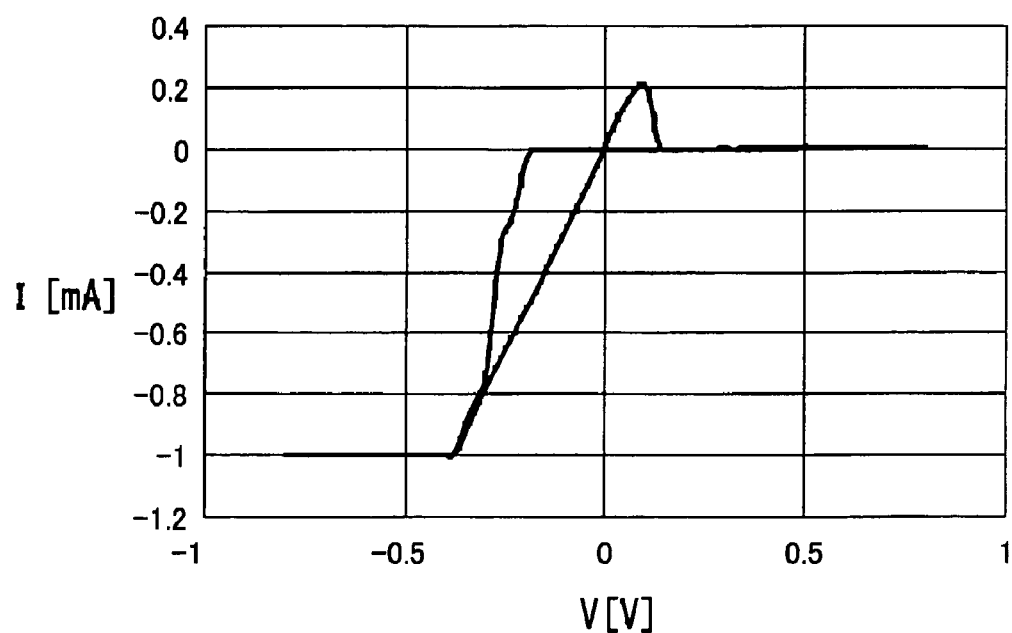
FIG. 12 is a graph showing measured results of I-V (current-to-voltage) characteristics of a sample 8.

I-V (current-to-voltage) characteristics of the respective memory devices of the samples 4 to 8 were measured. FIG. 8 shows measured results of the sample 4; FIG. 9 shows measured results of the sample 5; FIG. 10 shows measured results of the sample 6; FIG. 11 shows measured results of the sample 7; and FIG. 12 shows measured results of the sample 8.

In the case of the memory device of the sample 4 in which Gd was not added as shown in FIG. 8, it is not confirmed that the I-V characteristic exhibits a thermal hysteresis, that is, the memory device does not operate as the memory. Thus, the memory device becomes a resistor having an ohmic characteristic of approximately 150 Ω. The reason for this may be considered such that, since the GeTe film does not contain the rare earth element, the low resistance state that the GeTe film has is generated as it is or since the GeTe film is heated at temperature higher than the crystallization temperature (for example, 200° C.) of the amorphous GeTe in the process, the GeTe film is crystallized and thereby is placed in the low resistance state.

On the other hand, any one the respective memory devices of the samples 5 to 8 shown in FIGS. 9 to 12 exhibited the hysteresis and was operated as the memory. The reason for this will be described. That is, since the rare earth elements are added to the GeTe film, during the process, the rare earth elements are diffused into the surface side to form the oxide thin film, whereby the initial resistance value can be made high. When the initial resistance value becomes high, the memory device becomes able to operate as the memory.

In the laminated structure of the TiW film/$Gd_2O_3$ film/TiW film, when the insulating withstand voltage of the $Gd_2O_3$ film was measured, the measured result of the insulating withstand voltage was approximately 10 MV/cm. Also, in the laminated structure of the Ti film/Cu film/$Gd_2O_3$ film/TiW film, the measured result of the insulating withstand voltage was approximately 4 MV/cm. Since the minimum voltage required by the memory device to operate as the memory is about 0.2V, it is to be understood that the sufficient film thickness of the memory thin film 4 should be approximately larger than 0.5 nm.

When the film thickness of the memory thin film 4 is large, for example, larger than 5 nm, a voltage necessary for the first recording is high as compared with a voltage necessary for the recording following the second recording so that a relatively high voltage pulse should be applied in the early stage, that is, the operation voltage should be stabilized by the initialization. These numerical values are merely standard numerical values and may be changed depending upon a film deposition method, a film deposition condition or a process method required when a storage apparatus is processed.

<Experiment 5>

Next, characteristics exhibited when an Ag film or a Zn film is used instead of the Cu film were checked.

Then, a TiW film having a film thickness of 20 nm was formed as the lower electrode 2, an Ag film or Zn film having a film thickness of 6 nm was formed on the TiW film, a $Ge_2Sb_2Te_5Gd$ film having a film thickness of 16 nm was formed on the Ag or Zn film and a TiW film having a film thickness of 100 nm was formed as the upper electrode 6. A composition of the memory thin film 4 was $(Ge_2Sb_2Te_5)_{88}Gd_{12}$.

Figure 13:
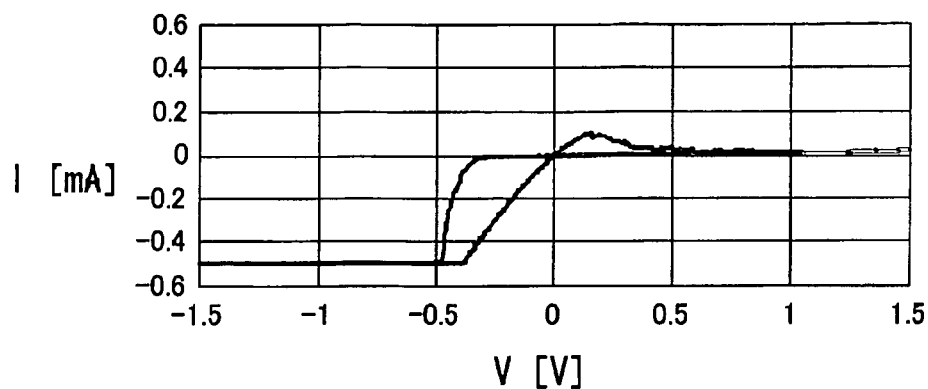
FIG. 13 is a graph showing measured results of I-V (current-to-voltage) characteristics of a sample 9.

Then, a memory device using an Ag film was used as a memory device of a sample 9, and a memory device using a Zn film was used as a memory device of a sample 10. I-V (current-to-voltage) characteristics of the respective memory devices of the samples 9 and 10 were measured. FIG. 13 shows measured results of the sample 9 and FIG. 14 shows measured results of the sample 10.

Figure 14:
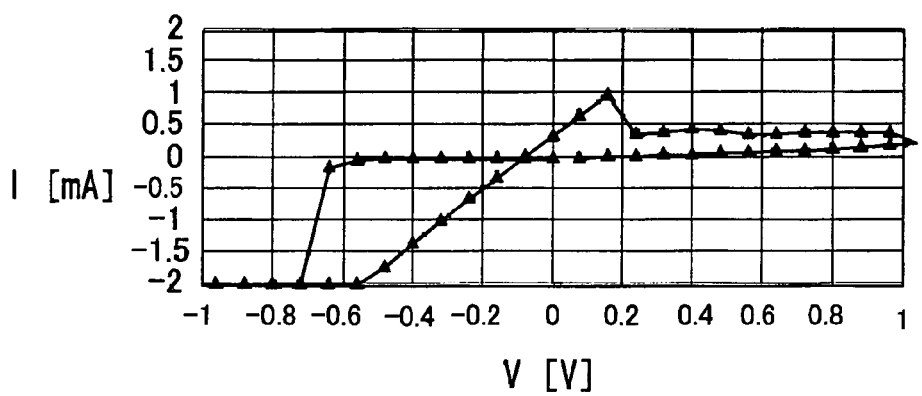
FIG. 14 is a graph showing measured results of I-V (current-to-voltage) characteristics of a sample 10.

A study of FIGS. 13 and 14 reveals that, when the memory devices use the Ag film or the Zn film the memory devices of the samples 9 and 10 can operate as the memories similarly to the memory devices using the Cu film (see FIGS. 8 to 12).

<Experiment 6>

Next, characteristics of memory devices in which other element were used as the rare earth elements contained in the memory thin film 4 instead of Gd were measured.

Then, a TiW film having a film thickness of 20 nm was formed as the lower electrode 2, a Cu film having a film thickness of 12 nm was formed on the TiW film, a film made of GeSbTe and rare earth elements was formed on the Cu film and further a TiW film having a film thickness of 100 nm was formed as the upper electrode 6.

Specific rare earth elements (kinds and adding ratios), film thicknesses and so on will be described below.

<Adding Ratios (Atomic %)>

| Sample Nos. | rare earth elements | $Ge_2Sb_2Te_8$ | film thickness |
|---|---|---|---|
| Sample 11 | Y, 13 | 87 | 20 nm |
| Sample 12 | Tb, 13 | 87 | 18 nm |
| Sample 13 | Tb, 20 | 80 | 18 nm |

Figure 15:
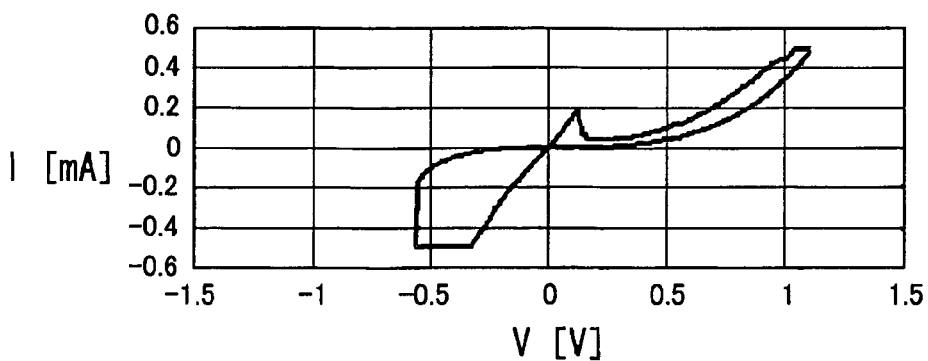
FIG. 15 is a graph showing measured results of I-V (current-to-voltage) characteristics of a sample 11.

I-V (current-to-voltage) characteristics of the memory devices of these samples 11 to 13 were measured. FIG. 15 shows measured results of the sample 11, FIG. 16 shows measured results of the sample 12 and FIG. 17 shows measured results of the sample 13.

Figure 16:
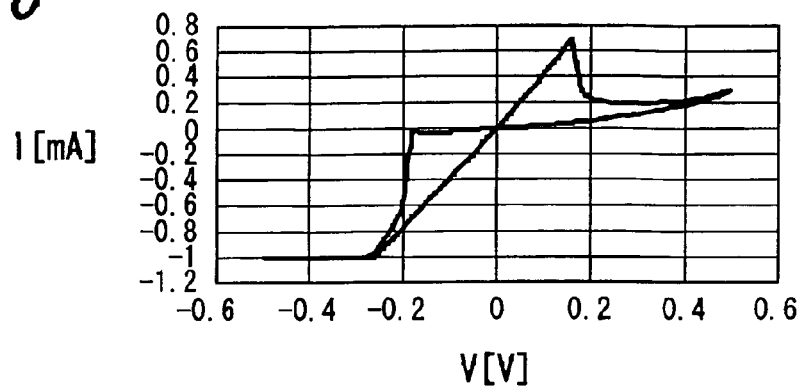
FIG. 16 is a graph showing measured results of I-V (current-to-voltage) characteristics of a sample 12.
Figure 17:
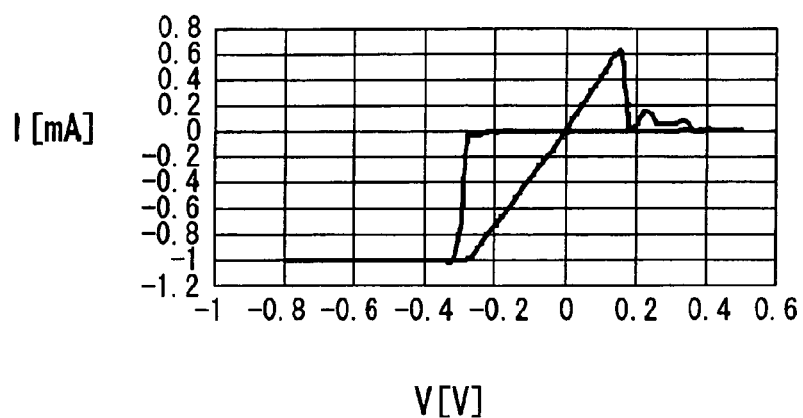
FIG. 17 is a graph showing measured results of I-V (current-to-voltage) characteristics of a sample 13.

As is clear from FIGS. 15 to 17, similarly to the memory devices using Gd as the rare earth element (see FIGS. 8 to 12), it was confirmed that any one of the memory devices of the samples 11 to 13 could be operated as the memory. Although there is considered a model in which the memory thin film 4 is formed, Cu, Ag, Zn and so on are diffused into the memory thin film 4 and moved or the rare earth elements are oxidized and reduced with application of the voltage pulse so that the memory device can be operated as the memory, in this case, the rare earth element plays the role of exhibiting insulating property in the thin film and operates stably relative to ion conduction or oxidation-reduction when information is repeatedly recorded or erased. Thus, contributions of the outermost shell electrons in the rare earth element are large.

The outermost shell electrons of the rare earth elements are similar. Since these oxides have insulating property and exhibit similar characteristics of chemical properties relative to oxidation, reduction and so on regardless of elements, any element can function similarly so long as the element is the rare earth element.

Also, when the memory thin film 4 is the amorphous thin film, since such amorphous thin film cannot be crystallized in the high temperature process, problems arise in the melting point of the rare earth element and the size of atom. In these points, a difference between the rare earth elements is small.

Accordingly, it is possible to use elements such as la, Nd, Sm, Eu, Dy, Ho, Er in addition to Gd, Y, Tb.

<Experiment 7>

An important parameter of the film thickness of the memory thin film 4 is a film thickness of the oxide thin film, and hence a film thickness of a portion which is not formed as the oxide thin film or a film thickness of a portion in which an oxygen concentration is low is not an important problem.

However, when the film thickness is too thin, it becomes difficult to stably control the film thickness of the oxide thin film formed on the surface or the oxygen concentration and the like. As a consequence, dispersions occur in individual memory devices.

Accordingly, a GeSbTeGdCu film, which contains Cu in advance, having a thin film thickness of 5 nm was formed as the memory thin film 4 and a memory device was manufactured by forming the oxide thin film in the manufacturing process. This resultant memory device was used as a memory device of a sample 14. The memory device of this sample 14 does not include the ion source layer 3 and the memory thin film 4 contains Cu. A composition of the memory thin film 4 was $(Ge_2Sb_2Te_5)_{50}Gd_{25}Cu_{25}$.

Also, a Cu film having a film thickness of 6 nm was formed and a GeSbTeGd film having a film thickness of 50 nm was formed on the Cu film, thereby resulting in a memory device being manufactured. This memory device was used as a memory device of a sample 15. A composition of the GeSbTeGd film was selected to be $(Ge_2Sb_2Te_8)_{89}Gd_{11}$.

Further, in the samples 14 and 15, with respect to the materials of other respective films, a TiW film having a film thickness of 20 nm was formed as the lower electrode 2 and a TiW film having a film thickness of 100 nm was formed as the upper electrode 6.

Figure 18:
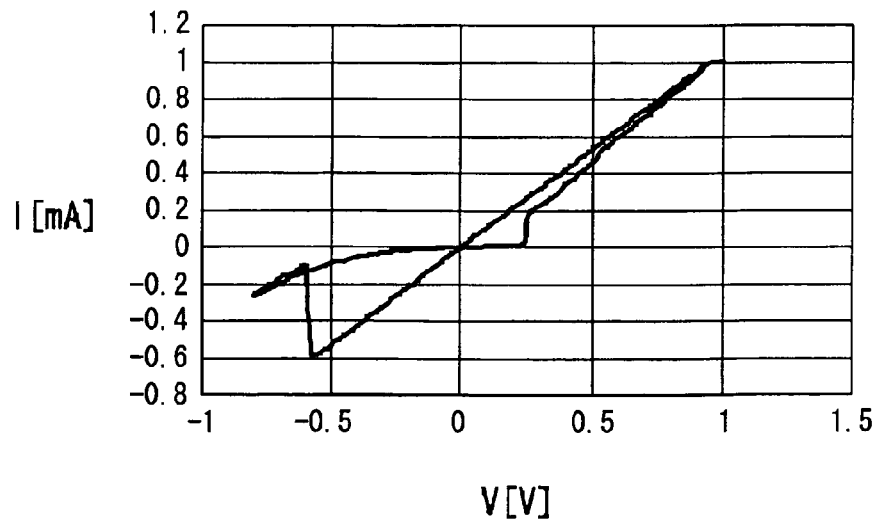
FIG. 18 is a graph showing measured results of I-V (current-to-voltage) characteristics of a sample 14.

Then, I-V (current-to-voltage) characteristics of the memory devices of the samples 14 and 15 were measured, respectively. FIG. 18 shows measured results of the sample 14 and FIG. 19 shows measured results of the sample 15.

From FIG. 18, it is to be understood that even the memory device of the sample 14 in which the film thickness of the memory thin film 4 is thin can be operated as the memory stably and that dispersions among the memory devices are very small. In the film thickness of 5 nm of the memory thin film 4, the film thickness ratio of Gd element is approximately larger than 30%. If all of this film thickness is oxidized, it becomes possible to form an oxide thin film having a film thickness larger than 1.5 nm. Since the film thickness is increased by oxidization in actual practice, it becomes possible to form an oxide thin film having a film thickness larger than 2 nm.

As described above, it is considered that, when the ratio of the rare earth element formed on the inside of the film or the surface of the film is sufficient to form an oxide thin film having a film thickness larger than 0.5 nm, the memory device can be operated as the memory.

Figure 19:
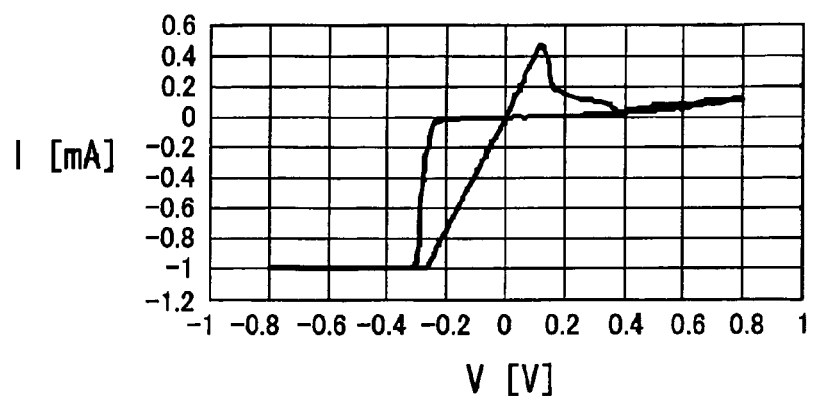
FIG. 19 is a graph showing measured results of I-V (current-to-voltage) characteristics of a sample 15.

Further, as is clear from FIG. 19, even the memory device of the sample 15 in which the film thickness of the memory thin film 4 does not produce a large difference in particular but it produces a result similar to that obtained by the memory device in which the film thickness of the memory thin film 4 is approximately 10 nm. The reason for this is may be considered such that the film thickness of the oxide thin film formed on the surface and the like do not depend on the thickness of the memory thin film 4 too much. Since the portion in which the oxide thin film is not formed is placed in the low resistance state, influences exerted upon the electric characteristics by the film thickness are in the negligible order as compared with those exerted by the oxide thin film.

As described above, from the measured results of the samples 14 and 15, it is to be understood that the memory devices can be operated as the memory stably when the film thickness of the memory thin film 4 lies in a range of from 0.5 nm to 10 nm.

When the elements such as Cu, Ag and Zn are contained in the memory thin film 4 in advance as described above, no problem arises. In this case, it becomes possible to reduce a time period of the film deposition process.

<Experiment 8>

Next, characteristics of the memory thin film 4 containing a large amount of Ge (germanium) were checked.

A TiW film having a film thickness of 20 nm was formed as the lower electrode 2, a Cu film having a film thickness of 12 nm was formed on the TiW film, a GeTeGd film having a film thickness of 20 nm was formed on the Cu film and further a TiW film having a film thickness of 100 nm was formed as the upper electrode 6.

Specific arrangements of the adding ratios (compositions) of Ge will be described below.

<Adding Ratios (Atomic %)>

| Sample Nos. | $Ge_XTe_YGd_Z$ |
| --- | --- |
| Sample 16 | 57, 34, 9 |
| Sample 17 | 65, 28, 7 |

Figure 20:
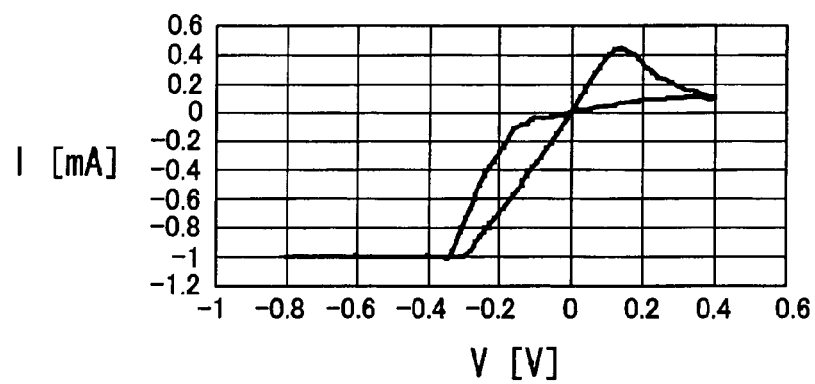
FIG. 20 is a graph showing measured results of I-V (current-to-voltage) characteristics of a sample 16.

I-V (current-to-voltage) characteristics of the respective memory devices of the samples 16 and 17 were measured. FIG. 20 shows measured results of the sample 16 and FIG. 21 shows measured results of the sample 17.

Ge can achieve the effects for maintaining the memory thin film 4 in the amorphous state. The single substance of Ge can make the memory thin film 4, formed by a sputtering method, become amorphous and can maintain the amorphous state of the memory thin film 4 stably relative to the high temperature process.

As shown in FIG. 20, it is to be understood that a memory device in which the memory thin film 4 contains 57 (atomic %) of Ge can be operated as the memory stably. At that time, the content of Te which is the chalcogenide element is 34 (atomic %) and the content of Gd which is the rare earth element is 9 (atomic %).

Figure 21:
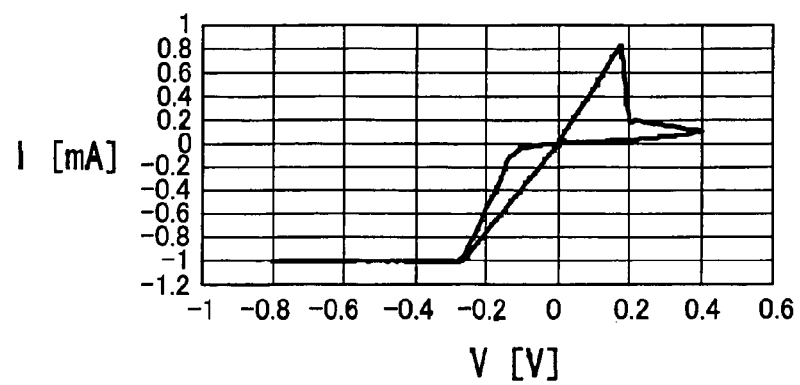
FIG. 21 is a graph showing measured results of I-V (current-to-voltage) characteristics of a sample 17.

Also, as shown in FIG. 21, it is to be understood that even a memory device in which the memory thin film 4 contains 65 (atomic %) of Ge can be operated as the memory stably. At that time, the content of Te which is the chalcogenide element is 28 (atomic %) and the content of Gd which is the rare earth element is 7 (atomic %).

<Experiment 9>

Figure 22:
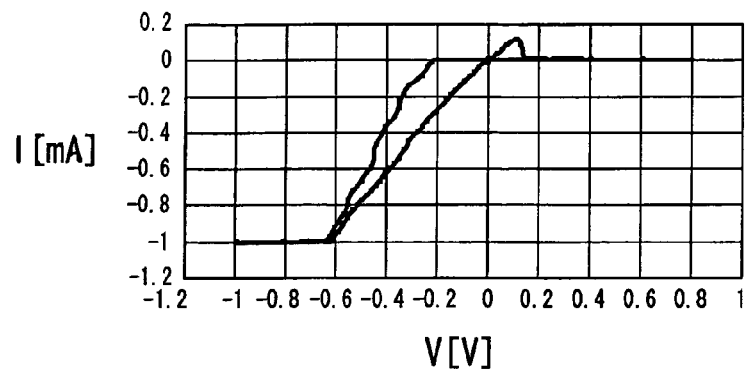
FIG. 22 is a graph showing measured results of I-V (current-to-voltage) characteristics of a sample 18.

Next, a memory device using Se (selenium) unlike the memory devices using Te (tellurium) as the chalcogenide element for use with the memory thin film 4 was manufactured as a sample 18, and characteristics of the memory device of this sample 18 were measured. FIG. 22 shows measured results of I-V (current-to-voltage) characteristics of the memory device of this sample 18.

Then, a TiW film having a film thickness of 20 nm was formed as the lower electrode 2, a Cu film having a film thickness of 6 nm was formed on the TiW film, a GeSeGd film having a film thickness of 20 nm was formed on the Cu film and a TiW film having a film thickness of 200 nm was formed as the upper electrode 6, thereby resulting in a memory device being manufactured.

Also, the composition of the GeSeGd film was selected to be $Ge_{35}Se_{55}Gd_{10}$.

As shown in FIG. 22, although even the memory device using Se as the chalcogenide element for use with the memory thin film 4 is operated similarly to the memory device using Te, if the sputtering method is used as the film deposition method, then since a melting point of Se is low as compared with Te, it is difficult to stabilize the sputtering rate by using a GeSe compound target as compared with the case in which Te us used as the chalcogenide element.

<Experiment 10>

Next, characteristics of the memory device using other metal film as the material of the upper electrode 6 instead of the TiW film were checked.

With respect to the materials of other respective films, a TiW film having a film thickness of 20 nm was formed as the lower electrode 2, a Cu film having a film thickness of 6 nm was formed on the TiW film and a $Ge_{30}Te_{56}Gd_{14}$ film having a film thickness of 20 nm was formed on the Cu film.

The upper electrode materials and specific arrangements of the film thicknesses will be described below.

| Sample Nos. | upper electrode material | film thickness |
|---|---|---|
| Sample 19 | W (tungsten) | 100 nm |
| Sample 20 | Pt (platinum) | 100 nm |

Figure 23:
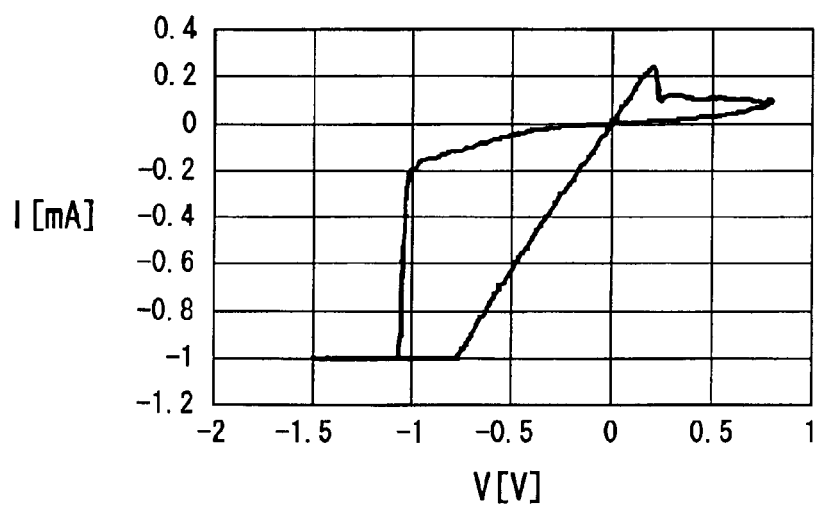
FIG. 23 is a graph showing measured results of I-V (current-to-voltage) characteristics of a sample 19.
Figure 24:
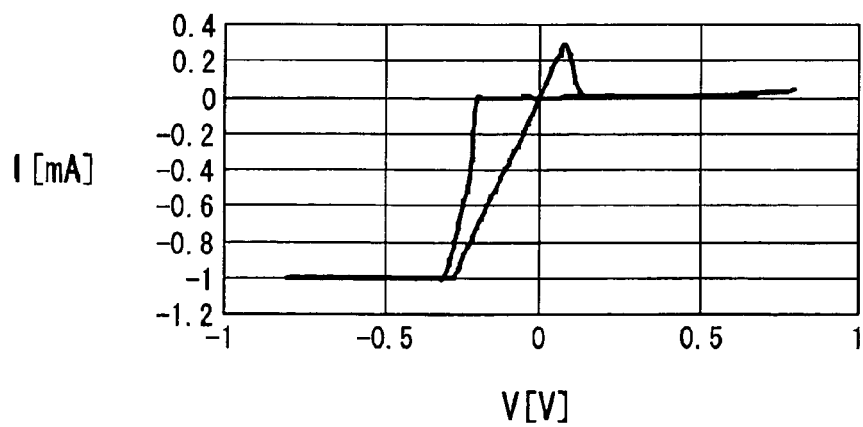
FIG. 24 is a graph showing measured results of I-V (current-to-voltage) characteristics of a sample 20.
Figure 25:
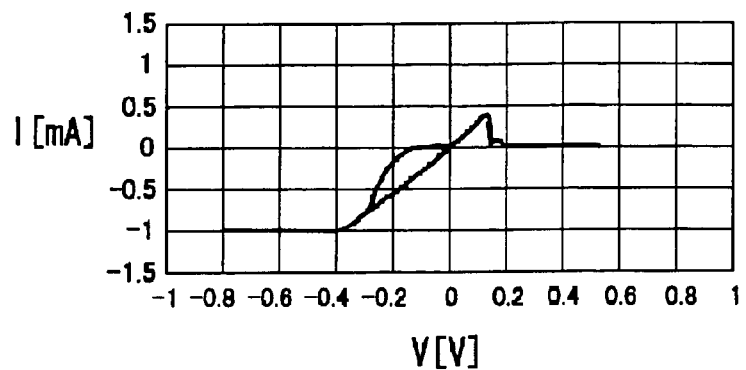
FIG. 25 is a graph showing measured results of I-V (current-to-voltage) characteristic of a sample 21.
Figure 26:
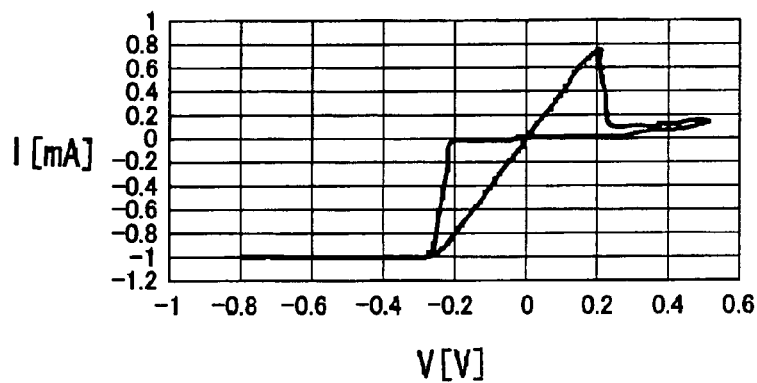
FIG. 26 is a graph showing measured results of I-V (current-to-voltage) characteristics of a sample 22.
Figure 27:
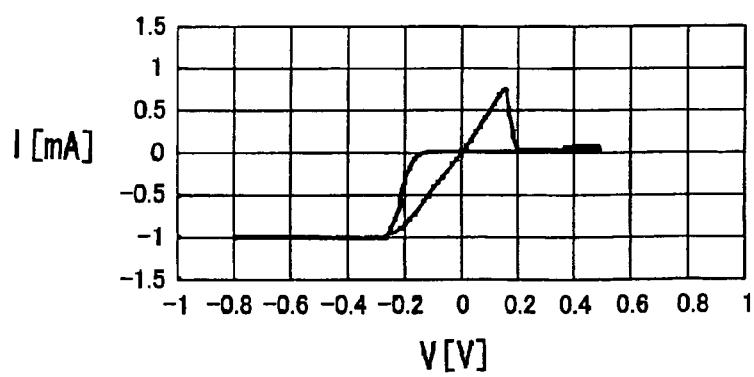
FIG. 27 is a graph showing measured results of I-V (current-to-voltage) characteristics of a sample 23.
Figure 28:
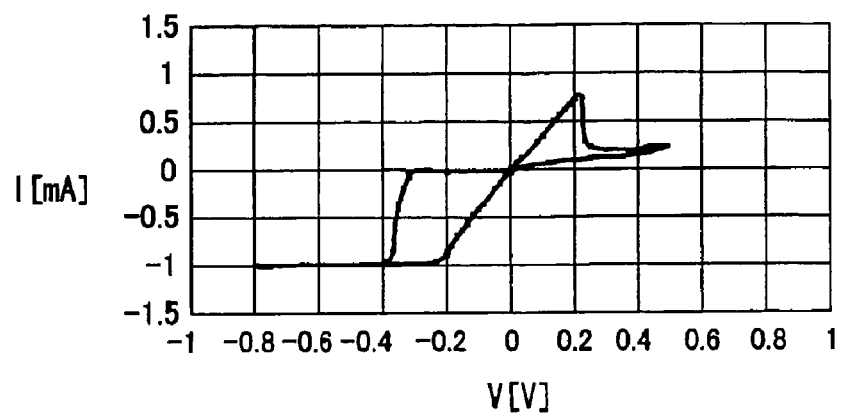
FIG. 28 is a graph showing measured results of I-V (current-to-voltage) characteristics of a sample 24.
Figure 29:
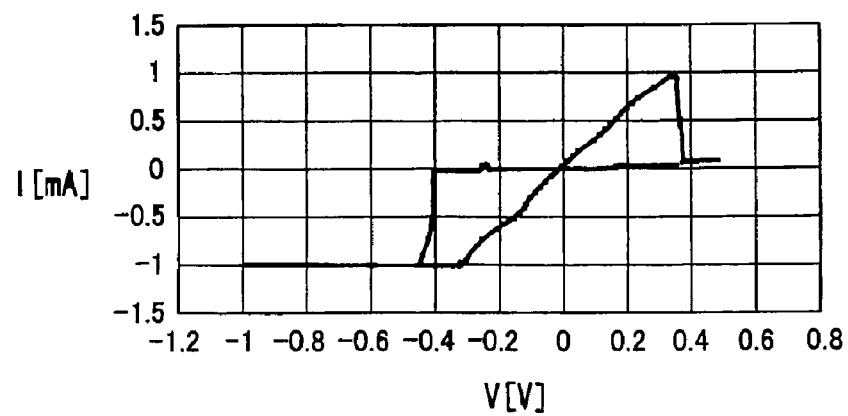
FIG. 29 is a graph showing measured results of I-V (current-to-voltage) characteristics of a sample 25.
Figure 30:
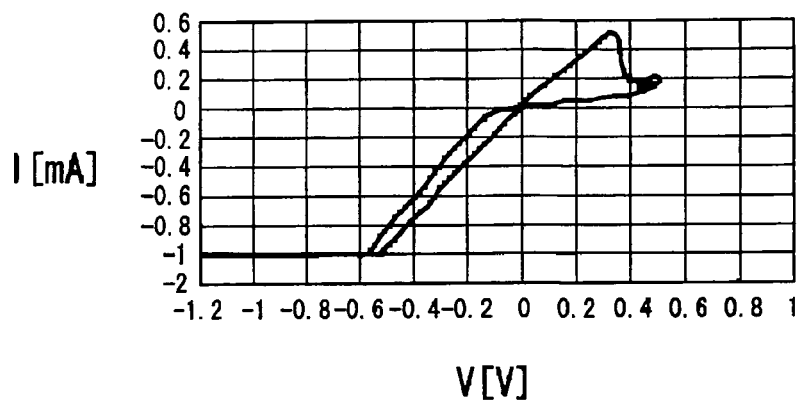
FIG. 30 is a graph showing measured results of I-V (current-to-voltage) characteristics of a sample 26.

FIGS. 23 and 24 show measured results of I-V (current-to-voltage) characteristics of the memory devices of the samples 19 and 20, respectively.

As shown in FIGS. 23 and 24, it is to be understood that even the memory devices using the W film or the Pt film as the upper electrode 6 can be operated as the memories similarly to the case of the memory device using the TiW film. However, since adhesion of the W film relative to the memory thin film 4 is weak, the W film has a tendency that its operation voltage will increase. The materials of the upper electrode 6 are not limited to the above materials and it is possible to use various kinds of materials such as metals such as Al, Au, Ni, Mo, Ta, silicide and various kinds of metal alloys.

In addition, the lower electrode 2 can be formed similarly to the case of the upper electrode 6.

<Experiment 11>

Next, characteristics of memory devices using CuTe (Ge, Si) Gd containing Cu and Te as the ion source layer 3 and in which the composition ratio of Cu and Te was changed were checked.

Further, the film thickness of the ion source layer 3 was selected to be 30 nm.

With respect to the materials of other respective layers, a tungsten nitride film WN film having a film thickness of 20 nm was formed as the lower electrode 2, a gadolinium oxide film having a film thickness of 4.0 nm was formed as the memory thin film 4 and a TiW film having a film thickness of 100 nm was formed as the upper electrode 6.

Specific compositions of the ion source layer 3 will be described below.

Sample 21: $(Cu_{40}Te_{60})_{67}Ge_{26}Gd_7$

Sample 22: $(Cu_{58}Te_{42})_{76}Ge_{18}Gd_6$

Sample 23: $(Cu_{68}Te_{32})_{79}Ge_{16}Gd_5$

Sample 24: $(Cu_{80}Te_{20})_{81}Ge_{14}Gd_5$

Sample 25: $(Cu_{75}Te_{25})_{60}Si_{37}Gd_3$

Sample 26: $(Cu_{35}Te_{65})_{61}Si_{33}Gd_6$

I-V (current-to-voltage) characteristics of the respective memory devices of these samples 21 to 25 were measured. FIGS. 25 to 31 show the measured results, respectively.

As shown in FIGS. 25 to 31, it was confirmed that any one of the samples 21 to 26 exhibited a thermal hysteresis and that any one of the samples 21 to 26 could be operated as the memory.

Accordingly, it is to be understood that any one of the samples 21 to 26 can be operated as the memory in a wide range of 35/65 to 80/20 of the Cu/Te composition of the ion source layer 3, that is, that any one of the samples 21 to 26 can record and erase information with application of the voltages with polarities corresponding to recording and erasing.

<Experiment 12>

A memory device in which the ion source layer 3 was made of the material similar to that of the experiment 11 and in which the lower electrode 2 is made of the Cu film was manufactured and this memory device was used as a memory device of a sample 27.

A film thickness of the Cu film of the lower electrode 2 was selected to be 20 nm.

Also, the composition of the ion source layer 3 was selected to be $(Cu_{53}Te_{47})_{74}Ge_{20}Gd_6$ and the film thickness thereof was selected to be 20 nm.

Materials and film thicknesses of other respective films were selected to be similar to those of the experiment 11.

Figure 31:
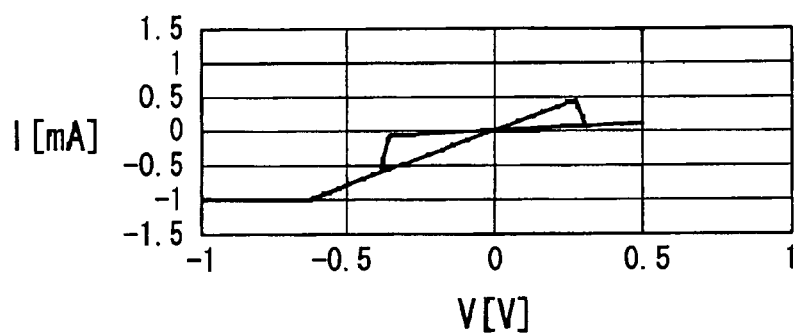
FIG. 31 is a graph showing measured results of I-V (current-to-voltage) characteristics of a sample 27.

Then, I-V (current-to-voltage) characteristics of the memory device of the sample 27 were measured. FIG. 31 shows the measured results.

From FIG. 31, it is clear that the memory device can be operated as the memory similarly even when the lower electrode 2 is made of the Cu film.

In this case, since both of the lower electrode 2 and the ion source layer 3 contain copper Cu, the copper has a composition gradient in the film thickness direction.

While the substrate 1 is comprised of the silicon substrate with a high conductivity and which is heavily doped with impurities and the ground potential (GND potential) is applied to the rear surface side of the substrate 1 in the respective memory devices of the above-mentioned embodiments, the arrangement for applying the voltage to the side of the lower electrode 2 is not limited to the above-mentioned arrangements and other arrangements can be used.

For example, it is possible to use an electrode formed on the surface of the silicon substrate 1 and which is electrically insulated from the silicon substrate 1.

Further, a semiconductor substrate other than the silicon substrate or an insulating substrate, for example, a substrate made of glass or resin may be used as the substrate 1.

Also, since the melting point of the memory thin film 4 which is the oxide of the rare earth elements used in the above-mentioned experiments 1 to 10 is higher than 2000° C. (values of the cited reference in the crystallized state and this will apply for the following descriptions as well), the oxide of the rare earth element is the material which is sufficiently stable thermally and whose crystallization temperature also is high.

While the memory thin film 4 has the arrangement in which it contains the oxide of the rare earth element in the above-mentioned embodiments, the present invention is not limited thereto and it is possible to construct the memory thin film 4 by using other insulating materials (for example, oxide and nitride).

As the oxide, there may be enumerated $SiO_2$, transition metal oxide and the like, for example, in addition to the oxide of the rare earth element.

Also, as the nitride, there may be enumerated silicon nitride SiN and nitride of rare earth element and so on.

When such memory thin film 4 uses the insulating material, the ion source layer 3 contains chalcogenide elements (S, Se, Te) and elements (Ag, Cu, Zn) serving as ion sources.

In particular, when the ion source layer 3 is made of a thin film such as a CuTe thin film containing Cu and Te, since Te is higher in conductivity than other chalcogenide elements so that the resistance change of the ion source layer 3 can be sufficiently decreased as compared with that of the memory thin film 4 by decreasing the resistance of the ion source layer 3, stability of the memory operation can be improved.

Then, it becomes possible to cause the ion source layer 3 to contain the rare earth elements by using the rare earth oxide and the above-mentioned other insulating materials.

According to the case of this arrangement, since the ion source layer 3 contains the rare earth elements, it is possible to suppress the crystallization of the ion source layer 3 by increasing the crystallization temperature of the ion source layer 3. As a consequence, since the ion source layer 3 can be formed uniformly and roughness of the surface of the ion source layer 3 can be suppressed, it becomes possible to form the memory thin film 4 uniformly. In addition, it is possible to suppress the characteristics of the memory device from being deteriorated due to a thermal hysteresis produced when the storage apparatus is preserved or the storage apparatus is in use.

Even when the memory thin film 4 is made of other insulating materials as described above, similarly to the case in which the memory thin film 4 is made of the rare earth oxide, the resistance value of the memory thin film 4 can be changed and hence the memory device can be operated as the memory.

Inventive Example

Next, the rare earth elements were contained in the ion source layer 3, the memory thin film 4 was made of the above-mentioned insulating materials, the memory device 10 having the structure shown in FIG. 1 was manufactured and characteristics of the memory device 10 were checked.

<Experiment 13>

Characteristics of the memory device 10 were measured in which case a tungsten nitride film WN film having a film thickness of 20 nm was used as the lower electrode 2, a CuTeGeGd film having a film thickness of 30 nm was used as the ion source layer 3, a silicon nitride Sin film (insulating material) having a film thickness of 2 nm was used as the memory thin film 4 and gold Au having a film thickness of 100 nm was used as the upper electrode 6, respectively.

The materials of the substrate 1 and the insulating layer 5 are similar to those of the aforementioned experiments 1 to 12. A value of a current limiter was selected to be 1 mA similarly to the experiment 2.

The composition of the CuTeGeGd film of the ion source layer 3 was selected to be $(Cu_{55}Te_{45})_{80}Ge_{10}Gd_{10}$.

Figure 32:
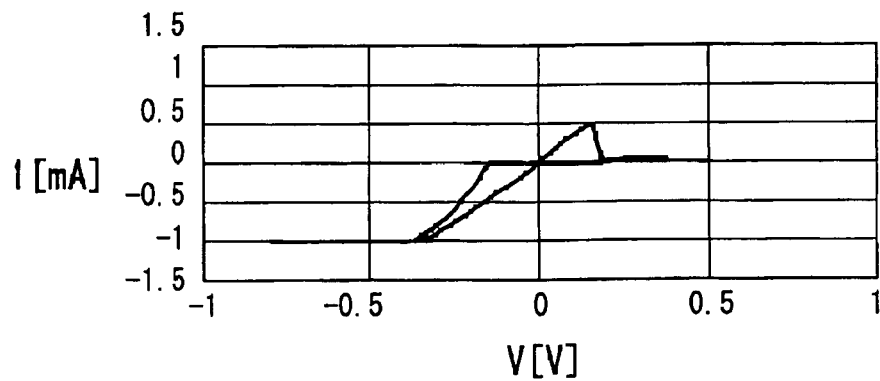
FIG. 32 is a graph showing measured results of I-V (current-to-voltage) characteristics of a sample 28.

The memory device having the above-mentioned structure was manufactured and used as a memory device of a sample 28. FIG. 32 shows the measured results of I-V (current-to-voltage) characteristics of the sample 28.

From FIG. 32, it is to be understood that even the sample 28 using the tungsten nitride of the insulating material as the memory thin film 4 can be operated as the memory similarly.

<Experiment 14>

Characteristics of a memory device in which case a gadolinium nitride GdN film having a film thickness of 20 nm was used as the memory thin film 4 and tungsten W having a film thickness of 100 nm was used as the upper electrode 6, respectively, were checked.

Other materials and the value of the current limiter were selected to be similar to those of the experiment 13.

The composition of the CuTeGeGd film of the ion source layer 3 was selected to be $(Cu_{55}Te_{45})_{82}Ge_{10}Gd_{8}$.

Figure 33:
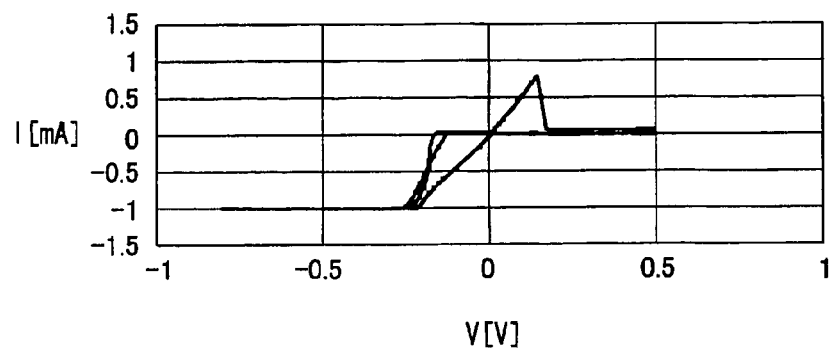
FIG. 33 is a graph showing measured results of I-V (current-to-voltage) characteristics of a sample 29.

The memory device having the above-mentioned structure was manufactured and used as a memory device of a sample 29. FIG. 33 shows measured results of I-V (current-to-voltage) characteristics of this sample 29.

From FIG. 33, it is to be understood that even the sample 29 using the gadolinium nitride of nitride as the memory thin film 4 can be operated as the memory similarly.

While the memory device had the arrangement in which the memory thin film 4 is formed on the ion source layer 3 in the above-mentioned embodiments, the present invention is not limited thereto. That is, the laminated layer relationship of these two layers may be reversed so that a memory device can be modified as a memory device 20 in which the ion source layer 3 is formed on the memory thin film 4 as shown in a cross-sectional view of FIG. 34.

Figure 34:
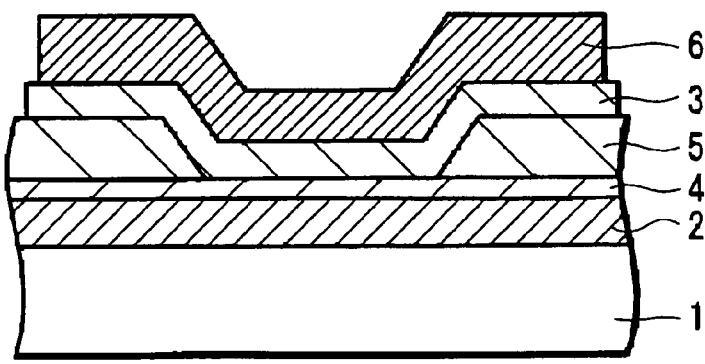
FIG. 34 is a schematic diagram (cross-sectional view) showing an arrangement of a memory device in which the laminated order of an ion source layer and a memory thin film is reversed.

The memory device 20 shown in FIG. 34 has the arrangement in which the memory thin film 4 is formed on the lower electrode 2, the ion source layer 3 is connected to the memory thin film 4 through a through-hole of the insulating layer 5 on the memory thin film 4 and the upper electrode 6 is formed on the ion source layer 3.

Next, the memory device 20 having the structure shown in FIG. 34 was manufactured in actual practice and characteristics thereof were checked.

<Experiment 15>

The memory thin film 4 was made of the insulating material and the memory device 20 having the structure shown in FIG. 34 was manufactured as follows.

First, a WN film having a film thickness of 20 nm was deposited on the ($P^{++}$) silicon substrate 1 which was doped by high-concentration P-type impurities as the lower electrode 2 and subsequently the memory thin film 4 was deposited. Next, there was formed an insulating layer 5 having a contact-hole by a hard-cure resist that had been treated by lithography and annealed at 280° C.

Next, a $(Cu_{55}Te_{45})_{73}Ge_7Si_{11}Gd_9$ film having a film thickness of 20 nm was deposited as the ion source layer 3 and a tungsten W film having a film thickness of 100 nm was deposited as the upper electrode 6, in that order. After that, according to the photolithography technique, the product was etched by using argon Ar gas in a reactive ion etching system and the memory device 20 was manufactured by patterning the ion source layer 3 and the upper electrode 6.

A memory device of a sample 30 was manufactured in which a silicon nitride SiN film having a film thickness of 2.5 nm was used as the memory thin film 4 and a memory device of a sample 31 was manufactured in which a gadolinium nitride GdN film having a film thickness of 2.8 nm was used as the memory thin film 4, respectively.

Figure 35:
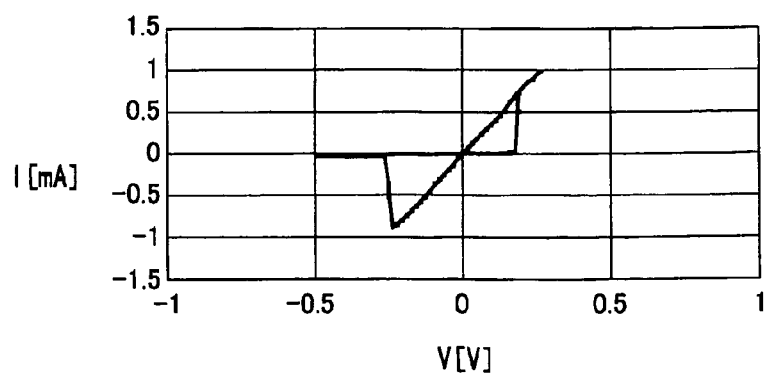
FIG. 35 is a graph showing measured results of I-V (current-to-voltage) characteristics of a sample 30.

I-V (current-to-voltage) characteristics of the memory device of the sample 30 and those of the memory device of the sample 31 were measured, respectively. FIG. 35 shows measured results of the sample 30 and FIG. 36 shows measured results of the sample 31, respectively.

Figure 36:
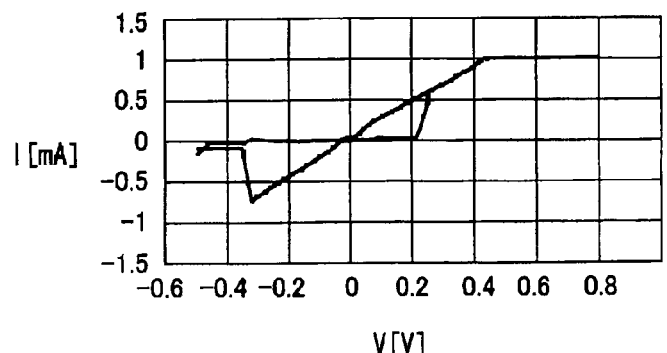
FIG. 36 is a graph showing measured results of I-V (current-to-voltage) characteristics of a sample 31.

In the I-V characteristic graphs of FIGS. 35 and 36, with respect to the polarity of the potential V, similarly to the aforementioned respective embodiments, the potential of the upper electrode 6 obtained when the lower electrode 2 is taken as the standard is represented in the horizontal axis. For this reason, polarities of recording (from high resistance to low resistance) operation and erasing (from low resistance to high resistance) operation are made opposite to those of the aforementioned respective embodiments. That is, recording was carried out at the negative (−) potential side and erasing was carried out at the positive (+) potential side.

From FIGS. 35 and 36, it is to be understood that even the samples in which the laminated order of the memory thin film 4 and the ion source layer 3 is made opposite to that of the aforementioned samples can be operated as the memories similarly.

Also, it is possible to construct the memory device without containing the rare earth element in any one of the ion source layer 3 and the memory thin film 4.

In this case, it is possible to relatively decrease the resistance value of the ion source layer 3 without containing the ion source layer 3 in the rare earth element.

Then, if the ion source layer 3 is made of the thin film containing, in particular, CuTe, since the ion source layer 3 can be formed as the ion source layer with the low resistance value, the memory thin film 4 can be made of not only the aforementioned insulating material but also a semiconductor material (for example, silicon or compound semiconductor). The reason for this is that, since the resistance value of the ion source layer 3 is decreased, even when the memory thin film 4 is made of the semiconductor material, the change of the resistance value of the memory device 10 is affected substantially by the change of the resistance value of the memory thin film 4.

<Experiment 16>

The memory device 10 having the structure shown in FIG. 1 was manufactured as follows, in which case the ion source layer 3 was made of the thin film containing CuTe, the memory thin film 4 was made of the insulating material and the ion source layer 3 and the memory thin film 4 did not contain the rare earth element.

Then, the characteristics of the memory device were checked in the state in which a tungsten nitride WN film having a film thickness of 50 nm was used as the lower electrode 2, a CuTeSiGe film having a film thickness of 25 nm was used as the ion source layer 3, the silicon oxide $SiO_2$ film (insulating material) having a film thickness of 5 nm was used as the memory thin film 4 and a WN film having a film thickness of 100 nm was used as the upper electrode 6, respectively.

The materials of the substrate 1 and the insulating layer 5 are similar to those of the aforementioned experiments 1 to 12. The value of the current limiter was selected to be 1 mA similarly to the experiment 2.

Figure 37:
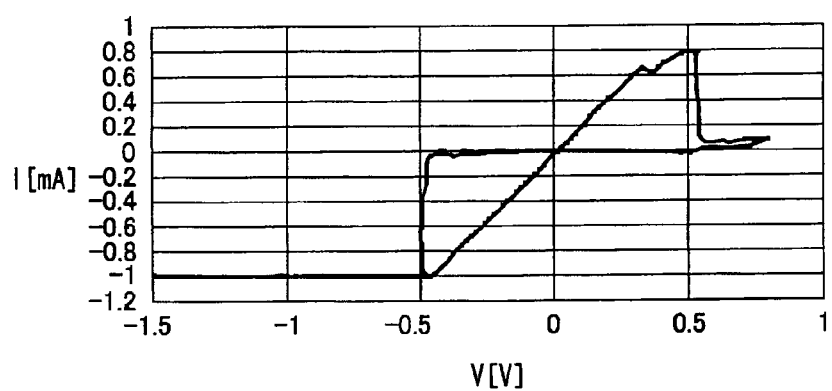
FIG. 37 is a graph showing measured results of I-V (current-to-voltage) characteristics of a sample 32.

The memory device having the above-mentioned structure was manufactured and used as a memory device of a sample 32. FIG. 37 shows measured results of I-V (current-to-voltage) characteristics of this sample 32.

From FIG. 37, it is to be understood that the sample 32 which does not contain the rare earth elements in the ion source layer 3 and the memory thin film 4 can be operated as the memory similarly.

<Experiment 17>

The memory device 10 having the structure shown in FIG. 1 in which the ion source layer 3 was formed of a thin film containing CuTe, the memory thin film 4 was made of a semiconductor material and the ion source layer 3 and the memory thin film 4 did not contain rare earth elements was manufactured as follows.

Characteristics of a memory device in which a tungsten nitride WN film having a film thickness of 50 nm was used as the lower electrode 2, a CuTeSiGe film having a film thickness of 25 nm was used as the ion source layer 3, a silicon Si film (semiconductor material) having a film thickness of 7 nm was used as the memory thin film 4 and a WN film having a film thickness of 100 nm was used as the upper electrode 6, respectively, were checked.

Materials of the substrate 1 and the insulating layer 5 were similar to those of the aforementioned experiments 1 to 12. A value of the current limiter was selected to be 1 mA similarly to the experiment 2.

A composition of the CuTeSiGe film of the ion source layer 3 was selected to be $Cu_{42}Te_{25}Si_{27}Ge_6$.

Figure 38:
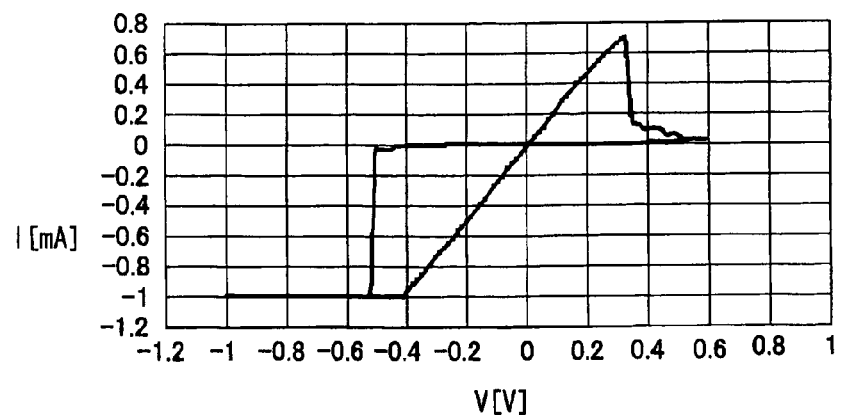
FIG. 38 is a graph showing measured results of I-V (current-to-voltage) characteristics of a sample 33.

The memory device having the above-mentioned structure was manufactured and used as a memory device of a sample 33. FIG. 38 shows measured results of I-V (current-to-voltage) characteristics of this sample 33.

From FIG. 38, it is to be understood that the sample 33 using the semiconductor material as the memory thin film and which does not contain the rare earth elements in the ion source layer 3 and the memory thin film can be operated as the memory similarly.

Figure 39:
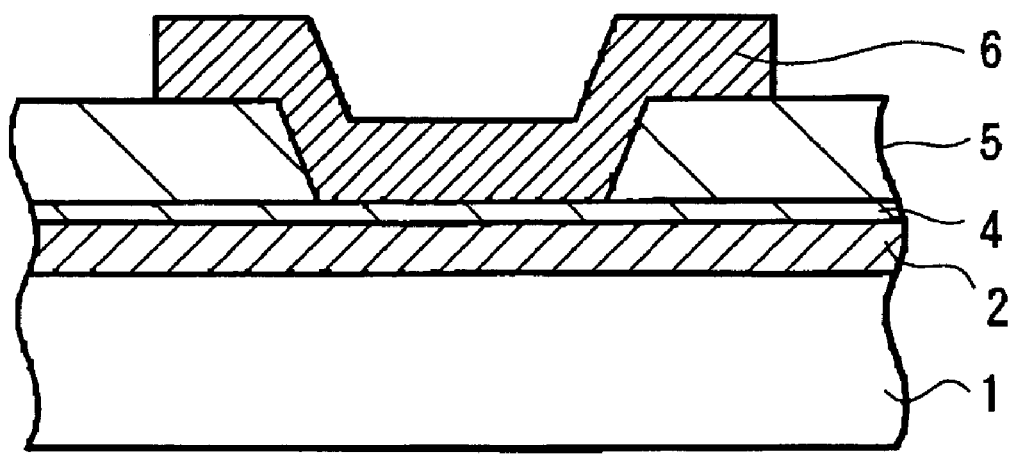
FIG. 39 is a schematic diagram (cross-sectional view) showing an arrangement of a memory device according to other embodiment of the present invention.

Next, FIG. 39 shows a schematic construction diagram (cross-sectional view) of a memory device according to other embodiment of the present invention.

A memory device 30 includes a substrate 1 with a high conductivity, for example, a ($P^{++}$) silicon substrate 1 doped with P-type high concentration impurities, a lower electrode 2 formed on this silicon substrate 1, a memory thin film 4 formed on this upper electrode 2 and an upper electrode 6 connected to the memory thin film 4 through a through-hole formed on an insulating layer 5 on the memory thin film 4.

More specifically, in this memory device 10, the ion source layer 3 of the memory device 10 shown in FIG. 1 is removed and the memory thin film 4 is directly formed on the lower electrode 2. Then, instead of the ion source layer 3 of the memory device 10 shown in FIG. 1, the memory thin film 4 contains a metal element which serves as the ion source.

The memory thin film 4 contains any one of element (chalcogenide element) selected at least Te, S, Se and any one of metal elements (aforementioned ion source) selected from Cu, Ag, Zn.

These metal elements (Cu, Ag, Zn) and chalcogenide elements (Te, S, Se) within the memory thin film 4 are bonded to form a metal chalcogenide layer on the lower portion, for example, of the memory thin film. This metal chalcogenide layer includes mainly the amorphous structure and plays the role of an ion conductor.

More preferably, the memory thin film 4 should further contain one kind or a plurality of kinds of rare earth elements selected from La, Ce, Pr. Nd, Sm, Eu, Gd, Tb, Dy, Ho, Er, Yb, Y of the rare earth elements and oxygen.

Also, although the composition of the oxygen in this memory thin film 4 generally forms a composition of $RE_2O_3$ relative to the rare earth element (RE), since the memory thin film 4 is the amorphous film and it is sufficient that the memory thin film 4 has electric properties less than the conductivity of the semiconductor region, the composition of the oxygen in the memory thin film 4 is not limited to the above-mentioned composition and may be selected to be $REO_x$ ($0.5 < x \leq 1.5$).

Also, this memory thin film 4 may contain in advance elements other than the rare earth element, such as Ge, Si, Te, S, Se, Sb, Ti, W, Cu, Ag, Zn, Fe, Co, P, N, H.

Further, in the memory thin film 4, when any one of the composition ratios of at least the composition ratio of the rare earth element and the oxygen, the composition ratio of the rare earth element and the element (metal element) selected from Cu, Ag, Zn and the composition ratio of the rare earth element and the element (chalcogenide element) selected from Te, S, Se has the composition gradient in the film thickness direction, as compared with the case in which the memory thin film 4 has the interface in which the composition is changed discontinuously, it becomes possible to form a film that is insensible to the interface state and there is then the advantage that the process in the mass-production can be facilitated.

The memory thin film 4 made of the above-mentioned materials has a characteristic in which impedance (resistance value) is changed with application of a voltage pulse or a current pulse.

The insulating material 5 may be made of a photoresist that was treated by a hard-cure process, $SiO_2$ and $Si_3N_4$ generally used in semiconductor devices, other materials such as inorganic materials, fluorinated organic materials and aromatic organic materials such as SiON, SiOF, $Al_2O_3$, $Ta_2O_5$, $HfO_2$, $ZrO_2$.

In the memory device 30 according to this embodiment, in particular, the lower electrode 2 serving as the underlayer of the memory thin film 4 is made of an amorphous material.

As an amorphous material for use with this lower electrode 2, there may be used an amorphous metal nitride such as amorphous WN (tungsten nitride).

If the lower electrode 2 serving as the underlayer of the memory thin film 4 is made of the amorphous material as described above, as will be described in detail later, there is then the advantage that dispersions of a recording voltage can be decreased so that information can be recorded and erased stably.

While the upper electrode 6 is generally made of an interconnection material (amorphous material in this embodiment); similar to that of the lower electrode 2, it is possible to use an interconnection material different from that of the lower electrode 2.

That is, as the material of the upper electrode 6, it is possible to use an interconnection material for use with a semiconductor process, for example, TiW, Ti, W, Cu, Al, Mo, Ta, silicide and the like. Also, it is possible to use a crystal interconnection material.

The memory device 30 according to the embodiment of the present invention shown in FIG. 39 can be operated to store information as follows.

First, a positive potential (+potential) is applied to the side of the lower electrode 2 adjoining the aforementioned chalcogenide layer and the positive voltage is applied to the memory device 30 such that the side of the upper electrode 6 is set to the negative side. As a result, the metal elements (Cu, Ag, Zn) contained in the chalcogenide layer on the side of the lower electrode 2 of the memory thin film 4 are ionized, diffused into the memory thin film 4, bonded to electrons on the side of the upper electrode 6 and thereby deposited or left in the state in which they are diffused into the memory thin film 4.

Then, a current path containing a large amount of Cu, Ag, Zn is formed within the memory thin film 4 or a large number of defects based on Cu, Ag, Zn are formed within the memory thin film 4, whereby the resistance value of the memory thin film 4 is decreased. Since respective layers other than the memory thin film 4 are inherently low in resistance value as compared with the resistance value obtained before information is recorded on the memory thin film 4, it is possible to decrease the resistance value of the whole of the memory device 30 by decreasing the resistance value of the memory thin film 4.

After that, if the voltage applied to the memory device 30 is removed by eliminating the positive voltage, then information is stored in the state in which the resistance value is decreased. As a consequence, it becomes possible to record information. When the storage apparatus according to the present invention is applied to the storage apparatus in which information can be recorded only once, that is, so-called PROM, recording is completed by only the above-described recording process.

On the other hand, when the storage apparatus according to the present invention is applied to a storage apparatus in which information can be erased, that is, so-called RAM or EEPROM and the like, the erasing process is required. In the erasing process, a negative potential (−potential), for example, is applied to the lower electrode 2 and a negative voltage is applied to the memory device 30 such that the side of the upper electrode 6 is set to the positive state. As a result, the current path formed within the memory thin film 4 or Cu, Ag, Zn comprising the impurity interface are again ionized, moved through the memory thin film 4 and returned to the metal chalcogenide layer on the side of the lower electrode 2.

Then, the current path or defects caused by Cu, Ag, Zn are lost from the inside of the memory thin film 4 so that the resistance value of the memory thin film 4 is increased. Since the resistance values of the respective layers other than the memory thin film 4 are low inherently, it is possible to increase the resistance value of the whole of the memory device 30 by increasing the resistance value of the memory thin film 4.

After that, if the negative voltage is eliminated to remove the voltage applied to the memory device 30, then the state in which the resistance value is high is held. As a consequence, it becomes possible to erase recorded information.

It is possible to record (write) information on the memory device 30 and to erase recorded information from the memory device 30 by repeating the above-mentioned processes.

Then, when the state in which the resistance value is high is made corresponding to information of "0" and the state in which the resistance value is low is made corresponding to information of "1", information of "0" can be changed to information of "1" in the process in which information is recorded with application of the positive voltage and information of "1" can be changed to information of "0" in the process in which information is erased with application of the negative voltage.

Although it is customary that the memory thin film 4 presents a high resistance value in the initial state before recording, the memory thin film 4 may present a low resistance value in the initial recording state.

A resistance value obtained after recording depends on recording conditions such as the width of the voltage pulse or current pulse applied upon recording or a current amount rather than the cell size of the memory device 30 and the material composition of the memory thin film 4 and this resistance value falls within a range of from 50 Ω to 50 kΩ when the initial resistance value is higher than 100 kΩ.

Since it is sufficient that a ratio between the initial resistance value and the resistance value obtained after recording is approximately larger than twice in order to demodulate recorded data, it is sufficient that the resistance value obtained before recording may be 100 Ω and the resistance value obtained after recording may be 50 Ω or that the resistance value obtained before recording may be 100 kΩ or the resistance value obtained after recording may be 50 kΩ. Hence, the initial resistance value of the memory thin film 4 may be set so as to satisfy the above-mentioned conditions. It is possible to adjust the resistance value of the memory thin film 4 by adjusting an oxygen concentration, a film thickness, an area and further by addition of an impurity material.

The memory device 30 shown in FIG. 39 can be manufactured as follows, for example.

First, a lower electrode 2, for example, an amorphous WN film is deposited on a substrate 1 with a high conductivity, for example, a silicon substrate which was doped with high concentration P-type impurities.

Next, a laminated film of a Cu film and a GeTeGd film, for example, is deposited on the lower electrode 2 as the memory thin film 4 by a sputtering method.

Next, an insulating layer 5 is formed so as cover the memory thin film 4.

Further, part of the insulating layer 5 is removed by photolithography to form a contact portion to the memory thin film 4. Subsequently, the resultant product is processed by a heat treatment according to the necessity. By this heat treatment, elements such as Te and Cu can be diffused within the memory thin film and rare earth elements such as Gd can be oxidized by introducing oxygen into the memory thin film 4.

Next, the WN film, for example, was deposited as the upper electrode 6 and then this WN film was treated by patterning.

In this manner, the memory device 30 shown in FIG. 39 can be manufactured.

According to the arrangement of the memory device 30 of the above-mentioned embodiment, since the memory thin film 4 containing Cu, Ag, Zn is sandwiched between the lower electrode 2 and the upper electrode 2, when the side of the upper electrode 6 is set to the negative state with application of the positive voltage (+potential) to the side of the lower electrode 2, the current path containing a large amount of Cu, Ag, Zn is formed within the memory thin film 4 or a large number of defects based on Cu, Ag, Zn are formed within the memory thin film 4, whereby the resistance value of the memory thin film 4 is decreased and the resistance value of the whole of the memory device 30 is decreased. Then, when the application of the positive voltage is stopped so that the voltage may not be applied to the memory device 30, the state in which the resistance value is high is held and it becomes possible to record information. The above-mentioned arrangement can be used in the storage apparatus such as PROM in which information can be recorded only once.

Then, since information is recorded on the memory device 30 by using the change of the resistance value of the memory device 30, in particular, the change of the resistance value of the memory thin film 4, even when the memory device 30 is microminiaturized, it becomes easy to record information and to store recorded information.

Also, when the above-mentioned arrangement is used in the storage apparatus such as RAM and EEPROM in which information can be erased as well as recorded, the side of the upper electrode 6 is set to the positive state with application of the negative voltage (−potential) to the lower electrode 2, for example. As a result, the current path or the defects formed within the memory thin film 4 by Cu, Ag, Zn are vanished so that the resistance value of the memory thin film 4 is increased, thereby resulting in the resistance value of the whole of the memory device 30 being increased. Then, when application of the voltage to the memory device 30 is stopped by stopping the application of the negative voltage, the state in which the resistance value is high is held and hence it becomes possible to erase recorded information.

Also, according to the memory device 30 of this embodiment, any one of the lower electrode 2, the memory thin film 4 and the upper electrode 6 can be made of materials that can be treated by sputtering. For example, the sputtering may be carried out by using a target comprising the composition adapted to the materials of the respective layers.

Further, it becomes possible to continuously deposit the layers within the same sputtering apparatus by exchanging the targets.

Also, according to the arrangement of the memory device 30 of this embodiment, in particular, since the lower electrode 2 serving as the underlayer of the memory thin film 4 is made of the amorphous material, the memory thin film 4 formed on the lower electrode 2 can be formed as the uniform amorphous structure (without crystallized portion), whereby the interface between the memory thin film 4 and the upper electrode 6 on the memory thin film 4 can be formed flat.

As described above, when the interface between the memory thin film 4 and the upper electrode 6 on the memory thin film 4 becomes flat, a distribution of electric field within the memory thin film 4 becomes uniform so that dispersions on a switching voltage required to switch the high resistance state to the low resistance state can be decreased, thereby making the switching voltage become a uniform value relative to the repeated recording/erasing.

Accordingly, it is possible to realize the memory device in which dispersions of the switching voltage are decreased and which can be operated stably.

Further, when the memory thin film 4 contains one kind or a plurality of kinds of rare earth elements selected from La, Ce, Pr, Nd, Sm, Eu, Gd, Tb, Dy, Ho, Er, Yb, Y of the rare earth elements and oxygen, since the rare earth oxide is formed and the memory thin film 4 becomes stable thermally, information can stably be recorded with application of a very small current.

Also, owing to the actions of the rare earth elements, the crystallization temperatures of Te, S, Se (chalcogenide elements) can be increased and hence the chalcogenide elements can be suppressed from being crystallized under high temperature circumstance.

Accordingly, under high temperature circumstance and even when the storage apparatus is preserved during a long time period, recorded contents can be stored stably.

Since unstable factors such as dispersions of the switching voltage are abnormal growth of (Cu, Ag, Zn)+(Te, S, Se) materials in CuTe or the like on the underlayer made of the crystal material, even when the memory thin film does not contain rare earth elements, there arises a similar problem.

More specifically, even when the memory thin film 4 does not contain rare earth elements, it is possible to suppress the switching voltage from being dispersed and to improve stability of the memory device 30 by making the underlayer material have the amorphous structure.

Also in the memory device having the arrangement in which the aforementioned memory thin film 4 is made of the insulating material (for example, oxide film, nitride film, etc.) and in which the ion source layer 3 is provided independently of the memory thin film 4, it is possible to suppress the ion source layer 3 from being crystallized by making the underlayer material have the amorphous structure. As a result, there can be achieved effects for decreasing dispersions of the device characteristics such as the switching voltage.

Then, in the memory devices having various kinds of the aforementioned arrangements (materials of the memory thin film 4, existence of the ion source layer 3, materials of the ion source layer 3, etc.), it is possible to improve stability of the memory device by making the underlayer structure of the memory thin film 4 have the amorphous structure.

A storage apparatus can be constructed by disposing a large number of the memory devices 30 according to the above-mentioned embodiment in a matrix fashion.

Each memory device 30 may have an interconnection connected to the side of the lower electrode 2 and an interconnection connected to the side of the upper electrode 6, and each memory device 30 may be located near the intersection of these interconnections, for example.

More specifically, the lower electrode 2, for example, is made common to the memory cells in the row directions, the interconnection connected to the upper electrode 6 is made common to the memory cells in the column directions, the lower electrode 2 and the interconnection through which a current flows with application of the potential are selected, the memory cell to be recorded is selected and the current is caused to flow through the memory device 30 of this memory cell, whereby information can be recorded and recorded information can be erased.

Then, the memory device 30 according to the above-mentioned embodiment can easily record information and read out recorded information and has excellent characteristics, in particular, in stability with which data is held under high temperature circumstance during a long time period.

Also, even when the memory device 30 according to the above-mentioned embodiment is microminiaturized, it becomes easy to record information and to hold recorded information.

Accordingly, the storage apparatus is constructed by using the memory device 30 according to the above-mentioned embodiment, whereby the storage apparatus can be integrated (increased in density) and miniaturized.

Even when the crystal material is used as the underlayer material of the memory thin film 4, a crystal grain size can be decreased and the aforementioned abnormal growth can be suppressed by controlling the compositions and film-deposition conditions of the ion source layer 3 and the memory thin film 4.

Therefore, a problem does not always arise when the crystal material is used as the underlayer material of the memory thin film 4.

On the other hand, when the amorphous material is used as the underlayer material of the memory thin film 4 as described above, there are advantages in which stability of the memory device can easily be improved and in which restrictions on the compositions and the film-deposition conditions are small.

Inventive Example

Next, the memory device 30 according to the above-mentioned embodiment and the memory device using the crystal material as the underlayer were manufactured respectively and characteristics were checked.

<Experiment 18>

First, a memory device similar to the memory device 20 having the structure shown in FIG. 39 was manufactured by using a TiW film having a body-centered cubic lattice structure as the lower electrode 2 serving as the underlayer of the memory thin film 4.

A TiW film having a film thickness of 20 nm was deposited on the silicon substrate as the lower electrode 2 serving as the memory thin film 4 by sputtering.

Subsequently, a Cu film having a film thickness of 8 nm was formed by a magnetron sputtering system and a GeTeGd film having a film thickness of 20 nm was formed by a sputtering method introducing an Ar gas, thereby forming a laminated film serving as the memory thin film 4.

Next, a photoresist was formed so as to form the laminated film, whereafter the photoresist was exposed and developed by a photolithography technique to thereby form a through-hole on the photoresist on the laminated film. The through-hole is 2 μm long and 2 μm wide.

After that, the photoresist was changed in quality by the heat treatment at 280° C. in vacuo and an insulating layer 5 as formed as a hard-cure resist which is stable against temperature, etching and so on. This heat treatment achieves the effect to place the structure within the memory thin film 4 in the thermal equilibrium state to form a stable layer structure and the effect to introduce an oxygen element into the memory thin film 4 to form a rare earth oxide layer in addition to the effect to cure the photoresist. The reason that the insulating layer 5 is made of the hard-cure resist is that the insulating layer 5 can easily be formed by the hard-cure resist from an experiment standpoint. When a product is manufactured in actual practice, it is preferable that the insulating layer 5 should be made of other material (silicon oxide film, etc.).

Next, a TiW film having a film thickness of 10 nm was deposited as the upper electrode 6. After that, the upper electrode 6 that has been deposited on the insulating layer 5 made of the hard-cure resist was patterned with a size of 50 μm×50 μm by using a plasma etching apparatus according to the photolithography technique.

The memory device having the above-mentioned structure was manufactured and used as a memory device of a sample 34.

Next, the lower electrode 2 serving as the underlayer of the memory thin film 4 was made of tungsten nitride WN having the amorphous structure and the memory device 30 having the structure shown in FIG. 39 was manufactured.

A WN film having a film thickness of 25 nm was deposited on the silicon substrate as the lower electrode 2 serving as the underlayer of the memory thin film by sputtering. At that time, it is possible to form an amorphous WN film by controlling sputtering conditions.

Subsequently, a Cu film having a film thickness of 8 nm was formed by using a magnetron sputtering apparatus and a GeTeGd film having a film thickness of 20 nm was formed by a sputtering method introducing an Ar gas, thereby forming a laminated film which serves as the memory thin film 4.

Next, a photoresist was formed so as to cover the laminated film and then a through-hole was formed on the photoresist on the laminated film by exposure and development according to the photolithography technique. This through-hole was 2 μm long and 2 μm wide.

After that, the photoresist was changed in quality by the heat treatment at 270° C. in vacuo to form the film of the insulating layer 5 as the hard-cure resist which is stable against temperature, etching and so on. This heat treatment achieves the effect to place the structure within the memory thin film 4 in the thermal equilibrium state to form a stable layer structure and the effect to introduce an oxygen element into the memory thin film 4 to form a rare earth oxide layer in addition to the effect to cure the photoresist. The reason that the insulating layer 5 is made of the hard-cure resist is that the insulating layer 5 can easily be formed by the hard-cure resist from an experiment standpoint. When a product is manufactured in actual practice, it is preferable that the insulating layer 5 should be made of other material (silicon oxide film, etc.).

Next, a WN film having a film thickness of 15 nm was deposited as the upper electrode 6. After that, the upper electrode 6 that has been deposited on the insulating layer 5 made of the hard-cure resist was patterned with a size of 50 μm×50 μm by using the plasma etching apparatus. The memory device 30 having the above-mentioned structure was manufactured and used as a memory device 30 of a sample 35.

The memory device 30 of the sample 35 was composition-analyzed in the depth direction by using an Auger electron spectroscopy (AES) method. When the memory device 30 of the sample 35 was composition-analyzed in the depth direction, Ar ions were irradiated from the side of the upper electrode 6 of the memory device 30 to cut the surface of the memory device 30 owing to the sputtering effect and the topmost surface was composition-analyzed by the AES method.

Figure 40A:
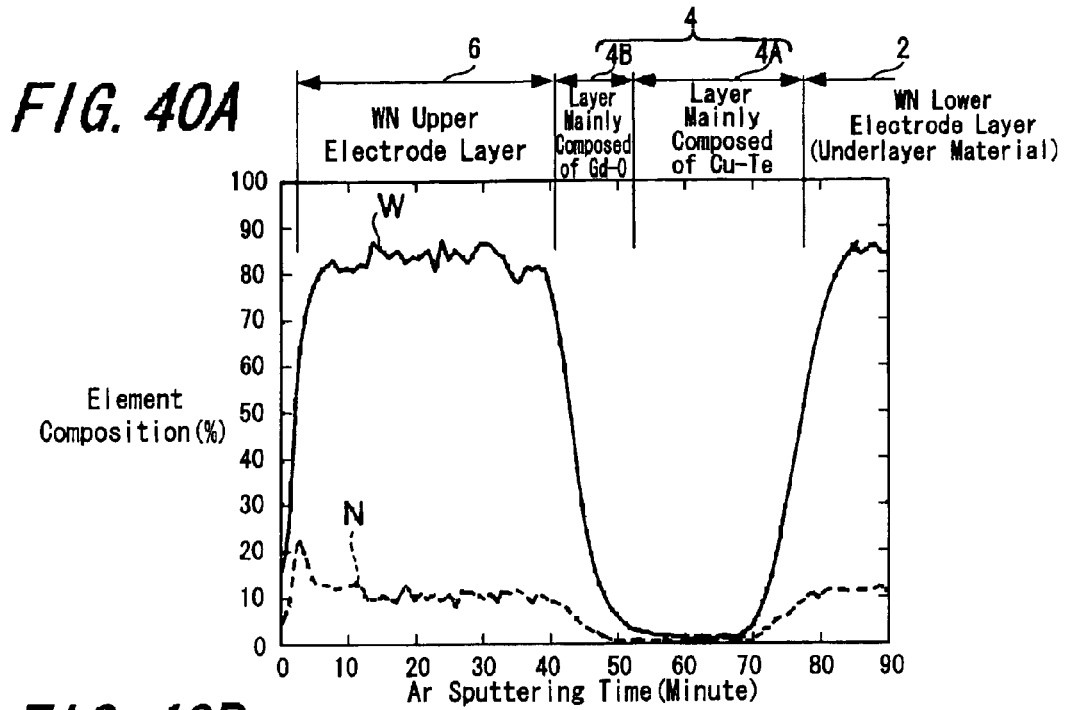
FIGS. 40A to 40C are respective diagrams showing measured results obtained when the composition of the sample 35 was analyzed by Auger electron spectroscopy (AES)
Figure 40B:
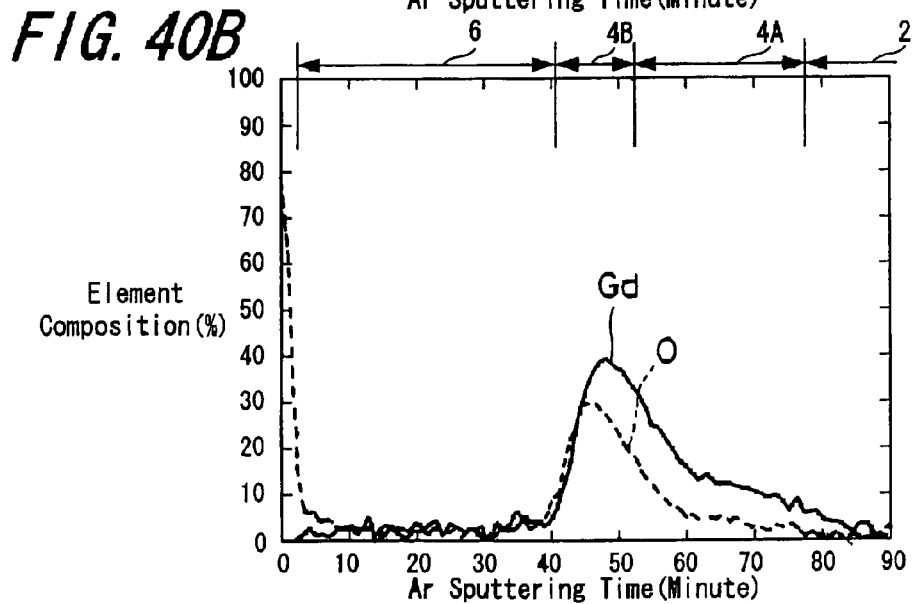
Figure 40C:
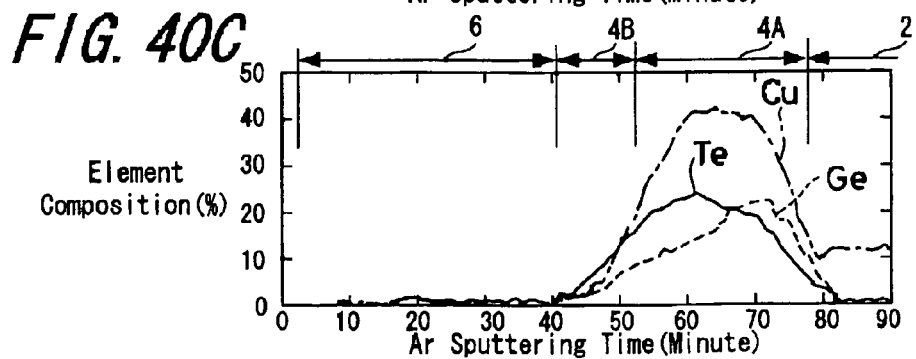

FIGS. 40A to 40C show thus obtained analyzed results. The horizontal axis represents the Ar sputtering time (minute) and which corresponds to the depth of the memory device 30. The longitudinal axis represents the composition distribution (%) of each element. FIG. 40A shows distributions of W and N; FIG. 40B shows distributions of Gd and O; and FIG. 40C shows distributions of Cu, Te and Ge. These characteristic graphs represent the thus simultaneously-obtained composition-analyzed results at every group of some elements.

From the composition-analyzed results of the depth direction shown in FIGS. 40A to 40C, it was observed that the memory thin film 4 of the memory device 30 is composed of a layer (metal chalcogenide layer) having Cu—Te—Ge on the lower electrode 2 side as a main component and a layer (rare earth oxide layer) having Gd—O on the upper electrode 6 side as a main component and that the memory thin film 4 has a composition gradient.

The reason that the memory thin film 4 has the material composition gradient in the film thickness direction as described above is that Gd (rare earth metal element) after deposited is very active chemically, it is diffused into the memory thin film 4 and moved toward the surface side with a high oxygen concentration to form the oxide layer and that Cu (metal element) is easily bonded to the chalcogenide elements (Te, S, Se) to form compounds.

When the memory thin film 4 has the above-mentioned composition gradient, as compared with the case in which it has the interface in which the composition is changed discontinuously, it is possible to form a film which is insensible to the interface state and there is an advantage that the process in the mass-production can be facilitated. Also, since the thermal equilibrium state structure is used, there is an advantage that the memory thin film 4 is difficult to be affected by dispersions of the manufacturing process.

Having noticed the composition distribution of Gd which is the rare earth element shown in FIG. 40B, it is to be understood that the metal chalcogenide layer 4A has the composition gradient relative to the film thickness direction. Owing to actions of the rare earth elements existing in this metal chalcogenide layer 4A, the crystallization temperature of the chalcogenide rises to suppress the crystallization under high temperature circumstance.

As a result, the memory device 30 can stably hold recorded contents under high temperature circumstance and further during it is preserved for a long time period.

Next, I-V (current-to-voltage) characteristics of the memory device 30 of the sample 34 and the memory device 30 of the sample 35 were measured.

First, with respect to the respective memory devices 30, the lower electrode 2 was connected to the ground potential (GND potential) to apply the negative potential to the upper electrode 6.

Then, while the negative potential applied to the upper electrode 6 is being decreased from 0V, the change of current was measured. However, it was set in advance such that the current limiter starts to operate when the current reaches 1 mA and that the negative potential applied to the upper electrode 6, that is, the voltage applied to the memory device 30 can be prevented from being increased at the current higher than 1 mA.

Also, while the negative potential applied to the upper electrode 6 is being decreased to 0V from the state in which the current reached 1 mA to enable the current limiter to start operating, the change of current was measured. Subsequently, conversely, after the positive potential was applied to the upper electrode 6, the current was decreased and the positive potential was increased to the voltage such that the current hardly flows, the positive potential is again returned to the 0 potential. This operation was repeated 8 times.

Figure 41:
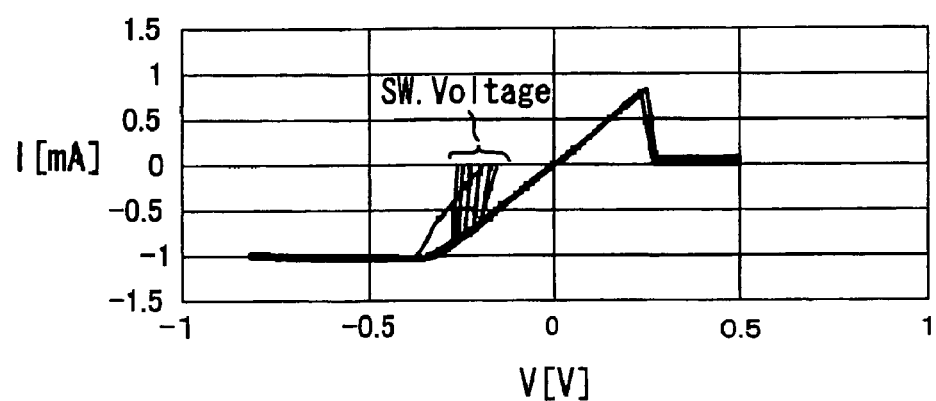
FIG. 41 is a graph showing measured results of I-V (current-to-voltage) characteristics of a sample 34.
Figure 42:
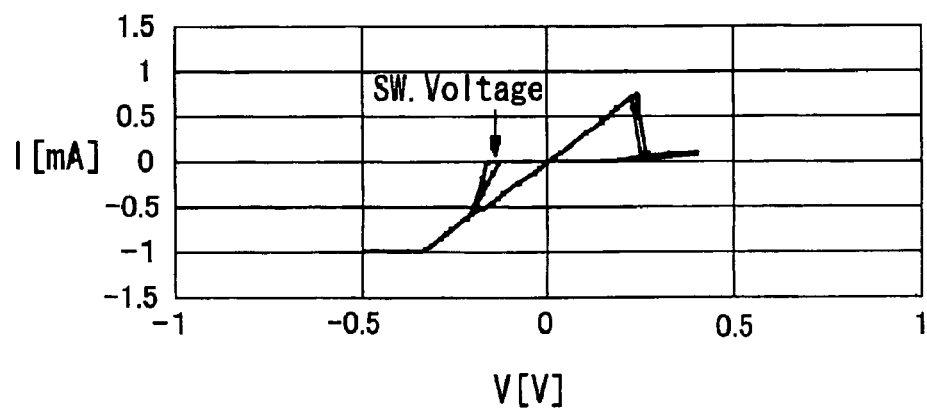
FIG. 42 is a graph showing measured results of I-V (current-to-voltage) characteristics of a sample 35.

FIG. 41 shows measured results of I-V characteristics of the sample 34 and FIG. 42 shows measured results of the I-V characteristics of the sample 35.

From FIGS. 41 and 42, it is clear that any of the memory devices 30 has the initial high resistance value, the memory device is placed in the OFF state, the voltage is increased in the negative direction and that a current is rapidly increased at a voltage higher than a certain threshold value (switching voltage), that is, that the resistance value of the memory device is decreased so that the memory device is changed to the ON state. As a result, it is to be understood that information can be recorded on the memory device.

On the other hand, it is also clear that, even after the voltage was decreased, a constant resistance value is held, that is, the ON state of the memory device is kept to hold recorded information.

Then, in the two samples 34 and 34, the resistance value of the OFF state at the place wherein voltage V=0.1V was about 2 MΩ and the resistance value of the ON state was about 100 kΩ.

Also, as shown in FIGS. 41 and 42, it was confirmed that, after the voltage V with the opposite polarity, that is, the positive potential (+potential) was applied to the upper electrode 6, the rear surface side of the substrate 1 was connected to the ground potential (GND potential) and the positive potential higher than V=0.3V was applied, the positive potential is again returned to 0V so that the resistance value is returned to the high resistance state of the OFF state. That is, it is to be understood that information recorded on the memory device can be erased with application of the negative voltage.

However, from the I-V characteristics of the sample 41 shown in FIG. 41, it was observed that dispersions occurred in the switching voltages required when recording/erasing of information was repeated 8 times.

Therefore, subsequently, the cross-sectional structure of the memory device 30 of this sample 34 was analyzed by a transmission electron microscope (TEM). The TEM used herein includes an electric field radiation type electron gun and has an arrangement in which electron beam can be converged to the size of the diameter of about 1 nm to 5 nm on the observed sample.

Figure 43A:
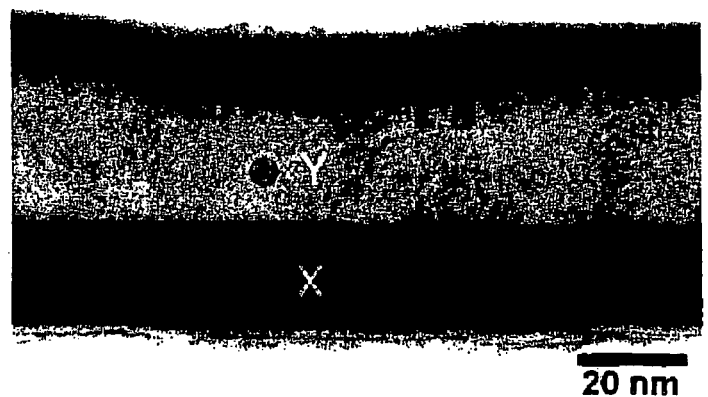
FIG. 43A is a microscopic representation showing an TEM image of the cross-section of the memory device of the sample 34 by the transmission electron microscope.
Figure 43B:
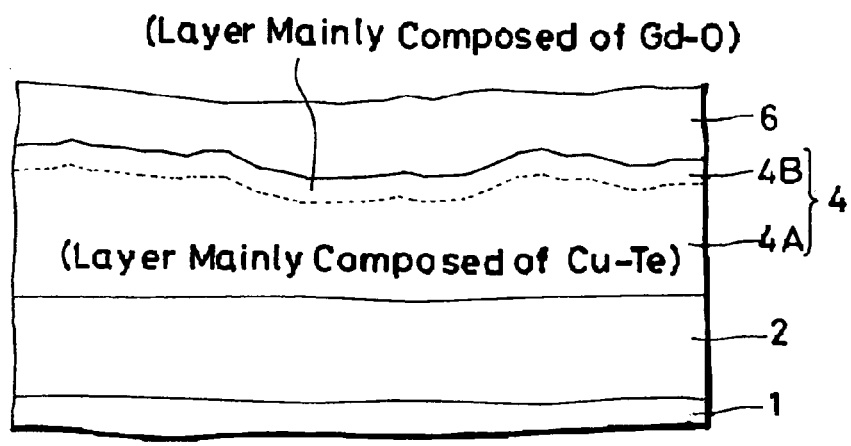
FIG. 43B is a schematic diagram used to explain a structure of the TEM image of FIG. 43A.

FIG. 43A shows an TEM image of the cross-section of the memory device 30 of the sample 34 and FIG. 43B shows a schematic construction diagram used to explain the structure of this TEM image. This memory thin film 4 is composed of a layer 4A using Cu—Te of the lower electrode 2 side serving as the underlayer as a main component and a layer 4B using Gd—O on the upper electrode 6 side as a main component.

Figure 43C:
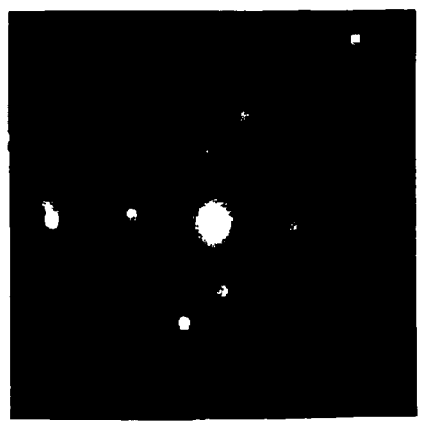
FIG. 43C is an electron diffraction pattern showing a point X in FIG. 43A.
Figure 43D:
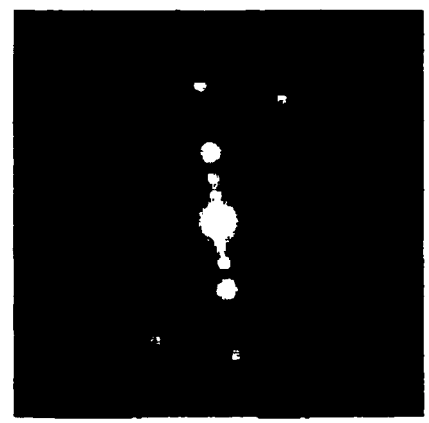
FIG. 43D is an electron diffraction pattern showing a point Y in FIG. 43A.

Then, FIG. 43C shows an electron diffraction pattern (nano-area diffraction pattern) obtained after electron beam with a diameter of 5 nm was converged on a point X (lower electrode 2) in FIG. 43A. FIG. 43D shows an electron diffraction pattern (nano-area diffraction pattern) obtained after electron beam with a diameter of 5 nm was converged on a point Y (layer 4A, mainly composed of Cu—Te, of the memory thin film 4) in FIG. 43A.

From FIGS. 43A and 43B, it is to be understood that, while the interface between the lower electrode 2 serving as the underlayer and the memory thin film 4 is flat, roughness is remarkable on the interface between the memory thin film 4 and the upper electrode 6. The structures of the lower electrode 2 serving as the underlayer and the memory thin film 4 can be judged from the electron diffraction patterns.

A study of the electron diffraction pattern of the lower electrode 2 serving as the underlayer shown in FIG. 43C reveals that a spot-like diffraction peak can be obtained and that the lower electrode 2 of this underlayer has the crystal structure.

Also, it is clear from the electron diffraction pattern of the lower layer (metal chalcogenide layer) 4A of the memory thin film 4 shown in FIG. 43D that a spot-like diffraction peak can be obtained and that this layer has a crystal structure.

Accordingly, if the lower electrode 2 serving as the underlayer has the crystal structure in which atoms are arrayed regularly like the memory device 30 of the sample 34, then when the memory device is manufactured, it can be considered that the following phenomenon will occur.

First, the metal chalcogenide layer 4A within the memory thin film 4 is partly crystallized while the atomic step of the surface of the underlayer is used as a core.

As a result, a region having an amorphous structure and a region having a crystal structure are mixed in the chalcogenide layer 4A. Due to a distribution of structures which are not uniform within the chalcogenide layer 4A from a crystallography standpoint, roughness of the memory thin film 4 is increased and the electric field distribution on the interface between the memory thin film 4 and the upper electrode 6 are caused to be not uniform.

As a result, the switching voltage at which the metal element starts to be diffused into the rare earth oxide film becomes unstable. Alternatively, since multiform distributions occur in property (for example, mobility of metal element) of the metal chalcogenide acting as an ion conductor, when the voltage is applied to the memory thin film 4, dispersions occur in the degree of progress in which the metal element is diffused into the rare earth oxide film.

As a result, dispersions occur in the switching voltage required when information is stored and erased repeatedly.

While the sample 34 used the TiW film having the body-centered cubic lattice crystal structure as the lower electrode 2 serving as the underlayer, the present invention is not limited thereto and it may use a material having other crystal structure as the lower electrode 2 with similar results being brought.

On the other hand, in the I-V characteristic of the sample 35 shown in FIG. 42, having noticed the switching voltage required to switch the high resistance state to the low resistance state, it is to be understood that dispersions in the switching voltage required when information is stored and erased repeatedly could be improved as compared with the I-V characteristic of the sample 34 shown in FIG. 41.

Subsequently, the cross-sectional structure of the memory device 30 of this sample 35 was analyzed by a TEM. The TEM used herein includes the electric field emission type electron gun and has an arrangement in which electron beam can be converged with a diameter of about 1 nm to 5 nm on the observed sample.

FIG. 44A shows a TEM image of a cross-section of the memory device of the sample 35 and FIG. 44B shows a schematic construction diagram used to explain the structure of this TEM image. This memory thin film 4 is composed of a layer 4A using Cu—Te of the lower electrode 2 side serving as the underlayer as a main component and a layer 4B using Gd—O on the upper electrode 6 side as a main component.

Then, FIG. 44C shows an electron diffraction pattern (nano-area diffraction pattern) obtained after electron beam with a diameter of 5 nm was converged on a point W (lower electrode 2) in FIG. 44A. FIG. 44D shows an electron diffraction pattern (nano-area diffraction pattern) obtained after electron beam with a diameter of 5 nm was converged on a point Z (layer 4A, mainly composed of Cu—Te, of the memory thin film 4) in FIG. 44A.

From FIGS. 44A and 44B, it is to be understood that roughness on the interface between the memory thin film 4 and the upper electrode 6 can be improved. The structures of the lower electrode 2 serving as the underlayer and the memory thin film 4 can be judged from their electron diffraction patterns, respectively.

From the electron diffraction pattern of the lower electrode 2 serving as the underlayer shown in FIG. 44C, it is to be understood that the position of the diffraction image is not clear, a hallo pattern with a wide distribution (hereinafter referred to as a "hallo pattern") is obtained and that the lower electrode 2 serving as the underlayer has the amorphous structure.

Also, from the lower electron diffraction pattern of the layer (metal chalcogenide layer) 4A of the memory thin film 4 shown in FIG. 44D, it is to be understood that a hallo pattern is obtained and that this layer 4A has the amorphous structure.

Accordingly, if the lower electrode 2 serving as the underlayer has the amorphous structure like the memory device 30 of the sample 35, when a memory device is manufactured, it can be considered that the following phenomenon will occur.

First, since the underlayer material has no core to cause the crystal to grow, the metal chalcogenide layer 4A within the metal thin film 4 can be prevented from being crystallized partly and has the amorphous structure which is an inherent stable structure.

Thus, the chalcogenide layer 4A and the rare earth oxide layer 4B on the upper portion have uniform and flat structures.

As a result, since the interface between the memory thin film 4 and the upper electrode 6 becomes flat, the electric field distribution within the memory thin film 4 becomes uniform so that the switching voltage at which the metal elements start being diffused into the rare earth oxide film may have a stable value. Alternatively, since the property (for example, conductivity of metal element) of the metal chalcogenide as the ion conductor becomes the uniform distribution, when the voltage is applied to the metal thin film 4, a degree of progress in which the metal elements are diffused into the rare earth oxide film becomes uniform.

As a result, the switching voltage required when information is stored and erased repeatedly becomes uniform.

While the sample 35 used the WN having the amorphous structure as the material of the lower electrode 2 serving as the underlayer, the present invention is not limited thereto and the lower electrode 2 may use other material having an amorphous structure with similar results being brought.

More specifically, the effect for making the switching voltage, which is used to store and erase information repeatedly, become uniform does not depend on the material but depends upon only the crystallography structure of the underlayer material.

Also, as shown in the above-mentioned sample 34, since the crystallography structure of the metal chalcogenide layer produced on the underlayer with the crystal structure is not uniform, roughness on the metal chalcogenide layer is increased and the property (for example, mobility of metal element) of the metal chalcogenide layer as the ion conductor is not made uniform so that dispersions on the switching voltage are increased.

Accordingly, if the underlayer material with the amorphous structure which can considerably improve the multiformity of the crystallography structure of the metal chalcogenide layer is employed, in all memory devices in which the metal chalcogenide layer is included within the memory thin film, for example, even when the memory thin film does not contain the rare earth oxide layer, dispersions of device characteristics such as the switching voltage can be decreased.

Information devices such as computers use a so-called ROM, which can be delivered in a short time period, as a consumer memory device. Also, a so-called PROM (Programmable ROM) is used as a memory device, which can be recorded only once, for recording information that need not be rewritten.

Various kinds of PROMs are known and an antifuse ROM is known as a typical device. In this antifuse ROM, a film made of amorphous Si (see Zhang, G et al. "On-state reliability of amorphous Silicon antifuses", Electron Devices Meeting, 1995., International, 10-13 Dec. 1995, pp. 10 to 13) or a film made of nitride such as AlN or SiN (see W. T. Li et al. "A Comparative study of the on-off switching behavior of metal-insulator-metal antifuses", IEEE Electron Device Letters, vol. 21, 2000, p295) or a film made of oxide such as $SiO_2$ is sandwiched between the electrodes. With application of the voltage in the initial insulating state in which the resistance value is in the high resistance state, dielectric breakdown occurs in the film sandwiched between the electrodes to change the resistance value to the low resistance state to thereby record information.

Such memory device has a memory cell formed thereon in the form of being connected to a MOS type transistor which might be called an access transistor in order to electrically separate the memory devices. Then, a memory cell array composed of a plurality of memory cells located constitute a storage apparatus.

The above-mentioned antifuse ROM needs a voltage of several voltages as a dielectric breakdown voltage. Also, a so-called switch-off phenomenon occurs in which, if a current in the mA order does not flow through the above-mentioned antifuse ROM, the low resistance state presented after recording is returned to the high resistance state presented before recording due to aging change. For this reason, in order to carry out stable recording, the antifuse ROM needs a current in the mA order.

More specifically, since the film made of the amorphous silicon or the film made of the nitride such as AlN or SiN or the film made of the oxide such as $SiO_2$ has a large thickness ranging from 10 and several nanometers to several 10s of nanometers, the switch phenomenon will easily occur and hence the resistance value cannot be held stably.

Although it is considered that these films should be reduced in thickness, if the $SiO_2$ film, for example, is reduced in thickness, then it is unavoidable that dispersions of film thickness and a leakage current increase. As a result, a thin film with stable characteristics cannot be obtained.

Also, in the MOS transistor, the transistor size is progressively miniaturized in accordance with the progress of the semiconductor microminiaturization technology so that a current flowing through the transistor becomes smaller increasingly. As a result, only a current of about 1 mA can flow through a MOS transistor having a gate width of 0.1 μm so that information cannot be recorded sufficiently stably.

Further, since the antifuse ROM is based upon the principle of dielectric breakdown to record information and this dielectric breakdown is a phenomenon which occurs locally, even when the memory device is reduced in size, it cannot be expected that a recording current will be decreased too much.

On the other hand, in addition to the MOS type transistor, an arrangement using a pn diode made of amorphous silicon, for example, is known as a selection device. Since this arrangement does not use the MOS type transistor, memory cell arrays are easily laminated on the same substrate, thereby making it possible to increase a storage capacity.

However, since this arrangement uses a pn diode, in order to enable this arrangement to function as a diode, the size of the memory device needs a film thickness larger than a film thickness (approximately 100 nm) to form a depletion layer. In consequence, when the size of the recording device is reduced to be less than 50 nm, it becomes difficult to process the recording device of such size.

Also, when information is read out from the memory device, since the pn diode should be turned ON and a voltage larger than at least a threshold voltage (approximately 0.7V) of the pn diode should be required, it is difficult to suppress power consumption required to read out information from the memory device.

A Schottky diode, a diode using a chalcogenide semiconductor and the like are enumerated as the diode for use as the selection device.

However, when the Schottky diode is used as the diode for use as the selection device, a problem of a film thickness and a problem of a remarkable temperature change of current and voltage characteristics arise similarly to the case in which the pn diode is used as the diode for use as the selection device. Also, when the chalcogenide semiconductor is used as the diode for use as the selection device, the crystallization temperature of amorphous chalcogenide lies in a range of from 200° C. to 300° C. and hence it is difficult to obtain sufficient heat-resisting property relative to the ordinary semiconductor process.

In view of the aforesaid aspect, in a storage apparatus such as a PROM in which information can be recorded only once, an embodiment of a memory device having an arrangement by which information can be recorded sufficiently stably will be described next.

Figure 45:
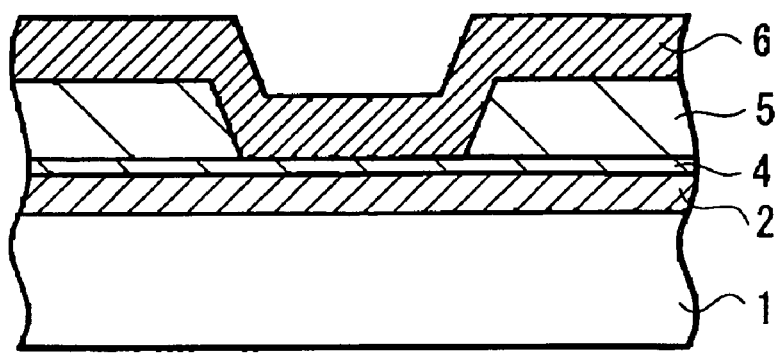
FIG. 45 is a schematic diagram (cross-sectional view) showing an arrangement of a memory device according to a further embodiment of the present invention.

Next, FIG. 45 is a schematic construction diagram (cross-sectional view) of a memory device according to a further embodiment of the present invention.

In this embodiment, the memory device according to the present invention is applied to a memory device in which information can be recorded only once.

A memory device 40 includes a substrate 1 with a high conductivity, for example, a ($P^{++}$) silicon substrate 1 which is doped with P-type high concentration impurities, a lower electrode 2 formed on the substrate 1, a memory thin film 4 formed on this lower electrode 2, an insulating layer 5 formed on the memory thin film 4 and an upper electrode 6 formed so as to be connected to the memory thin film 4 through a through-hole formed on the insulating layer 5 on the memory thin film 4.

More specifically, this memory device 40 has an arrangement different from that of the memory device 10 shown in FIG. 1 in that the ion source layer 3 is removed and that the memory thin film 4 is directly formed on the lower electrode 2.

Interconnection materials for use with the semiconductor process, for example, TiW, Ti, W, WN, Cu, Al, Mo, Ta, silicide and the like can be used for the lower electrode 2. When this lower electrode 2 is made of the TiW film, for example, it is sufficient to select the film thickness of the TiW film in a range of from 10 nm to 100 nm.

The memory thin film 4 is formed of a thin film (rare earth oxide thin film) made of one kind or a plurality of kinds of rare earth element oxides selected from La, Ce, Pr, Nd, Sm, Eu, Gd, Tb, Dy, Ho, Er, Yb, Y of rare earth elements.

Since this memory thin film 4 is made of an ordinary insulating material, a film thickness thereof is decreased so as to fall within a range of from 0.5 nm to 50 nm so that a dielectric breakdown may occur with application of a current. While the upper limit of the above film thickness is set to be 5.0 nm, it may be assumed that no problem will arise if the upper limit of the above film thickness is selected to be about less than 10 nm in consideration of the magnitude (for example, 4V to 6V) of a dielectric breakdown voltage (recording voltage).

The composition of oxygen in this memory thin film 4 is generally a composition of $RE_2O_3$ relative to the rare earth element (RE). Since it is sufficient that the memory thin film 4 may be an amorphous film and that it may have an electric property less than the electric conductivity of the semiconductor region, the composition of oxygen of the memory thin film 4 is not limited to the above-mentioned composition and may be modified as $REO_x$ ($0.5<x\leq1.5$).

Also, this memory thin film 4 may contain in advance elements other than the rare earth elements, such as Ge, Si, Te, S, Se, Sb, Ti, W, Cu, Ag, Zn, Fe, Co, P, N, H.

The memory thin film 4 made of the above-mentioned material has a characteristic in which impedance (resistance value) is changed with application of a voltage pulse or a current pulse.

The insulating layer 5 may be made of a photoresist processed by the hard-cure treatment, $SiO_2$, $Si_3N_4$ generally used in semiconductor apparatus, other materials, for example, inorganic materials, fluorinated organic materials, aromatic organic materials such as SiON, SiOF, $Al_2O_3$ $Ta_2O_5$, $HfO_2$, $ZrO_2$.

The upper electrode 6 may be made of ordinary semiconductor interconnection materials similarly to the lower electrode 2.

The memory device 40 according to this embodiment shown in FIG. 45 can be operated to record information as follows.

First, a voltage is applied to two electrodes of the lower and upper electrodes 2 and 6 provided on the upper and lower portions of the rare earth oxide thin film 4. Thus, when the applied voltage is higher than an insulating withstand voltage, a dielectric breakdown occurs within the rare earth oxide thin film 4 and a current flows through the rare earth oxide thin film 4 to decrease the resistance value of the rare earth oxide thin film 4. Since respective layers other than the rare earth oxide thin film 4 are inherently low in resistance value as compared with the resistance value obtained before information is recorded on the rare earth oxide thin film 4, it is possible to decrease the resistance value of the whole of the memory device 40 by decreasing the resistance value of the rare earth oxide thin film 4.

After that, if the voltage applied to the upper and lower electrodes 2 and 6 is removed to remove the voltage applied to the memory device 40, then the rare earth oxide thin film 4 can be held in the state of the low resistance value. As a result, it becomes possible to record information on the memory device 40. At that time, it becomes possible to record information on the memory device 40 with application of a very small current.

Then, when the state of the high resistance value is made corresponding to information of "0" and the state of the low resistance value is made corresponding to information of "1", the information of "0" can be changed to the information of "1" in the process in which information is recorded with application of the voltage.

The reason that information can stably be recorded with application of the very small current when the rare earth oxide thin film 4 is sandwiched between the lower and upper electrodes 2 and 6 is considered as follows. That is, the insulating withstand voltage of the rare earth oxide thin film 4 is extremely high and a sufficiently high resistance state can be held by a very thin film thickness ranging from 0.5 nm to 5.0 nm. Also, when the film thickness of the rare earth oxide film 4 is very thin and the electrode material is diffused into the rare earth oxide thin film 4 by the dielectric breakdown, it is possible to sufficiently decrease the resistance value even by a very small amount of diffusion.

In addition, since the melting point of the rare earth oxide thin film 4 is higher than 2000° C. and is thermally stable so that, upon temperature load, the insulating characteristic obtained after the dielectric breakdown caused by diffusion of oxygen atoms is not easy to be recovered (that is, the dielectric breakdown is difficult to be recovered), there can be obtained the arrangement in which information of "0" can be changed to information of "1", for example, information can be recorded only once in the process in which information is recorded with application of the voltage.

The memory device 40 having the arrangement shown in FIG. 45 can be manufactured as follows.

First, a lower electrode 2, for example, a TiW film is deposited on a substrate 2 with a high conductivity, for example, a silicon substrate which is heavily doped with P-type impurities.

Next, a rare earth oxide thin film 4, for example, a $Gd_2O_3$ film is formed.

Next, after an insulating layer 5 was formed so as to cover the rare earth oxide thin film 4, a contact portion to the rare earth oxide thin film 4 is formed by removing a part of the insulating layer 5 according to the photolithography.

Subsequently, a TiW film is deposited as an upper electrode 6 by a magnetron sputtering apparatus, for example.

After that, the TiW film is patterned by a suitable method such as plasma etching. The TiW film can be patterned by using a suitable etching method such as ion milling and RIE (reactive ion etching) in addition to the plasma etching.

In this manner, the memory device 40 shown in FIG. 45 can be manufactured.

According to the arrangement of the memory device 40 of the above-mentioned embodiment, since the rare earth oxide thin film 4 is sandwiched between the lower and upper electrodes 2 and 6, this memory device 40 is stable thermally and information can be recorded. Thus, unlike the related art, it is possible to prevent the switch-off phenomenon in which the resistance value obtained after recording is returned to the resistance value obtained before recording. As a result, the resistance value obtained after recording can be held constantly.

Accordingly, as compared with the related-art memory device having the arrangement in which a film formed of amorphous Si, nitride such as AlN and SiN or oxide of $SiO_2$ film is sandwiched between the lower and upper electrodes, for example, it becomes possible to stably record information.

Also, since information is recorded by using the change of the resistance value of the memory device 40, in particular, the change of the resistance value of the rare earth oxide thin film 4, even when the memory device 40 is microminiaturized, it becomes easy to record information ad to store recorded information.

Further, according to the memory device 40 of this embodiment, the lower electrode 2, the rare earth oxide thin film 4 and the upper electrode 6 can be constructed by materials any of which can be treated by sputtering. For example, the sputtering may be made by using targets formed of compositions adapted to the materials of the respective layers. Also, the respective portions can be continuously deposited by changing the targets within the same sputtering apparatus.

A storage apparatus can be constructed by disposing a large number of the memory devices 40 of this embodiment in a matrix fashion.

Each memory device 40 may include the interconnection connected to the side of the lower electrode 2 thereof and the interconnection connected to the side of the upper electrode 6 thereof and the memory device 40 may be disposed near the intersection of these interconnections, for example.

Further, although not shown, the lower electrode 3 is made common to the memory cells of the row direction and the interconnection connected to the upper electrode 6 is made common to the memory cells of the column direction. A memory cell in which information is to be recorded may be selected by selecting the lower electrode 2 through which a current flows with application of the potential and the interconnection connected to the upper electrode 6 and information can be recorded with application of a current to the memory device 40 of this memory cell.

Since the memory device 40 according to the above-mentioned embodiment is stable thermally, it can record information by a very small current and it becomes able to record information stably, the storage apparatus is constructed by using such memory device 40, thereby making it possible to obtain a storage apparatus with an arrangement in which power consumption can be decreased.

Next, a memory device according to still a further embodiment of the present invention will be described.

Figure 46:
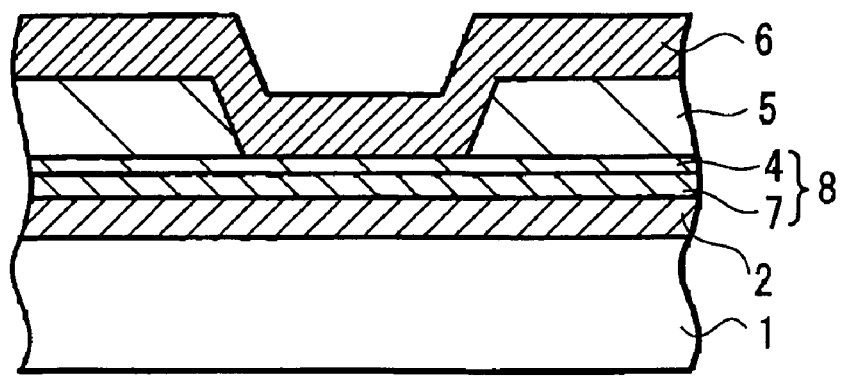
FIG. 46 is a schematic diagram (cross-sectional view) showing an arrangement of a memory device according to yet a further embodiment of the present invention.

While the memory device 40 according to the above-mentioned embodiment has the arrangement in which only the memory thin film 4 (rare earth oxide thin film) containing the rare earth oxide is sandwiched between the lower and upper electrodes 2 and 6 as was shown in FIG. 45, in a memory device 101 according to this embodiment, as shown in FIG. 48, at least a thin film 7 containing chalcogenide elements (Te, Se, S) is sandwiched between the lower and upper electrodes 2 and 6 in addition to the rare earth oxide thin film 4. FIG. 46 shows the case of the arrangement in which the thin film 7 containing the chalcogenide elements is sandwiched between the lower electrode 2 and the memory thin film 4.

A rest of the arrangement is similar to that of the memory device 40 shown in FIG. 45. Therefore, corresponding portions are denoted by the identical reference numerals and need not be described in detail.

The memory device 101 according to this embodiment can be operated to record information as follows.

In the case of the memory device 101 according to this embodiment, a voltage is applied to the memory device 101 such that the side of the electrode 2 in contact with the thin film 7 containing the chalcogenide elements may be set to the positive side and the side of the electrode 6 in contact with the rare earth oxide thin film 4 may be set to the negative side.

When the voltage is applied to the memory device 101 as described above, if the applied voltage is higher than the insulating withstand voltage, then a dielectric breakdown occurs within the laminated film 8 composed of the rare earth oxide thin film 4 and the thin film 7 containing the chalcogenide elements and the current flows through this laminated film 8 to decrease the resistance value of the laminated film 8. Since the respective layers other than the laminated film 8 are inherently low in resistance value as compared with the resistance value, obtained before recording, of the laminated film 8, it is possible to decrease the resistance value of the whole of the memory device 101 by decreasing the resistance value of the laminated film 8.

After that, when the voltage applied to the memory device 101 is removed by eliminating the voltage applied to the upper and lower electrodes 2 and 6, the memory device 101 is held in the state in which the resistance value is decreased. Thus, it becomes possible to record information. At that time, in the memory device 101 according to this embodiment, as is shown in an experiment which will be described later on, the resistance value obtained after recording exhibits not an ohmic property but a nonlinear property dependent on the voltage and a so-called diode characteristic can be obtained.

Then, when the state of the high resistance value is made corresponding to information of "0" and the state of the low resistance value is made corresponding to information of "1", the information of "0" can be changed to the information of "1" in the process in which information is recorded on the memory device 101 with application of the voltage.

As described above, information can be recorded by a very small current and information can be recorded only once similarly to the memory device 40 of the above-mentioned embodiment.

When the memory device 10 according to this embodiment shown in FIG. 46 is manufactured, relative to the process for manufacturing the memory device 40, the thin film 7 containing the chalcogenide elements is formed on the low electrode 2 before the rare earth oxide thin film 4 is formed. In the following processes, similarly to the case of the memory device 40, the rare earth oxide thin film 4, the insulating layer 5, the upper electrode 6 and the like are deposited on the thin film 7, in that order.

Figure 47:
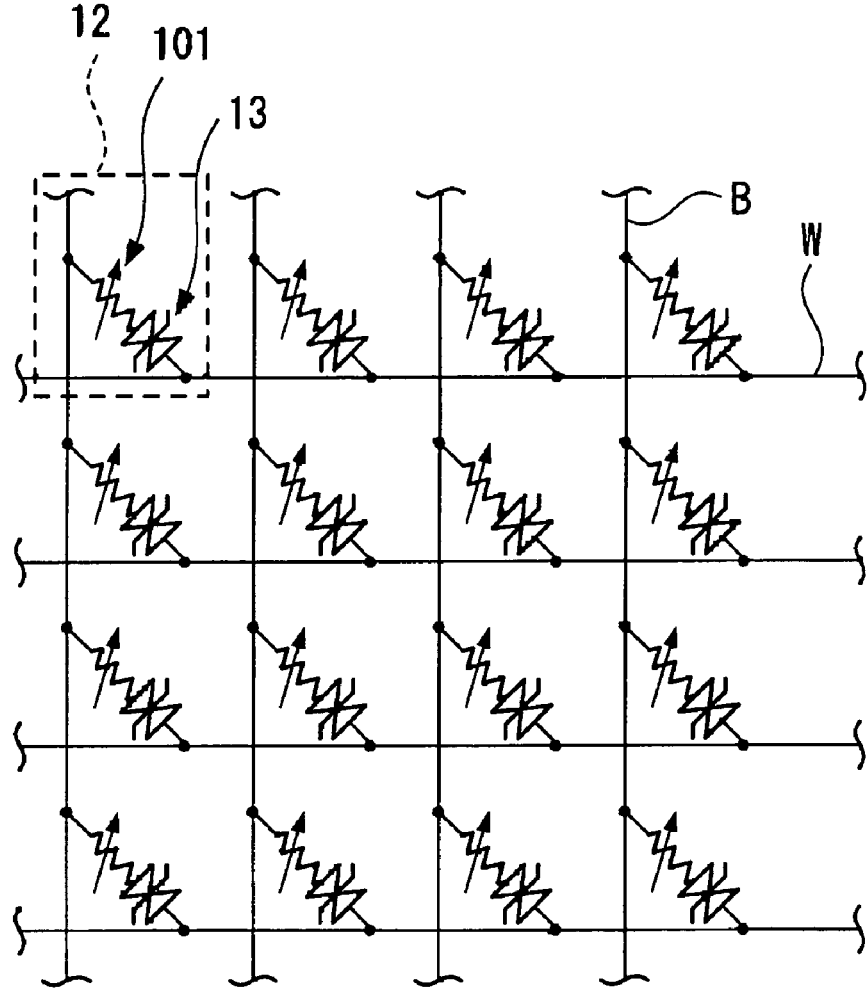
FIG. 47 is an equivalent circuit diagram obtained when a storage apparatus is constructed by using the memory device shown in FIG. 46.

Also in this embodiment, it is possible to construct a storage apparatus by disposing a large number of memory devices 101 in a matrix fashion. FIG. 47 is an equivalent circuit diagram showing an arrangement of such storage apparatus.

In this storage apparatus 11, each memory device 101 includes the lower and upper electrodes 6 connected with interconnections (word line W and bit line B), respectively, and the memory device 101 is located near the intersection of these interconnections.

For example, the word line W connected to the lower electrode 2 is made common to the memory cells 12 in the row direction and the bit line B connected to the upper electrode 6 is made common to the memory cells 12 in the column direction. Then, the memory cell 12 located at the intersection and in which information is to be recorded is selected by selecting the lower electrode 2 and the interconnections (bit lines B or word lines W) through which a current flows with application of a potential, and the current flows through the memory device 101 of this memory cell 12 to record information on the memory device 101.

In the case of the memory device 101 according to this embodiment, as described above, when information is recorded, since the diode characteristic can be obtained by applying the voltage such that the side of the lower electrode 2 in contact with the thin film 7 containing the chalcogenide elements may be set to the positive side and that the side of the upper electrode 6 in contact with the rare earth oxide thin film 4 may be set to the negative side, the respective memory cells 12 can be separated electrically without providing the MOS type transistor, for example, into each memory cell 12.

Accordingly, when the storage apparatus 11 is constructed by using the memory device 101 according to this embodiment, as shown in FIG. 47, the memory cell 12 can be constructed in such a fashion that the memory device 101 and the diode 13 are connected in series.

According to the arrangement of the memory device 101 of this embodiment, since the laminated film 8 composed of the memory thin film 4 containing the rare earth oxide and the thin film 7 containing the chalcogenide is sandwiched between the lower and upper electrodes 2 and 6, similarly to the above-mentioned embodiment, the memory device 101 of this embodiment is stable thermally and is able to record information by a very small current.

As a result, as compared with the arrangement of the related-art memory device in which the film of amorphous Si, nitride such as ALN and SiN or nitride such as $SiO_2$ is sandwiched between the electrodes, it becomes possible to record information stably.

Also, when information is recorded on the memory device 101 having the above-mentioned arrangement, if the voltage is applied such that the side of the lower electrode 6 in contact with the thin film 7 containing the chalcogenide elements may be set to the positive side and that the side of the upper electrode 6 in contact with the rare earth oxide thin film may be set to the negative side, as described above, it is possible to obtain the memory device having the arrangement in which the resistance value obtained after recording exhibits the diode characteristic.

Accordingly, when the memory cell 101 is used to construct the memory cell 12 and the storage apparatus shown in FIG. 47 is constructed by using a plurality of memory cells 12, since the respective memory cells 12 can electrically be separated owning to the above-mentioned diode characteristic, it becomes possible to decrease a noise caused by a current flowing through the memory cell 12 which is not selected upon reading, that is, so-called crosstalk.

In this manner, since the arrangement of each memory cell 12 can be simplified by the amount of the MOS type transistor, the storage apparatus can be miniaturized as compared with the case in which the MOS type transistor is used. Also, since it becomes possible to construct a cross-point type memory cell array, in addition to the increase of recording density, a plurality of memory cells 12 can be laminated on the substrate 1 and the storage capacity can be increased in the height direction.

When a voltage with a polarity different from that of this embodiment is applied to the memory device 101, that is, a voltage is applied such that the side of the lower electrode 2 in contact with the thin film 7 containing the chalcogenide elements may be set to the negative side and that the side of the upper electrode 6 in contact with the rare earth oxide thin film 4 may be set to the positive side, although information can be recorded on the memory device 101 by a very small current, the resistance value obtained after recording exhibits not the diode characteristic but the ohmic characteristic.

While the thin film 7 containing the chalcogenide elements is located between the rare earth oxide thin film 4 and the lower electrode 2 in the memory device 101 according to this embodiment, the present invention is not limited thereto and the thin film containing the chalcogenide elements may be located between the rare earth oxide thin film 4 and the upper electrode 6.

As described above, according to the present invention, it is possible to construct the thin film containing the chalcogenide elements between the rare earth oxide thin film and any one electrode of the upper and lower electrodes.

It is also possible to construct a memory device in which information can be recorded only once by combining the arrangement of the memory device 30 according to the preceding embodiment (arrangement in which the lower electrode 2 serving as the underlayer of the memory thin film 4 is made of the amorphous material) and the arrangements of the memory devices 40 and 101 of the above-mentioned respective embodiments.

Inventive Example

Next, the memory elements 40, 101 according to the above-mentioned respective embodiment were manufactured in actual practice and their characteristics were measured.

<Experiment 19>

First, a TiW film having a film thickness of 20 nm was deposited on a substrate 1 with a high conductivity, for example a silicon substrate which is heavily doped with P-type impurities as a lower electrode 2 by sputtering. Next, an amorphous gadolinium oxide film (amorphous Gd oxide film) having a film thickness of 3.5 nm was formed as the memory thin film 4.

Next, a photoresist is deposited so as to cover the amorphous gadolinium oxide film. After that, a through-hole was formed on the photoresist on the amorphous gadolinium oxide film 4 by exposure and development according to the photolithography technique. The size of the through-hole was 2 μm long and 2 μ wide.

Thereafter, the product was annealed at 280° C. in vacuo and the photoresist was changed in quality to form an insulating layer 5 as a hard-cure resist which is stable against temperature and etching. The reason that the hard-cure resist is used for the insulating layer 5 is that the hard-cure resist can easily be formed from an experiment standpoint. When the product is manufactured in actual practice, it is preferable that other materials (for example, silicon oxide film, etc.) should be used in the insulating layer 5.

Next, a TiW film having a film thickness of 100 nm was deposited as an upper electrode 6. After that, the upper electrode 6 deposited on the insulating layer 5 made of the hard-cure resist was patterned with the size of 50 μm×50 μm by using a plasma etching apparatus according to the photolithography technique.

In this manner, the memory device 40 shown in FIG. 46 was manufactured and used as a memory device of a sample 36.

In the memory device of the sample 36, the rear surface of the low resistance silicon substrate 1 conducted to the lower electrode 2 was connected to the ground potential (GND potential) and a negative potential was applied to the upper electrode 6. Then, while the negative potential applied to the upper electrode 6 was being decreased from 0V, the change of a current was measured.

In this case, it is set such that a current limiter starts operating when a current reaches 1 mA and that a negative potential applied to the upper electrode 6, that is, a voltage applied to the memory device can be prevented from being increased at a current higher than 1 mA. Then, the change of current was measured while the negative voltage applied to the upper electrode 6 was being changed to 0V from the state in which the current limiter started operating. Conversely, this time, while the positive potential was being applied to the upper electrode 6 and the positive potential applied to the upper electrode 6 was being increased, the change of the current was measured. Also in the positive potential side, it was similarly set such that the current limiter may start operating when the current reaches 1 mA.

Figure 48A:
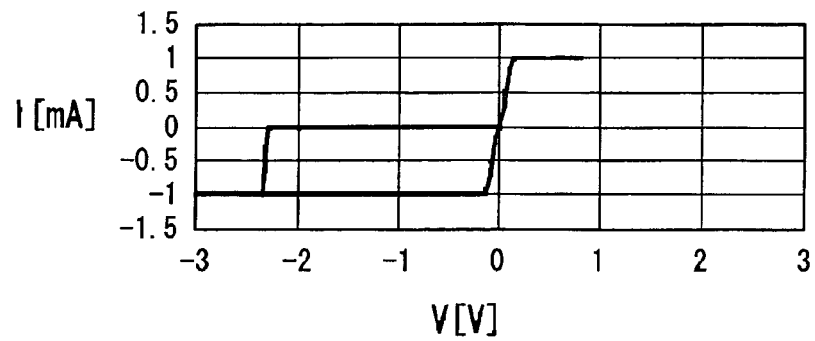
FIGS. 48A and 48B are respectively graphs showing measured results of I-V (current-to-voltage) characteristics of a sample 36.

FIG. 48A shows measured results of I-V (current-to-voltage) characteristics of the sample 36 in this case.

Also, it was set such that the current limiter starts operating when the current reaches 1 mA and the change of the current was measured while the voltage applied to the upper electrode 6 was being changed similarly.

Figure 48B:
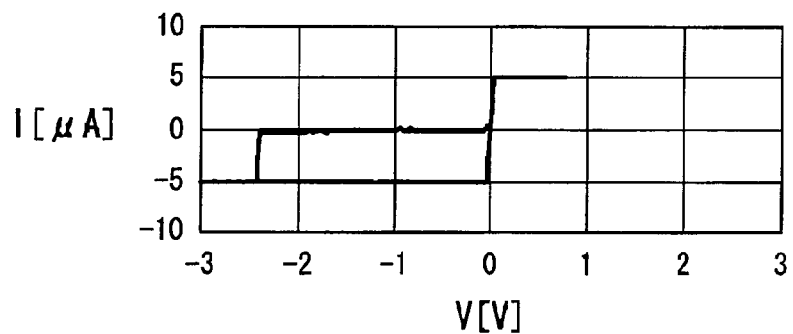

FIG. 48B shows measured results of I-V (current-to-voltage) characteristics of the sample 36 in this case.

From FIGS. 480A and 48B, it is to be understood that a current rapidly flows at the voltage higher than the threshold value to inhibit information from being recorded. The resistance values obtained before recording (in the initial state) were both higher than 1 MΩ. Also, the resistance values obtained after recording were approximately 100 Ω in the case shown in FIG. 50A and were less than 1 kΩ in the case shown in FIG. 48B. In particular, in the case shown in FIG. 48B, information was recorded by a very small current such as 5 g m and then the low resistance state was held stably.

In the case of the memory device of the sample 36, the minimum current necessary for recording information stably was 2 μA.

<Experiment 20>

Next, as shown in FIG. 46, characteristics of the memory device 101 in which the thin film 7 containing the chalcogenide elements was sandwiched between the rare earth oxide thin film 4 and the lower electrode 2 or the upper electrode 6 were checked.

A GeTeGd film (composition ratio, $Ge_4Te_5TGd$) having a film thickness of 15 nm was deposited on the lower electrode 2 as the thin film 7 containing the chalcogenide elements and an amorphous gadolinium oxide film, of the rare earth oxide film, having a film thickness of 5 nm was deposited on the thin film 7.

Although the GeTeGd film is the amorphous film and exhibits a resistivity between the conductor and the semiconductor electrically, in this experiment, since the thin oxide thin film is formed on the surface of the GeTeGd film 7 by the process in which the rare earth oxide thin film 4 is formed and by the processing executed after the rare earth oxide thin film 4 was formed, the surface in which this oxide thin film is formed exhibits the resistivity of the semiconductor.

Materials, film thicknesses, sizes and the like of other respective layers are similar to those of the case shown in FIG. 19. Therefore, corresponding portions are denoted by the identical reference numerals and need not be described in detail.

Figure 51:
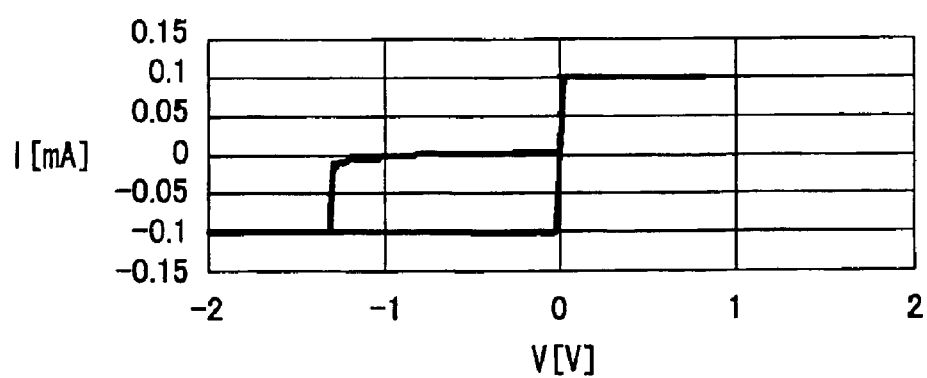
FIG. 51 is a graph showing measured results of I-V (current-to-voltage) characteristics of the sample 38.

A memory device having the above-mentioned arrangement was manufactured and used as a sample 37. I-V (current-to-voltage) characteristics of the memory device of this sample 37 were measured. This measurement is different from that of the experiment 19 in that the current limiter starts operating when the current reaches 0.4 mA, and a method for applying the voltage to record information is similar to that of the experiment 19. FIG. 51 shows measured results of I-V (current-to-voltage) characteristics of this sample 37.

The initial resistance value of the memory device is higher than 1 MΩ. From FIG. 49, it is to be understood that when the voltage is applied to the lower electrode 2 such that the upper electrode 6 may be set to the negative potential, a current rapidly flows at a threshold voltage |Vthw| required to record information so that the resistance value is decreased.

Then, when the voltage was returned to 0V, the resistance value obtained after recording exhibited not the ohmic characteristic but the nonlinear characteristic dependent upon the voltage as compared with the memory device 40 having the arrangement in which the GeTeGd film 7 is not sandwiched as shown in FIG. 45. More specifically, it is to be understood that this memory device has a so-called diode characteristic.

Figure 49:
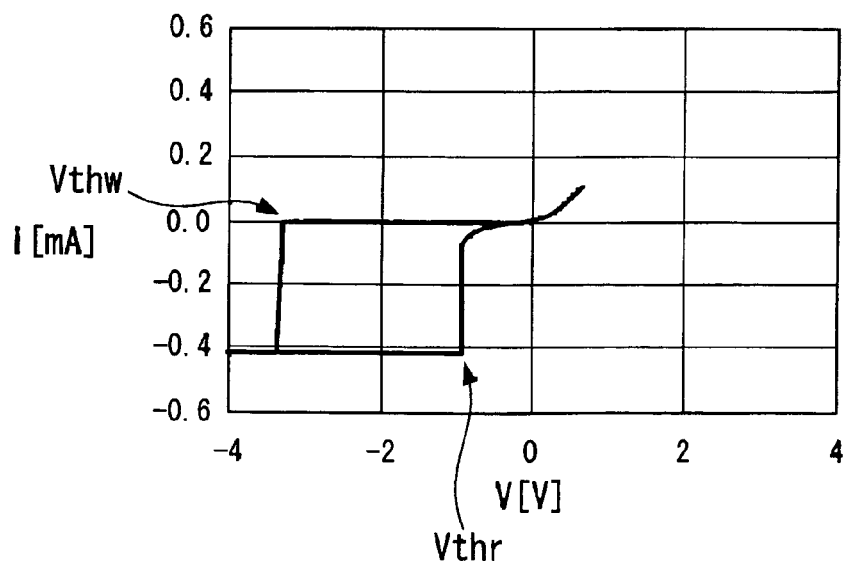
FIG. 49 is a graph showing measured results of I-V (current-to-voltage) characteristics of a sample 37.

The current rapidly decreases relative to the voltage equivalent to a voltage less than a threshold voltage |Vthr|, that is, about 0.8V in FIG. 49.

When information is read out from the memory device in which information was recorded as described above, information can be read out from the memory device by applying the voltage between Vthw and Vthr. With application of such voltage to the memory device, a large current flows when information was recorded and a small current flows when information was not recorded, thereby reading out information from the memory device.

<Experiment 21>

Figure 50:
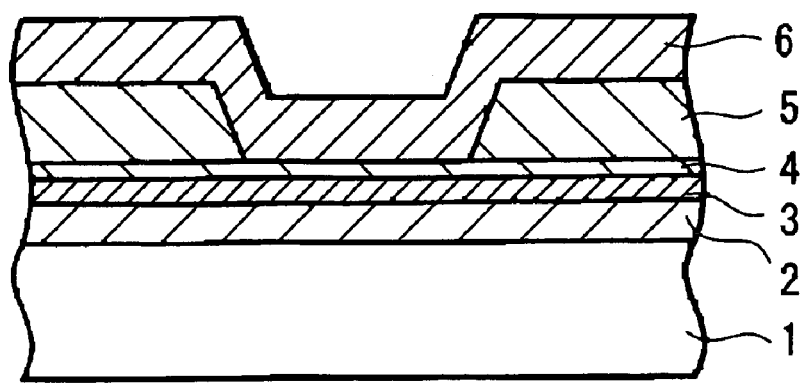
FIG. 50 is a schematic diagram (cross-sectional view) showing an arrangement of a memory device of a sample 38.

Next, as shown in FIG. 50, characteristics were checked in which a Cu film was formed between the rare earth oxide thin film 4 and the lower electrode 2 as the ion source layer 3, that is, a Cu film 3 was formed instead of the thin film 7 containing the chalcogenide elements in the experiment 20.

The Cu film 3 was formed with a film thickness of 6 nm. Since materials, film thickness and the like of the memory thin film 4, the lower electrode 2 and the upper electrode 6 other than the Cu film 3 are similar to those of the experiment 19, corresponding portions are denoted by the identical reference numerals and therefore need not be described.

Then, a memory device having such arrangement is used as a sample 38 and I-V (current-to-voltage) characteristics of this sample 38 were measured. This measurement differs from that of the experiment 19 in that the current limiter starts operating when the current reaches 1 mA. A method for applying a voltage to record information is similar to that of the experiment 19. FIG. 51 shows measured results of I-V (current-to-voltage) characteristics of the sample 38.

From FIG. 51, it is clear that, when the Cu film 3 contacts with the rare earth oxide thin film 4, the recording threshold voltage was decreased so that the minimum current necessary for recording information reached about 10 μA. However, stability of the resistance value obtained after recording was similar to that of the memory device 40 having the arrangement in which the Cu film was not formed in the experiment 19.

Also, when the Cu film 3 was formed, the diode characteristic could not be obtained.

A storage apparatus (storage apparatus) can be constructed by using the memory devices shown in the above-mentioned respective embodiments and by arraying a large number of memory devices in a columnar fashion or in a matrix fashion.

At that time, a device selection MOS transistor or diode may be connected to each memory device to construct a memory cell according to the necessity.

Further, according to the necessity, the memory device may be connected through an interconnection to a sense amplifier, an address recorder, a recording/erasing/reading circuit and so on.

The memory device according to the present invention can be applied to various storage apparatus. For example, the memory device according to the present invention can be applied to any memory form such as a so-called PROM (programmable ROM) in which information can be written only once, an EEPROM (Electrically Erasable ROM) in which information can be erased electrically or a so-called RAM (random-access memory) in which information can be recorded, erased and reproduced at high speed.

A memory device according to the present invention comprises a first electrode, a second electrode and a memory thin film sandwiched between the first and second electrodes, wherein the memory thin film or a layer in contact with the memory thin film contains any one of elements selected from Cu, Ag, Zn and the memory thin film or a layer in contact with the memory thin film contains any one of elements selected from Te, S, Se.

More specifically, there are enumerated an arrangement in which both of two kinds of element groups of two kinds of elements of the element selected from Cu, Ag, Zn and the element selected from Te, S, Se are contained in the memory thin film, an arrangement in which two kinds of element groups are contained in the layer in contact with the memory thin film and an arrangement in which at least one kind of the element groups are respectively contained in the memory thin film and the layer in contact with the layer.

According to the above-mentioned arrangement of the memory device of the present invention, since the memory thin film is sandwiched between the first and second electrodes, the memory thin film contains at least the rare earth element, the memory thin film or the layer in contact with the memory thin film contains any one of the elements selected from Cu, Ag, Zn and the memory thin film or the layer in contact with the memory thin film contains any one of the elements selected from Te, S, Se, it becomes possible to record information by using the resistance state of the memory thin film.

To be more concrete, when the voltage is applied to the memory device with application of the positive potential to one electrode side, Cu, Ag, Zn are ionized and diffused into the memory thin film and bonded to electrons at the portion of the other electrode side and thereby deposited or they remain in the memory thin film to form the impurity level of the insulating film to lower the resistance value of the memory thin film, thereby making it possible to record information.

Also, in this state, when the negative voltage is applied to the memory device with application of the negative potential to the side of one electrode, Cu, Ag, Zn that had been deposited on the side of the other electrode are again ionized and returned to the original state so that the resistance value of the memory thin film returned to the original high state and that the resistance value of the memory device also is increased, thereby making it possible to erase the recorded information.

Then, since the memory thin film contains the rare earth element, a crystallization temperature of the memory thin film can be increased or a melting point of the memory thin film can be increased, whereby the fine structure of the memory thin film can be stabilized relative to the rise of temperature. As a result, since heat-resisting property of the memory thin film can be improved, a manufacturing yield rate the high-temperature process of the memory device can be improved. Also, stability relative to the local temperature rise generated in the operations of the memory device such as recording can be improved, whereby the number of repetitive rewriting can be increased. Further, even when data is stored during a long period of time under high-temperature circumstances, the high-resistance state can be maintained with stability.

The above-described memory device according to the present invention can be modified such that it can record information only once.

With above-mentioned arrangement, when the voltage is applied to the first and second electrodes, if this voltage is higher than the insulating withstand voltage, then a breakdown occurs within the memory thin film to change the resistance state of the memory thin film, thereby making it possible to record information. In particular, since the memory thin film contains the rare earth element, the memory device is stable thermally and it is able to record information with a very small current, and the resistance state presented after recording can be stably maintained without generating a switch-off phenomenon. As a result, it becomes possible to record information sufficiently stably.

A storage apparatus according to the present invention comprises a memory device composed of a first electrode, a second electrode, a memory thin film sandwiched between the first and second electrodes, the memory thin film contains at least the rare earth element, the memory thin film or a layer in contact with the memory thin film contains any one of elements selected from Cu, Ag, Zn and the memory thin film or a layer in contact with the memory thin film contains any one of elements selected from Te, S, Se, an interconnection connected to the side of the first electrode and an interconnection connected to the side of the second electrode, wherein a large number of memory devices are located.

According to above-mentioned arrangement of the storage apparatus of the present invention, since the storage apparatus comprises the above-mentioned memory device of the present invention, the interconnection connected to the side of the first electrode and the interconnection connected to the side of the second electrode wherein a large number of memory devices are located, it is possible to record information or to erase information with application of a current from the interconnections to the memory device.

A memory device according to the present invention comprises a first electrode, a second electrode, a memory thin film sandwiched between the first and second electrodes and a conductive or semiconductive thin film containing any one of elements selected from Cu, Ag, Zn or any one of elements selected from Te, S, Se being formed between the memory thin film and the first electrode or the second electrode, wherein this conductive or semiconductive thin film contains a rare earth element.

According to the above-mentioned arrangement of the memory device of the present invention, since the memory thin film is sandwiched between the first and second electrodes, this memory thin film is made of the insulating material, the conductive or semiconductive thin film containing any one of elements selected from Cu, Ag, Zn or any one of elements selected from Te, S, Se being formed between the memory thin film and the first electrode or the second electrode and this conductive or semiconductive thin film contains the rare earth element, it becomes possible to record information by using a phenomenon in which the resistance state of the memory thin film is changed.

Also, since the memory thin film is made of the insulating material, it is possible to relatively increase the resistance value in the high resistance state.

Then, since the conductive or semiconductive thin film contains the rare earth element, the crystallization temperature of this conductive or semiconductive thin film rises and hence the crystallization under the high temperature circumstances can be suppressed. As a result, since the conductive or semiconductive thin film can be formed uniformly and the surface roughness of the conductive or semiconductive thin film can be suppressed, it becomes possible to form the memory thin film uniformly. Also, it is possible to suppress the characteristic of the memory device from being deteriorated due to a thermal hysteresis generated when the memory device is preserved or when the memory device is in use.

In the above-described memory device of the present invention, the conductive or semiconductive thin film can contain any one of elements selected from Cu, Ag, Zn and can also contain Te.

With the above-mentioned arrangement, since Te has a very higher conductivity than those of S and Se. it is possible to decrease the resistance value of the conductive or semiconductive thin film. As a result, the resistance change can mainly be generated in the memory thin film having the high resistance value by recording and erasing information. Thus, even if a part of the conductive or semiconductive thin film is crystallized so that the resistance value is changed, such change of the resistance value will not affect the memory operation considerably.

A storage apparatus according to the present invention comprises a memory device composed of a first electrode, a second electrode, a memory thin film sandwiched between the first and second electrodes, this memory thin film is made of an insulating material, a conductive or semiconductive thin film containing any one of elements selected from Cu, Ag, Zn and any one of elements selected from Te, S, Se being formed between the memory thin film and the first electrode or the second electrode, this conductive or semiconductive thin film contains a rare earth element, an interconnection connected to the side of the first electrode and an interconnection connected to the side of the second electrode, wherein a large number of memory devices are located.

According to the above-mentioned arrangement of the storage apparatus of the present invention, since this storage apparatus is composed of the above-mentioned memory device of the present invention, the interconnection connected to the side of the first electrode and the interconnection connected to the side of the second electrode wherein a large number of memory devices are located, it is possible to record or erase information with application of a current from the interconnection to the memory device.

In the memory device according to the present invention, the memory thin film is sandwiched between first and second electrodes, this memory thin film is made of an insulating material or a semiconductor material and a thin film containing CuTe is formed between the memory thin film and the first electrode or the second electrode.

According to the above-mentioned arrangement of the memory device of the present invention, since the memory thin film is sandwiched between the first and second electrodes, this memory thin film is made of the insulating material or the semiconductor material and the thin film containing CuTe is formed between the memory thin film and the first electrode or the second electrode, it becomes possible to record information by using a phenomenon in which the resistance state of the memory thin film is changed.

Also, since the memory thin film is made of the insulating material or the semiconductor material and the thin film containing CuTe is formed between the memory thin film and the first electrode or the second electrode, the resistance value of the thin film containing CuTe is decreased because Cu and Te are high in conductivity while the memory thin film is made of the insulating material or the semiconductor material so that the resistance value of the memory thin film is increased relatively. As a result, the resistance change can be generated mainly in the memory thin film with relatively high resistance value by recording and erasing information.

Even if a part of the thin film containing Cu and Te is crystallized by the rise of temperature so that the resistance value of the thin film is changed, this change of the resistance value does not affect the change of the resistance value of the memory device substantially and hence the memory operation is not affected considerably.

Accordingly, when the storage apparatus is manufactured, it is in use or when it is preserved under high temperature circumstance, it is possible to suppress the characteristic of the memory device from being deteriorated due to thermal hysteresis.

A storage apparatus according to the present invention comprises a memory device composed of a first electrode, a second electrode, a memory thin film sandwiched between the first and second electrodes, this memory thin film is made of an insulating material or a semiconductor material and a thin film containing CuTe being formed between the memory thin film and the first electrode or the second electrode, an interconnection connected to the side of the first electrode and an interconnection connected to the side of the second electrode, wherein a large number of memory devices are located.

According to the above-mentioned arrangement of the storage apparatus of the present invention, since the storage apparatus is composed of the above-mentioned memory device of the present invention, the interconnection connected to the side of the first electrode and the interconnection connected to the side of the second electrode wherein a large number of memory devices are located, it is possible to record or erase information with application of a current to the memory device from the interconnection.

A memory device according to the present invention comprises a first electrode, a second electrode, a memory thin film sandwiched between the first and second electrodes and in which this memory thin film or a layer in contact with the memory thin film contains any one of elements selected from Cu, Ag, Zn, the memory thin film or a layer in contact with the memory thin film contains any one of elements selected from Te, S, Se and an underlayer material of the memory thin film has an amorphous structure.

According to the above-mentioned memory device of the present invention, since the memory thin film is sandwiched between the first and second electrodes, the memory thin film or the layer in contact with the memory thin film contains any one of elements (metal elements) selected from Cu, Ag, Zn and the memory thin film or the layer in contact with the memory thin film contains any one of elements (chalcogenide elements) selected from Te, S, Se, it becomes possible to record information by changing the resistance state of the memory thin film.

Also, since the underlayer material of the memory thin film has the amorphous structure, the memory thin film formed on the underlayer material can be uniformly formed with the amorphous structure, whereby the interface between the memory thin film and the electrode on the memory thin film can be formed flat. In this manner, since the interface between the memory thin film and the electrode on the memory thin film is formed flat, an electric field distribution within the memory thin film becomes uniform and a switching voltage required when the memory device is changed from the high resistance state to the low resistance state can be prevented from being dispersed and can also be set to a uniform value relative to repetitive recording and erasing.

In the above-described memory device according to the present invention, the memory thin film can further contain more than one kind of rare earth elements selected from at least Y, La, Nd, Sm, Gd, Yb, Dy.

With the above-mentioned arrangement, since the rare earth element is stable thermally, it is possible to stably record information with a very small current.

A storage apparatus according to the present invention comprises a memory device composed of a first electrode, a second electrode and a memory thin film sandwiched between the first and second electrodes in which this memory thin film or a layer in contact with the memory thin film contains any one of elements selected from Cu, Ag, Zn, the memory thin film or a layer in contact with the memory thin film contains any one of elements selected from, Te, S, Se, an interconnection connected to the side of the first electrode and an interconnection connected to the side of the second electrode, wherein a large number of memory devices are located.

According to the above-mentioned arrangement of the storage apparatus of the present invention, since this storage apparatus is composed of the above-mentioned memory device according to the present invention, the interconnection connected to the side of the first electrode and the interconnection connected to the side of the second electrode wherein a large number of memory devices are located, it is possible to record information and to erase information with application of a current to the memory device from the interconnection.

Also, since the dispersions of the switching voltage of the memory device can be decreased, it becomes possible to operate the storage apparatus with stability.

According to the memory device of the present invention, a current required to record information on the memory device can be decreased and it becomes possible to maintain the sufficiently large resistance change of the memory device before and after information is recorded.

As a consequence, power consumed when information is recorded on the memory device can be decreased and it becomes possible to easily read information from the memory device.

Also, it is possible to reduce a time required to record information on the memory device.

Further, since information is recorded on the memory device by using the change of the resistance value of the memory device, in particular, the change of the resistance value of the memory thin film, even when the memory device is microminiaturized, there are then the advantages that information can be recorded with ease and that recorded information can be stored with ease.

Therefore, according to the present invention, information can be recorded on the storage apparatus with ease and recorded information can be read out from the storage apparatus with ease, the power consumption of the storage apparatus can be decreased, the storage apparatus can be operated at high speed and there can be constructed the highly-reliable storage apparatus.

Also, the storage apparatus can be integrated with a high integration degree (integrated with a high density) and can also be miniaturized.

Further, the memory device of the present invention can be manufactured by materials and the manufacturing method for use with the manufacturing process of an ordinary MOS (metal-oxide semiconductor) logic circuit.

Therefore, according to the present invention, the memory device and the storage apparatus which are stable thermally can be manufactured inexpensively and hence it becomes possible to provide an inexpensive storage apparatus. Also, it becomes possible to improve the yielding rate in manufacturing the storage apparatus.

In particular, if the memory thin film of the memory device has the arrangement such that the memory thin film contains at least the rare earth element, then when the memory device is used under high temperature circumstance or data is stored in the memory device for a long time of period, since the memory device can be maintained in the high resistance state stably, information recorded on the memory thin film can be stored stably and it becomes possible to make the memory device become higher in reliability.

Further, since information can be stably recorded on the memory device with the very small current, it is possible to decrease power consumed to record information on the memory device.

Also, in particular, even when the thin film whose resistance value is sufficiently lower than that of the memory thin film is sandwiched between the memory thin film of the memory device and the electrode, it is possible to suppress the influence exerted upon the change of the resistance value due to the rise of temperature. Thus, similarly as described above, even when the memory device is used under high temperature circumstance or even when data is stored in the memory device for a long period of time, the memory device can be maintained in the high resistance state stably. Therefore, since the information recorded on the memory thin film can be held stably, it becomes possible to make the memory device become highly-reliable.

Furthermore, in particular, when the underlayer material of the memory thin film of the memory device has the amorphous structure, since the switching voltage can be set to the uniform value relative to repetitive storage/erasure and dispersions of the switching voltage can be decreased, the stable memory operation can be carried out.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A memory device comprising:
   a first electrode;
   a second electrode;
   a memory thin film sandwiched between said first and second electrodes; and
   a layer in contact with said memory thin film, said layer being formed on the first electrode,
   wherein
   said memory thin film includes an oxide material including at least a rare earth element,
   said layer in contact with said memory thin film includes any one of the elements selected from Cu, Ag and Zn,
   said layer in contact with said memory thin film further includes any one of the elements selected from Te, S and Se,
   a first state is recordable in the memory device by applying a first voltage or a first current pulse between the first electrode and the second electrode to form a conduction path containing at least one of said elements selected from Cu, Ag and Zn in the memory thin film and changing an impedance of said memory thin film,
   a second state is recordable in the memory device by applying a second voltage or a second current pulse opposite in polarity to the first voltage or the first current pulse between the first electrode and the second electrode to eliminate the conduction path formed in the memory thin film and changing the impedance of said memory thin film, and
   said memory thin film has a composition gradient such that the concentration of the rare earth element decreases in a direction proceeding toward the first electrode.

2. A storage apparatus comprising:
   (i) a substrate;
   (ii) first and second electrodes carried on the substrate;
   (iii) an ion source layer between the first and second electrodes;
   (iv) a memory thin film between one of the first and second electrodes and the ion source layer;
   (v) an interconnection connected to a side of said first electrode; and
   (vi) an interconnection connected to a side of said second electrode, wherein,
said memory thin film includes an oxide material including at least a rare earth element,
said ion source layer is in contact with said memory thin film and includes a composition including any one of the elements selected from Cu, Ag and Zn and any one of the elements selected from Te, S and Se,
a first state is recordable in the memory device by applying a first voltage or a first current pulse between the first electrode and the second electrode to form a conduction path in said memory thin film, containing at least one of said elements selected from Cu, Ag and Zn and changing an impedance of said memory thin film,
a second state is recordable in the memory device by applying a second voltage or a second current pulse opposite in polarity to the first voltage or the first current pulse between the first electrode and the second electrode to eliminate the conduction path formed in the memory thin film and changing the impedance of said memory thin film, and
said memory thin film has a composition gradient such that the concentration of the rare earth element decreases in a direction proceeding toward the ion source layer.

3. A storage apparatus according to claim 2, wherein said storage apparatus has an arrangement in which it is able to record information only once.

4. The storage apparatus of claim 2, wherein said conduction path comprises a deposit extending from said second electrode into said memory thin film.

5. The storage apparatus of claim 2, wherein the first electrode is on the substrate and the memory thin film is between the ion source layer and the second electrode.

6. A memory device, comprising:
a substrate;
first and second electrodes carried on said substrate;
an ion source layer between said first and second electrodes;
a memory layer between said ion source layer and said second electrode,
wherein,
said memory layer is an insulating layer made with a rare earth oxide,
said ion source layer includes a composition including at least one of Cu, Ag and Zn and at least one of Te, S and Se,
when a first electric field of a first polarity is applied across said first and second electrodes, ions from said ion source layer migrate into said memory layer and a conduction path is formed in said memory layer, said conduction path being stable in the absence of the application of an electric across the first and second electrodes,
when a second electric field of a second polarity opposite the first polarity is applied across the first and second electrodes, the conductive path dissolves and no longer bridges said first and second electrodes,
said conduction path comprises a deposit extending from said second electrode into said memory layer,
said memory thin film has a composition gradient such that the concentration of the rare earth element decreases in a direction proceeding toward the ion source layer.

\* \* \* \* \*